United States Patent
Kremerman

(10) Patent No.: US 7,891,935 B2
(45) Date of Patent: Feb. 22, 2011

(54) DUAL ARM ROBOT

(75) Inventor: Izya Kremerman, Los Gatos, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

(21) Appl. No.: 10/434,582

(22) Filed: May 9, 2003

(65) Prior Publication Data

US 2004/0001750 A1  Jan. 1, 2004

Related U.S. Application Data

(60) Provisional application No. 60/378,983, filed on May 9, 2002, provisional application No. 60/379,095, filed on May 9, 2002, provisional application No. 60/379,063, filed on May 9, 2002.

(51) Int. Cl.
 *B25J 18/02* (2006.01)

(52) U.S. Cl. .................... 414/744.5; 74/490.03; 901/23

(58) Field of Classification Search ............. 414/744.5, 414/744.3, 744.1; 74/490.04, 490.09, 490.03; 901/23
See application file for complete search history.

(56) References Cited

U.S. PATENT DOCUMENTS

| | | | |
|---|---|---|---|
| 5,064,340 A | 11/1991 | Genov et al. ............. | 414/744.5 |
| 6,105,454 A | 8/2000 | Bacchi et al. .................. | 74/490 |
| 6,109,860 A * | 8/2000 | Ogawa et al. ............ | 414/744.5 |
| 6,155,768 A * | 12/2000 | Bacchi et al. .......... | 414/416.03 |
| 6,450,755 B1 | 9/2002 | Cameron et al. ........ | 414/416.08 |
| 6,485,250 B2 | 11/2002 | Hofmeister ............... | 414/744.1 |
| 6,547,510 B1 | 4/2003 | Beaulieu ................. | 414/744.5 |
| 2001/0033788 A1 | 10/2001 | Pietrantonio ............. | 414/744.5 |

* cited by examiner

*Primary Examiner*—Donald Underwood
(74) *Attorney, Agent, or Firm*—Perman & Green, LLP; Richard Pickreign

(57) ABSTRACT

A dual arm robot assembly has two arms each having a set of joint/link pairs that, in conjunction with an actuator assembly, define at least three degrees of freedom to provide independent horizontal translation and rotation of a distalmost link. A vertical motion mechanism is also provided.

23 Claims, 102 Drawing Sheets

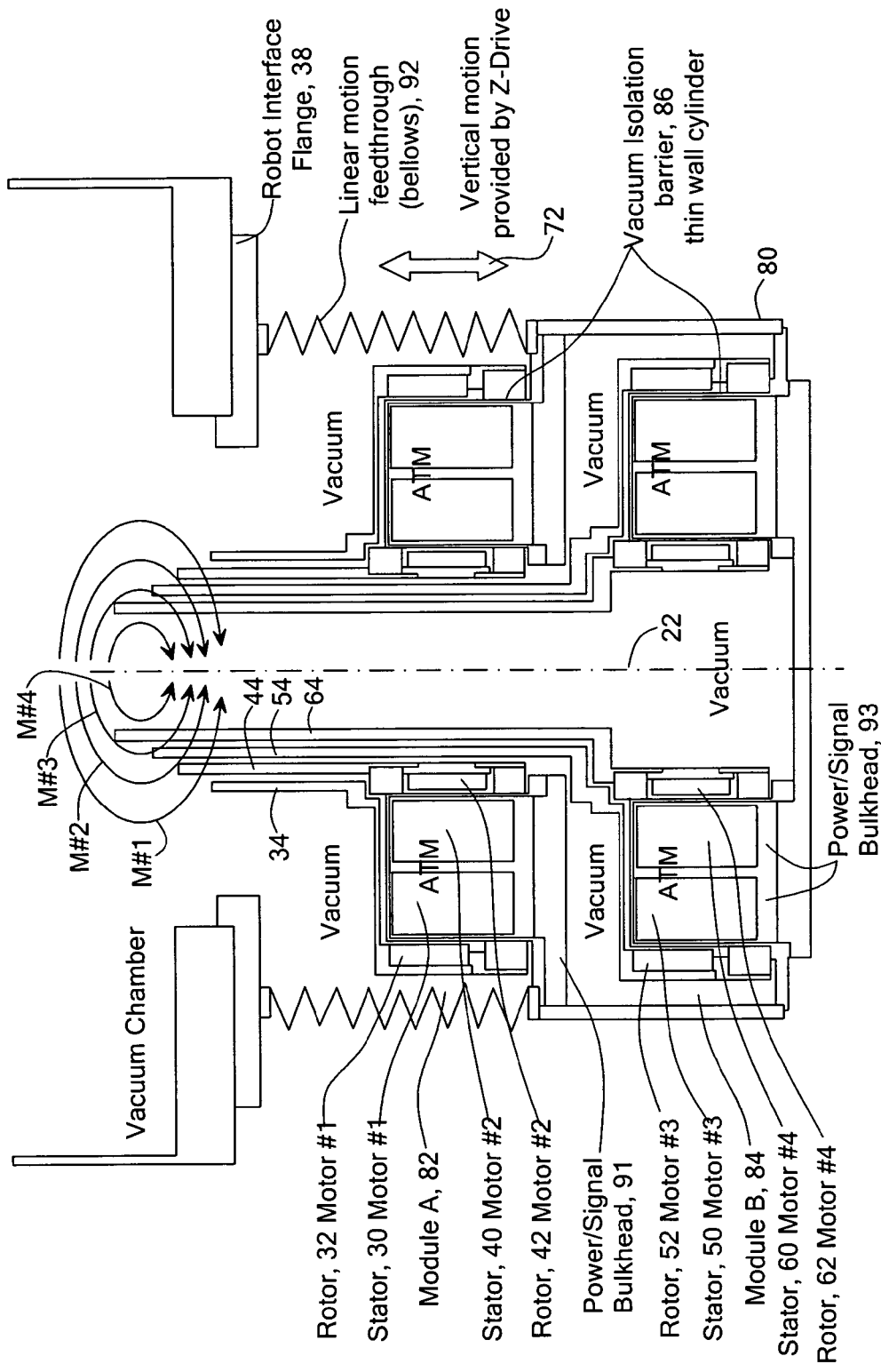
FIG 9 — DUAL 2-AXIS DRIVE MODULE. VACUUM COMPATIBLE. BACK TO FACE CONFIGURATION Dual Arm. 4-motors input used. 2:1 RATIO in the inner links.

| Angular Displacement of the Motors Relative to the Common Home Position | | | | End Effectors and the Functions Performed | | Comments |
|---|---|---|---|---|---|---|
| Motor M1 / Inner Link L1 | Motor M2 / Pulley d1 | Motor M3 / Inner Link L3 | Motor M4 / Pulley d5 | E1 | E2 | Sequential or Simultaneous Extension of Individual End Effectors E1 and E2 |
| ↷ | Standfast | Standfast | Standfast | Extend ↑ | Standfast | |
| Standfast | Standfast | ↷ | Standfast | Standfast | Extend ↑ | |
| Standfast | Standfast | ↷ | Standfast | Extend ↑ | Extend ↑ | |
| ↷ | Standfast | ↷ | Standfast | Extend ↑ | Rotate ↻ | |
| ↷ | ↷ | ↷ | Standfast | Rotate ↻ | Extend ↑ | |
| ↷ | ↷ | ↷ | ↷ | Rotate ↻ | Rotate ↻ | |
| ↷ | ↷ | ↷ | ↷ | Rotate ↻ | Rotate ↻ | |

Dual Arm. 4-motors input used. 1:1 RATIO in the inner links.

| Angular Displacement of the Motors Relative to the Common Home Position | | | | End Effectors and the Functions Performed | | Comments |
|---|---|---|---|---|---|---|
| Motor M1 / Inner Link L1 | Motor M2 / Pulley d1 | Motor M3 / Inner Link L3 | Motor M4 / Pulley d5 | E1 | E2 | Sequential or Simultaneous Extension of Individual End Effectors E1 and E2 |
| ↷ | Standfast | Standfast | Standfast | Extend ↑ | Standfast | |
| Standfast | ↶ | Standfast | Standfast | Standfast | Extend ↑ | |
| ↷ | Standfast | ↶ | Standfast | Extend ↑ | Extend ↑ | |
| ↷ | ↶ | ↶ | ↶ | Extend ↑ | Rotate ↶ | |
| ↷ | ↶ | ↶ | ↶ | Rotate ↷ | Extend ↑ | |
| ↷ | ↶ | ↶ | ↶ | Rotate ↷ | Rotate ↶ | |
| ↷ | ↶ | ↶ | ↶ | Rotate ↷ | Rotate ↷ | |

| Dual arm. Co-directional Configuration of End Effectors. 3-Motors input used. 2:1 RATIO in the Inner Links | | | | | |
|---|---|---|---|---|---|
| Angular Displacement of the Motors Relative to the Common Home Position | | | End Effectors and the Functions Performed | | Comments |
| Motor M1' Pulleys d1 and d5 | Motor M2' Inner Link L1 | Motor M3' Inner Link L3 | E1 | E2 | Sequential or Simultaneous Extension of Individual End Effectors E1 and E2 |
| Standfast | ↷ | Standfast | Extend ↑ | Standfast | |
| Standfast | Standfast | ↷ | Standfast | Extend ↑ | |
| Standfast | ↷ | ↷ | Extend ↑ | Extend ↑ | |
| ↷ | ↷ | ↷ | Rotate ↷ | Rotate ↷ | |
| ↷ | ↷ | ↷ | Rotate ↷ | Rotate ↷ | |

FIG. 23

3-axis, dual end effector Co-directional configuration robot. Independant extension of end effectors. Common Theta-axis.

FIG. 27

Dual arm. Opposite Configuration of End Effectors. 3-Motors input used. 2:1 RATIO in the Inner Links

| Angular Displacement of the Motors Relative to the Common Home Position | | | End Effectors and the Functions Performed | | Comments |
|---|---|---|---|---|---|
| Motor M1 / Pulleys d1 and d5 | Motor M2 / Inner Link L1 | Motor M3 / Inner Link L3 | E1 | E2 | Sequential or Simultaneous Extension of Individual End Effectors E1 and E2 |
| Standfast | ↶ | Standfast | Extend ↑ | Standfast | |
| Standfast | Standfast | ↷ | Standfast | Extend ↑ | |
| Standfast | ↶ | ↷ | Extend ↑ | Extend ↑ | |
| ↶ | ↷ | ↷ | Rotate ↶ | Rotate ↶ | |
| ↷ | ↷ | ↷ | Rotate ↷ | Rotate ↷ | |

Dual Arm.
Co-directional Configuration of End Effectors.
Independant outer links (R-axis). Common Theta

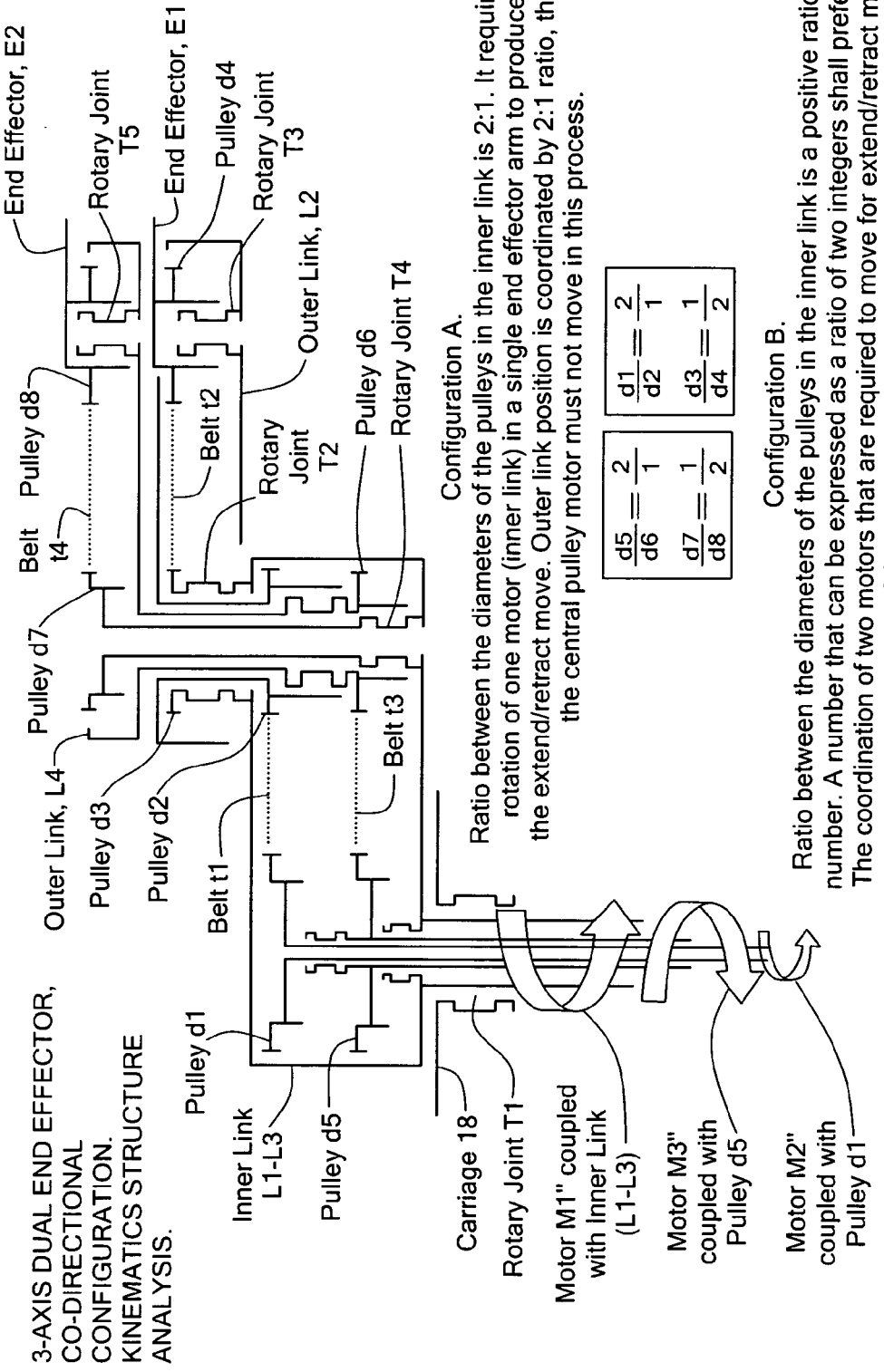

Dual arm. Co-directional Configuration of End Effectors. 3-Motors input used. 2:1 RATIO in the Inner Links. All Motors Are Independent

| Angular Displacement of the Motors Relative to the Common Home Position | | | End Effectors and the Functions Performed | | Comments |
|---|---|---|---|---|---|
| Motor M1 / Inner Link L1-L3 | Motor M2 / Pulley d1 | Motor M3 / Pulley d5 | E1 | E2 | |
| ↷ | Standfast | ↷ | Extend ↑ | Rotate ↷ | Sequential or Simultaneous Extension of Individual End Effectors E1 and E2 |
| ↷ | ↷ | Standfast | Rotate ↷ | Extend ↑ | |
| ↷ | Standfast | Standfast | Extend ↑ | Extend ↑ | |
| ↷ | ↷ | ↷ | Rotate ↷ | Rotate ↷ | |
| ↶ | ↶ | ↶ | Rotate ↶ | Rotate ↶ | |

3-motor configuration allows for:
Extension of an individual End Effector,
Simultaneous extension of two End Effectors,
Simultaneous rotation of two End Effectors (theta)

3-motor configuration allows for:
Extension of an individual End Effector,
Simultaneous extension of two End Effectors,
Simultaneous rotation of two End Effectors (theta)

3-motor configuration allows for:
Extension of an individual End Effector,
Simultaneous extension of two End Effectors,
Simultaneous rotation of two End Effectors (theta)

Linear motion system. Integration of the column and te prismatic joint linkage into the "body" of the robot.

Linear motion system. Integration of the arms onto the "body" of the robot.

Z-axis motor and optical encoder. Installation structure.

- Accurate gap adjustment with rotation of the screw, transmitted into linear motion by two keys installed in the lead screw end shaft.
- Keys also function as torque transmitting features.
- Power loss results in the brake pads being attracted to the coil by magnetic field forces.

Dual end effector configuration. Opposite orientation.

Dual end effector configuration. Opposite orientation.

Dual end effector configuration. Opposite orientation. Extension of end effector #1 (with Rotation of end effector #2)

Dual End Effector Configuration. Co-directional Orientation.

Dual End Effector Configuration. Co-directional Orientation.

Dual end effector configuration. Co-linear orientation.
Kinematic structure.

Dual end effector configuration.
Acute angle orientation.

Dual end effector configuration.
Acute angle orientation.

Dual End Effector Arm. Co-directional Configuration of End Effectors.

Dual End Effector Arm. Co-directional Configuration of End Effectors.

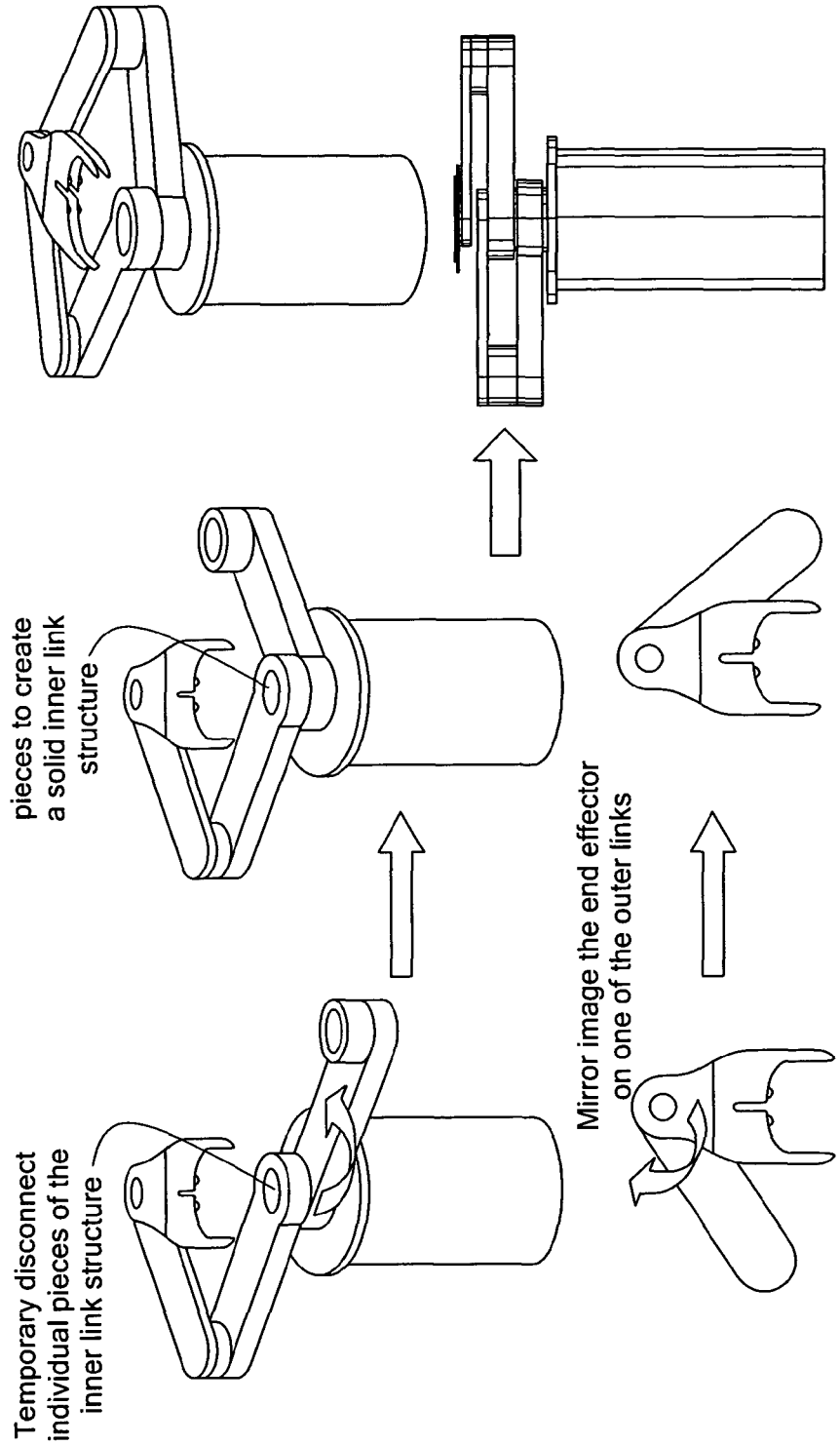

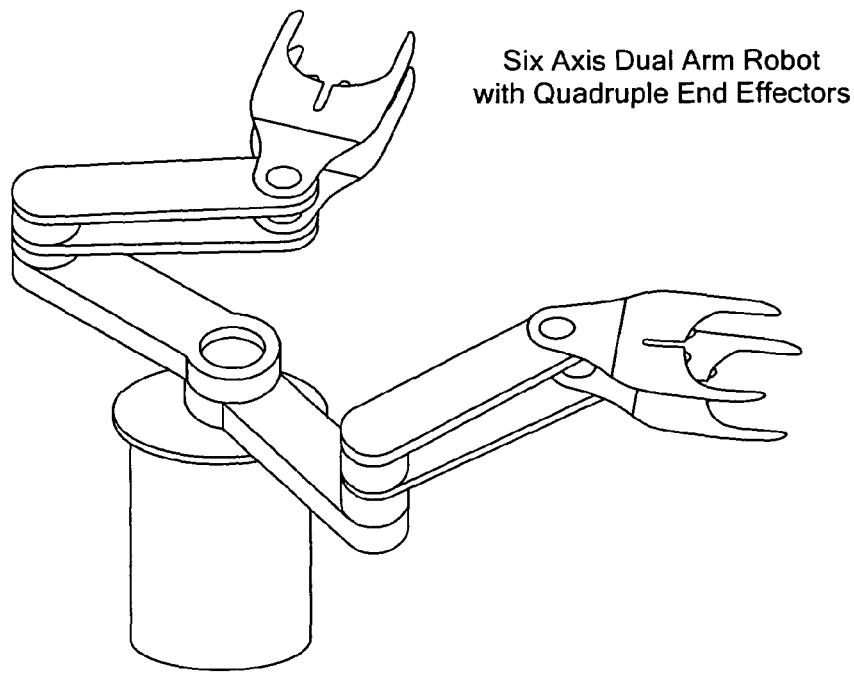
FIG. 63A
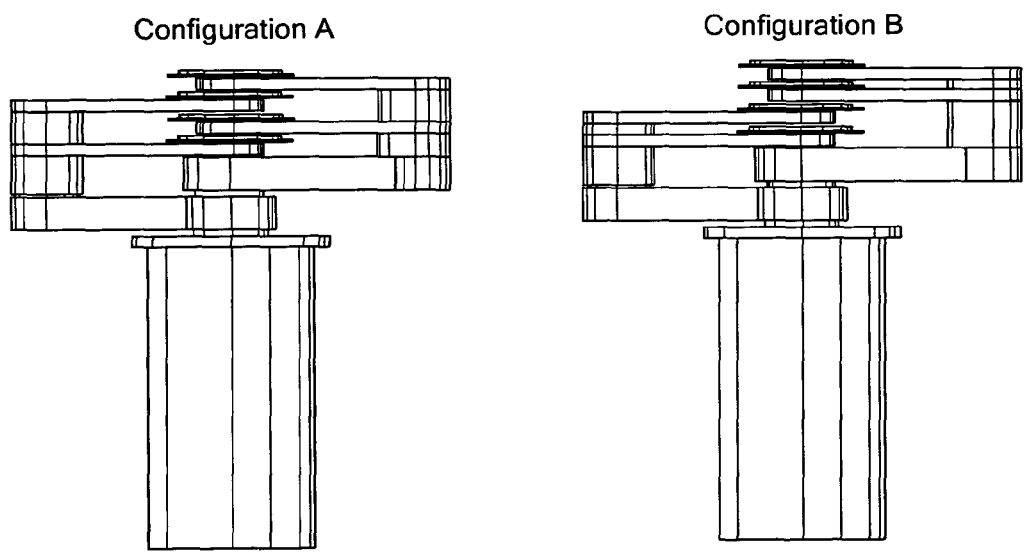
FIG 63B  FIG. 63C

Three axis single arm robot with quadruple end effectors

Configuration A

Configuration B

Sequential extension of individual end effectors

Simultaneous extension of two end effectors of each individual dual outer link modules Based upon two co-directional dual end effector arms.
Quadruple end effector single arm. Kinematic structure. Co-directional end effectors. Version 1
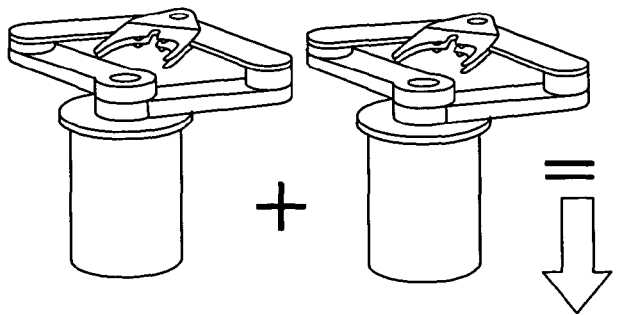
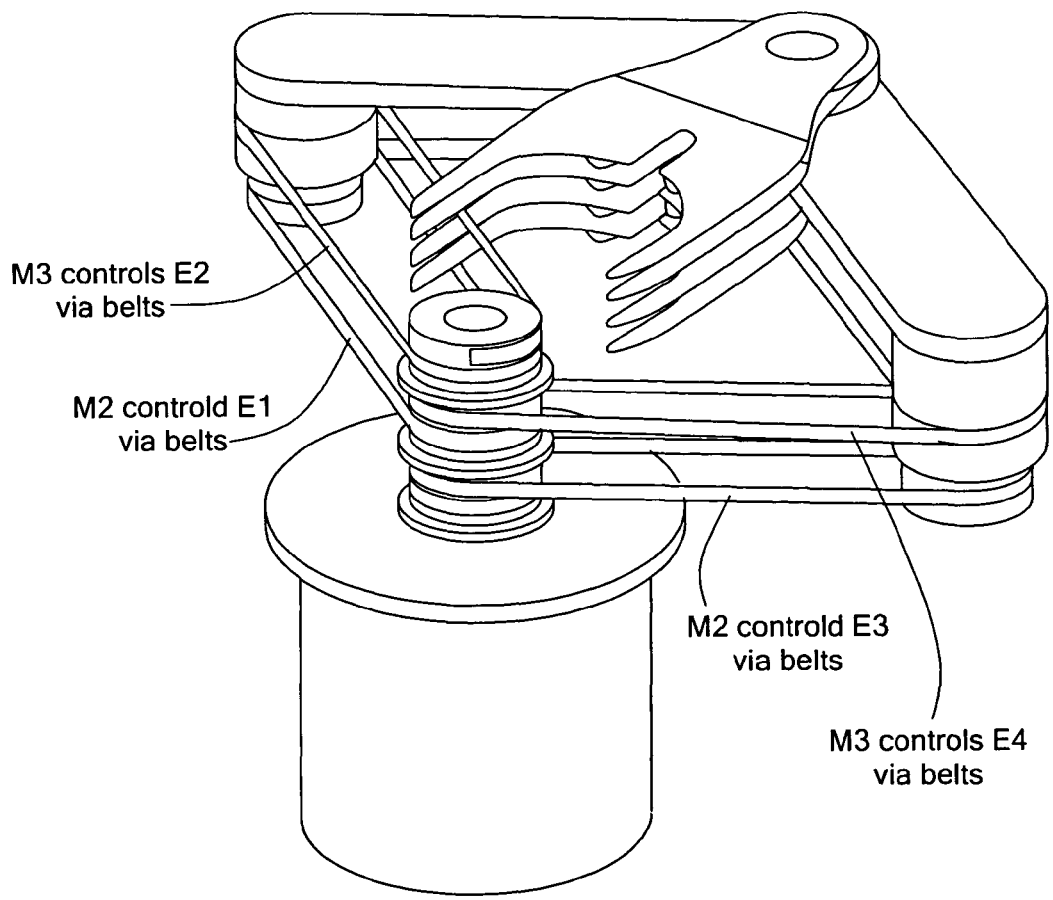
M3 controls E2 via belts
M2 controld E1 via belts
M2 controld E3 via belts
M3 controls E4 via belts
*FIG. 66A*

Quad End Effector Single Arm. Co-Directional Configuration of the End Effector

| Motor M1 | Motor M2 | | Motor M3 | | End Effectors and the Functions Performed | | | | Sequential or Simultaneous Extension of Individual End Effectors E1 and E2 | Sequential or Simultaneous Extension of Individual End Effectors E3 and E4 |
|---|---|---|---|---|---|---|---|---|---|---|
| | State of the Coupling Dependent on the Motors' Relative to the Motor M1 Angular Displacement from the Home Position | | | | E1 | E2 | E3 | E4 | | |
| | CP1-ON@CW | CP3-ON@CCW | CP2-ON@CW | CP4-ON@CCW | | | | | | |
| ↻ | On | Off | Off | Off | Extend | Rotate | Rotate | Rotate | ✓ | |
| ↻ | Off | Off | On | Off | Rotate | Extend | Rotate | Rotate | ✓ | |
| ↻ | On | Off | On | Off | Extend | Extend | Rotate | Rotate | ✓ | |
| ↻ | Off | Off | Off | Off | Rotate | Rotate | Rotate | Rotate | | |
| ↻ | Off | On | Off | Off | Rotate | Rotate | Extend | Rotate | | ✓ |
| ↻ | Off | On | Off | On | Rotate | Rotate | Extend | Extend | | ✓ |
| ↻ | Off | Off | Off | On | Rotate | Rotate | Rotate | Extend | | ✓ |
| ↻ | Off | Off | Off | Off | Rotate | Rotate | Rotate | Rotate | | |

*FIG. 67*

Based upon two co-directional dual end effector arms.
Quadruple end effector single arm. Kinematic structure. Co-directional end effectors. Version 2
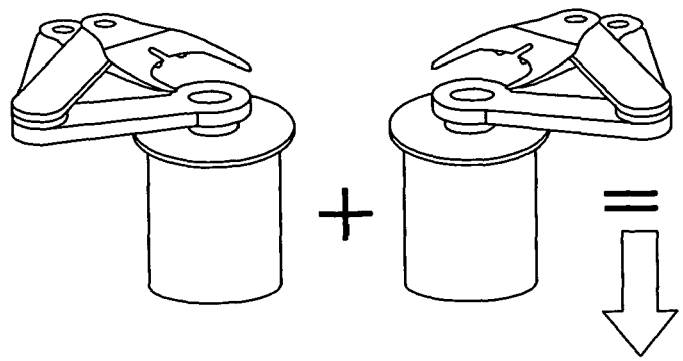
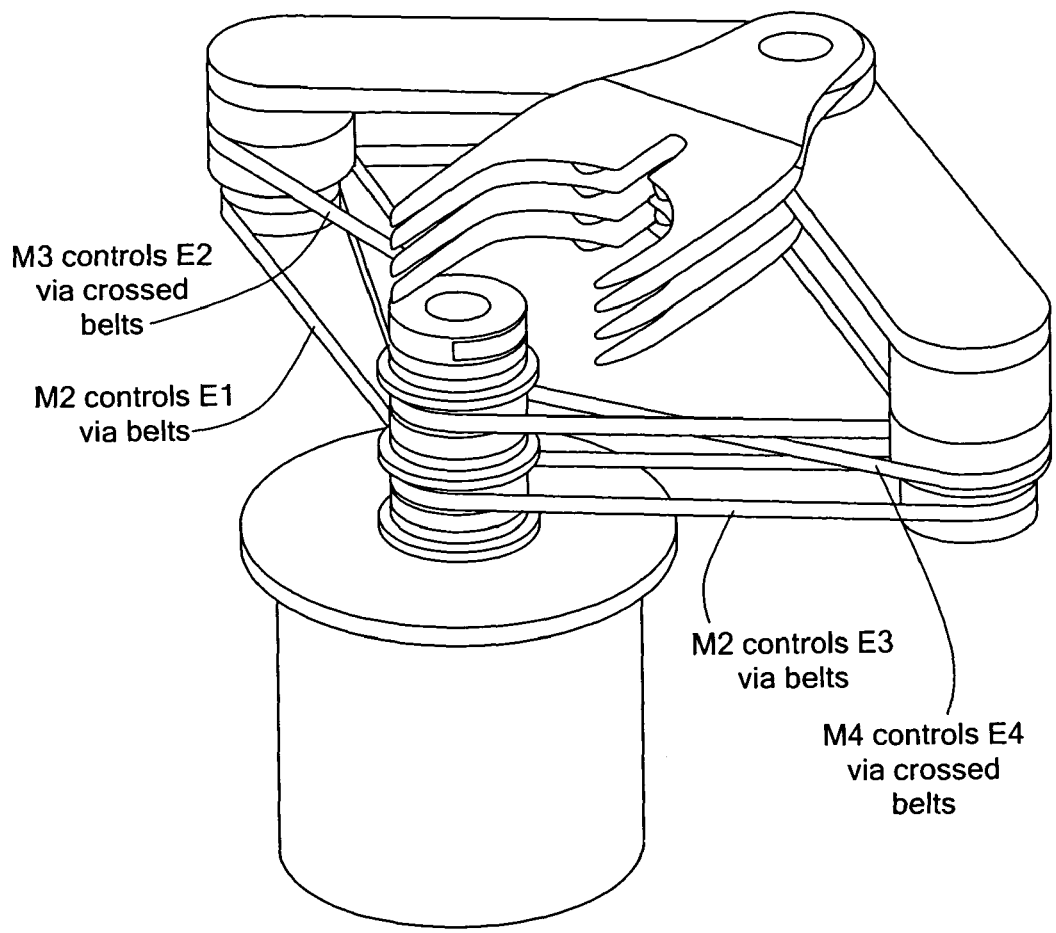
M3 controls E2 via crossed belts
M2 controls E1 via belts
M2 controls E3 via belts
M4 controls E4 via crossed belts
*FIG. 68A*

FIG. 69

Quad End Effector Single Arm. Co-Directional Configuration of the End Effector

| Motor M1 | Motor M2 | Motor M3 | | | End Effectors and the Functions Performed | | | |
|---|---|---|---|---|---|---|---|---|
| | | State of the Coupling Dependent on the Motors' Relative to the Motor M1 Angular Displacement from the Home Position | | | | | | |
| | CP1-ON@CW | CP3-ON@CCW / CP2-ON@CCW | CP4-ON@CW | | E1 | E2 | E3 | E4 |
| ↻ | On | Off | Off | | Extend ↑ | Rotate ↻ | Rotate ↻ | Rotate ↻ |
| ↻ | Off | Off | On / 3×M1 Off | | Rotate ↻ | Extend ↑ | Rotate ↻ | Rotate ↻ |
| ↻ | On | Off | On / 3×M1 Off | | Extend ↑ | Extend ↑ | Rotate ↻ | Rotate ↻ |
| ↻ | Off | Off | Off | | Rotate ↻ | Rotate ↻ | Rotate ↻ | Rotate ↻ |
| ↻ | Off | On | Off | | Rotate ↻ | Rotate ↻ | Extend ↑ | Rotate ↻ |
| ↻ | Off | Off / 8×M1 | On | | Rotate ↻ | Rotate ↻ | Rotate ↻ | Extend ↑ |
| ↻ | Off | On / 8×M1 | On | | Rotate ↻ | Rotate ↻ | Extend ↑ | Extend ↑ |
| ↻ | Off | Off | Off | | Rotate ↻ | Rotate ↻ | Rotate ↻ | Rotate ↻ |

Sequential or Simultaneous Extension of Individual End Effectors E1 and E2

Sequential or Simultaneous Extension of Individual End Effectors E3 and E4

Three axis single arm robot with quadruple end effectors

Configuration A

Configuration B

Configuration C

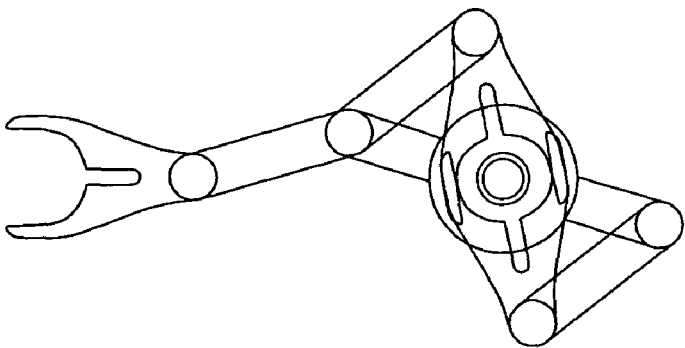
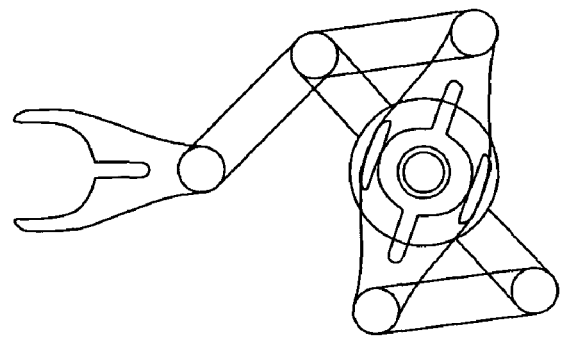
Sequential extension of individual end effectors
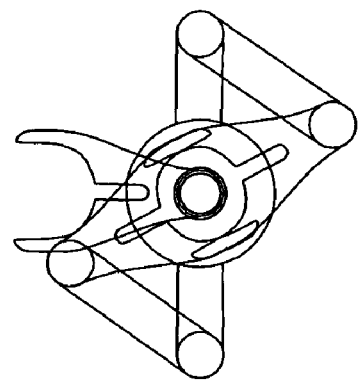
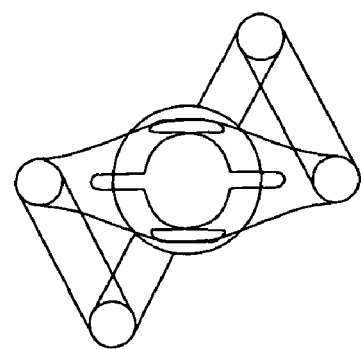
FIG. 72E

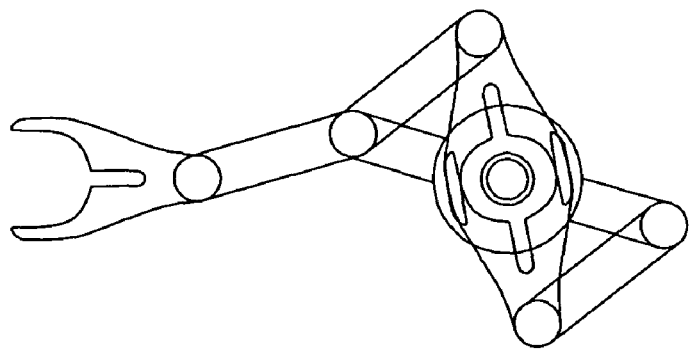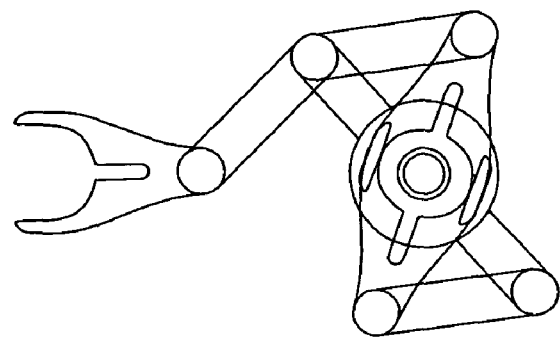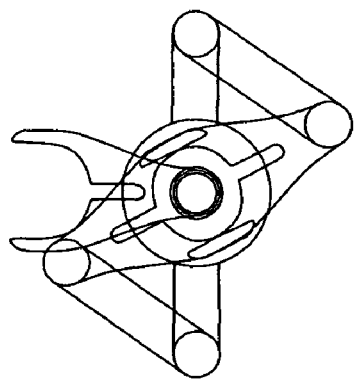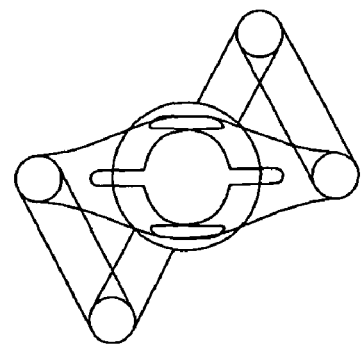
Simultaneous extension of two end effectors of each individual dual outer link modules
*FIG. 72F*

FIG. 74

Quad End Effector Single Arm. Opposite Configuration of the End Effector

| Motor M1 | Motor M2 | | Motor M3 | | End Effectors and the Functions Performed | | | |
|---|---|---|---|---|---|---|---|---|
| | State of the Coupling Dependent on the Motors' Relative to the Motor M1 Angular Displacement from the Home Position | | | | | | | |
| | CP1-ON@CW | CP3-ON@CCW | CP2-ON@CCW | CP4-ON@CW | E1 | E2 | E3 | E4 |
| ↻ | On | Off | Off | Off | Extend | Rotate | Rotate | Rotate |
| ↻ | Off | Off | Off | Off | Rotate | Extend | Rotate | Rotate |
| ↻ | On | Off | On | Off | Extend | Extend | Rotate | Rotate |
| ↻ | Off | Off | On | Off | Rotate | Rotate | Rotate | Rotate |
| ↻ | Off | 3M1 On | Off | Off | Rotate | Rotate | Extend | Rotate |
| ↻ | Off | 3M1 On | Off | 3M1 On | Rotate | Rotate | Extend | Extend |
| ↻ | Off | Off | Off | 3M1 On | Rotate | Rotate | Extend | Extend |
| ↻ | Off | Off | Off | Off | Rotate | Rotate | Rotate | Rotate |

Sequential or Simultaneous Extension of Individual End Effectors E1 and E2

Sequential or Simultaneous Extension of Individual End Effectors E3 and E4

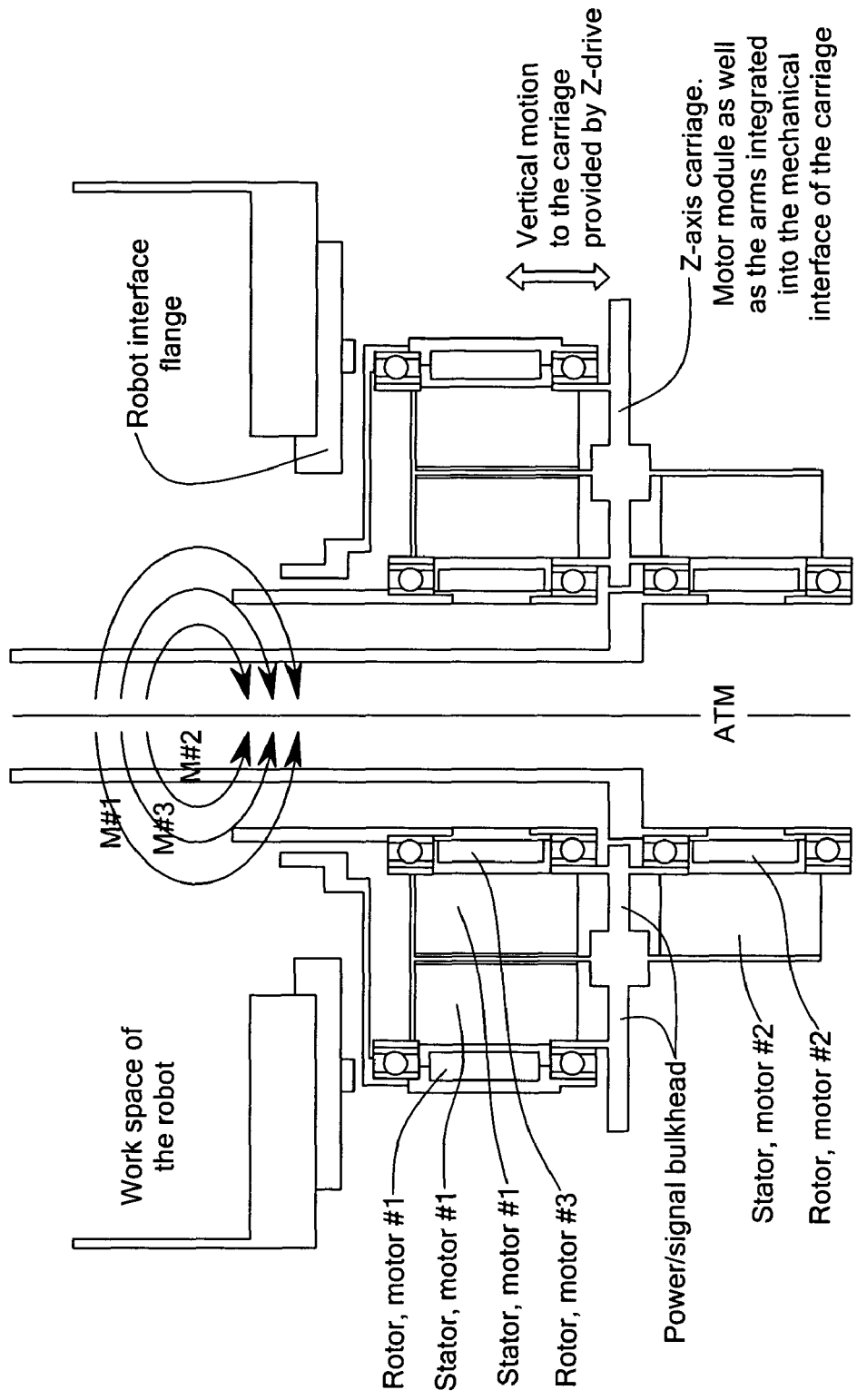
FIG. 75  3-Axis drive module. Application: used in a dual arm dual end effector robot. Single inner link, dual outer link configuration.

DUAL ARM ROBOT

CROSS REFERENCE TO RELATED APPLICATIONS

Applicant claims priority under 35 U.S.C. §119(e) to prior U.S. provisional applications Ser. Nos. 60/378,983, 60/379,095 and 60/379,063; all filed May 9, 2002, the disclosures of which are incorporated herein by reference.

STATEMENT REGARDING FEDERALLY SPONSORED RESEARCH OR DEVELOPMENT

N/A

BACKGROUND OF THE INVENTION

Robots are used to perform many tasks in the semiconductor industry, such as the automated handling of substrate media or other objects. In the semiconductor industry, typical media and other objects include individual silicon wafers or wafer carriers, flat panel displays, and hard disk media. Robots may be used for handling media in, for example, wafer processing cluster tools, wafer inspection equipment, metrology equipment, and equipment for hard disk thin film deposition, and in transferring media between production equipment and automated material handling systems in semiconductor factories. Robots may be used in both atmospheric and vacuum environments.

One class of robots is known as jointed arm robots or more specifically, jointed cylindrical coordinate robots. Cylindrical coordinate robots include a configuration consisting of an arm having a limb that is movable in a horizontal plane and attached to a revolute joint. The revolute joint is mounted on a carriage to which a reciprocating vertical movement is supplied along an axis of a vertical column. The limb can move in and out in a radial or R-direction. Also, the arm can rotate as one unit on the carriage in the θ-direction. The arm design is based upon a multiple-linked open kinematic chain.

In general, the basic components of a robot system are a manipulator, a power conversion module, sensory devices, and a controller. The manipulator consists of links and joints (with included gears, couplings, pulleys, belts, and so on). The manipulator can be described as a system of solid links connected by joints. Together, the links and joints form a kinematic chain. A kinematic pair comprising a joint and an adjacent link may also be called a linkage.

Two types of joints are used in manipulator mechanisms, revolute and prismatic. A revolute, or rotary, joint allows rotation of one link about the joint axis of the preceding link. A prismatic joint allows a translation between the links.

The motion of a joint is accomplished by an actuator mechanism. Motion of a particular joint causes subsequent links attached to it to move with respect to the link containing the joint's actuator. The actuator can be connected to the link directly or through a mechanical transmission when some output characteristics (force, torque, speed, resolution, etc.) of the actuator need to be changed, depending upon the performance required.

The manipulator usually ends with a link that can support a tool. In semiconductor wafer processing equipment, this tool is usually called an end effector. The interface between the last link and the end effector may be called an end effector mounting flange. The links, which are connected through the joints to the actuators, move relative to one another in order to position the end effector in an X-Y-Z coordinate system.

A configuration of a single arm robot that is commercially available has three parallel revolute joints, which allow for the arm's movement and orientation in a plane. Often, the first revolute joint is called the shoulder, the second revolute joint is called the elbow, and the third revolute joint is called the wrist. The fourth, prismatic, joint is used for moving the end effector normal to the plane, in the vertical or Z-direction. Actuators (for example, closed-loop control servomotors) and motion conversion mechanisms are included in the mechanism to enable the motion of the joints. A controlled movement of each link, i.e., the positioning and the orientation of the end effector in the X-Y-θ-Z coordinate system, can be achieved only when an actuator controls each joint of a manipulator. Actuators can control joints directly, or when the reduction in force and torque is required, via a motion conversion mechanism.

For serial kinematic linkages, the number of joints equals the required number of degrees of freedom. Thus, to move and orient the end effector of the single arm per a required set of X-Y-θ-Z coordinates, four joints (three revolute and one prismatic in the vertical direction) are required. In some multiple-linked jointed cylindrical coordinate type robots, end effectors often are required to be oriented such that a center line drawn along the end effector and projected towards the column of the robot always intersects with the axis of revolution of the first rotary joint (the shoulder joint). In this case, the manipulator requires just three degrees of freedom (R-θ-Z). An individual actuator does not control the joint of the end effector, and only three actuators are required.

A known dual arm robot of this type for handling substrate media is illustrated in FIG. 1. This robot has two shoulder joints, two elbow joints, and two wrist joints. The arms can also move vertically a predetermined distance along the translational axis of the prismatic joint of the carriage, which supports the first rotary joint (the shoulder joint of the arm). The individual links of both arms are at the same level and the shoulder joints are next to each other, requiring use of a C-type bracket between one of the arms and its end effector, so that both end effectors can pass each other. This robot, however, cannot be used in a vacuum transport module built per SEMI MESC standards, because the isolation valves of such a vacuum transport module are too narrow to allow passage of the arm that includes the C-type bracket per the SEMI specification that defines wafer transport planes within cassette and process modules. Also, the arms cannot rotate independently in cylindrical coordinates. The angular relationship between the vector of the straight-line radial translation of the individual end effectors of each arm (in robots that are presently available commercially) is permanent and established during the assembly of the robot. Often, the individual arms of the dual arm robot are directed along the same vector.

SUMMARY OF THE INVENTION

The present invention provides a dual arm robot in which two arms each have a set of joint/link pairs that, in conjunction with an actuator assembly, define at least three degrees of freedom to provide independent horizontal translation (extension and retraction) and rotation of a distalmost link. The innermost or proximal joints of the inner links are aligned on a common vertical axis for rotation. The outermost links of each arm are horizontally offset from each other by spacers provided at joints within the joint/link pair to prevent collisions between the outermost links.

In the semiconductor field, the outermost links comprise end effector mounting flanges that are able to interface with various types of end effectors to manipulate substrate media, such as a semiconductor wafer. If dual paddle end effectors are used on each arm, up to four substrates may be positioned simultaneously in a transfer chamber. System throughput is accordingly increased. Also, because the two arms have the ability to extend, retract, and rotate independently, the robot assembly allows for a wafer swap when a wafer is moved in and out of a load lock or process module attached to a transport chamber. Depending upon the choice of materials and components designed into the robot configurations, the robot can be used in atmospheric as well as vacuum environments.

DESCRIPTION OF THE DRAWINGS

The invention will be more fully understood from the following detailed description taken in conjunction with the accompanying drawings in which:

FIG. 9 is a schematic diagram of a still further embodiment of a vacuum compatible actuator assembly of the robot of FIG. 2;

FIG. 10 is a table that describes functions performed by individual end effector mounting flanges, as a result of the angular displacement of one motor or simultaneous displacement of multiple motors, of arms having an inner link pulley diameter ratio of 2:1, for the robot of FIG. 2;

FIG. 11 is a table that describes functions performed by individual end effector mounting flanges, as a result of simultaneous angular displacement of multiple motors, of arms having an inner link pulley diameter ratio of 1:1, for the robot of FIG. 2;

FIG. 23 is a table that describes functions performed by individual end effector mounting flanges, as a result of angular displacement of one motor or simultaneous displacement of multiple motors, of arms having an inner link pulley diameter ratio of 2:1, for the robot of FIG. 21;

FIG. 27 is a table that describes functions performed by individual end effector mounting flanges, as a result of angular displacement of one motor or simultaneous displacement of multiple motors, of arms having an inner link pulley diameter ratio of 2:1, for the robot of FIG. 26;

FIG. 31 is a kinematic diagram of the robot of FIG. 29;

FIG. 32 is a table that describes functions performed by individual end effector mounting flanges, as a result of angular displacement of one motor or simultaneous displacement of multiple motors, of arms having an inner link pulley diameter ratio of 2:1, for the robot of FIG. 29;

FIG. 33 is a table that describes functions performed by individual end effector mounting flanges, as a result of angular displacement of one motor or simultaneous displacement of multiple motors, or arms having inner link pulley diameter ratio of 1:1, for the robot of FIG. 29;

FIG. 62 illustrates a transformation process from a robot having end effectors in an opposite orientation into a robot having end effectors in a co-directional orientation;

FIG. 63A illustrates a still further embodiment of a six-axis robot assembly of the present invention incorporating quadruple end effectors;

FIG. 63B is a first configuration of the six-axis robot of FIG. 63A;

FIG. 63C is a further configuration of the six-axis robot of FIG. 63A;

FIG. 66A is a partial view of the three-axis robot of FIG. 65B;

FIG. 67 is a table that describes functions performed by individual end effector mounting flanges of the robot of FIG. 65B as a result of the various angular displacements of three motors and states of the coupling mechanism;

FIG. 68A is a partial view of a three-axis robot of FIG. 65C;

FIG. 69 is a table that describes functions performed by individual end effector mounting flanges of the robot of FIG. 65C as a result of the various angular displacements of three motors and states of the coupling mechanism;

FIG. 72E illustrates an extension sequence of an individual end effector of the three-axis robot of FIG. 72A;

FIG. 72F illustrates a simultaneous extension sequence of two end effectors of each individual dual outer link module;

FIG. 74 is a table that describes functions performed by individual end effector mounting flanges of the robot of FIG. 72A as a result of the various angular displacements of three motors and states of the coupling mechanism; and FIG. 75 is a diagram illustrating a three motor drive module for use with the three-axis robot.

DETAILED DESCRIPTION OF THE INVENTION

The present invention relates to a dual arm, cylindrical coordinate robot assembly, and more particularly to the manipulator, the system of links and joints that cooperate to position a pair of end effectors, for such a robot assembly.

For purposes of describing the present invention, the manipulator can be described as a mechanical assembly and broken down into major linkages, minor linkages (wrist components), and the end effector. The major linkages are the set of joint-link pairs that position the manipulator in space. Usually, the major linkages are the first three sets of joint-link pairs. The first joint-link pair includes a prismatic joint (e.g., a linear bearing) and a link (e.g., a carriage) that allows for vertical displacement of the tool. The second joint-link pair includes a revolute joint (e.g., a radial ball bearing) and a link (e.g., an inner link). The third joint-link pair includes a revolute joint (e.g., a radial ball bearing) and a link (e.g., an outer link). The minor linkages are a fourth joint-link pair and include a revolute joint (e.g., a radial ball bearing) and a link $E_n$, which is the end effector mounting flange. The actual end effector is an attachment that can have various configurations and is mounted onto the mounting flange $E_n$.

Each of the joints of a robot assembly defines a joint axis about or along which the particular link either rotates or slides. In a pure open-loop jointed multiple-linked kinematic chain, every joint defines a degree of freedom (DOF), so that the total number of DOFs is equal to the number of joints. Also, the number of degrees of freedom of an arm can be calculated as based upon the number of variables or coordinates that are needed to describe its position, or the position of the end effector(s). Hence, sometimes the number of degrees of freedom may be less than the total number of joints. This happens when the state of one actuator determines the state of more than one joint.

Figure 1:
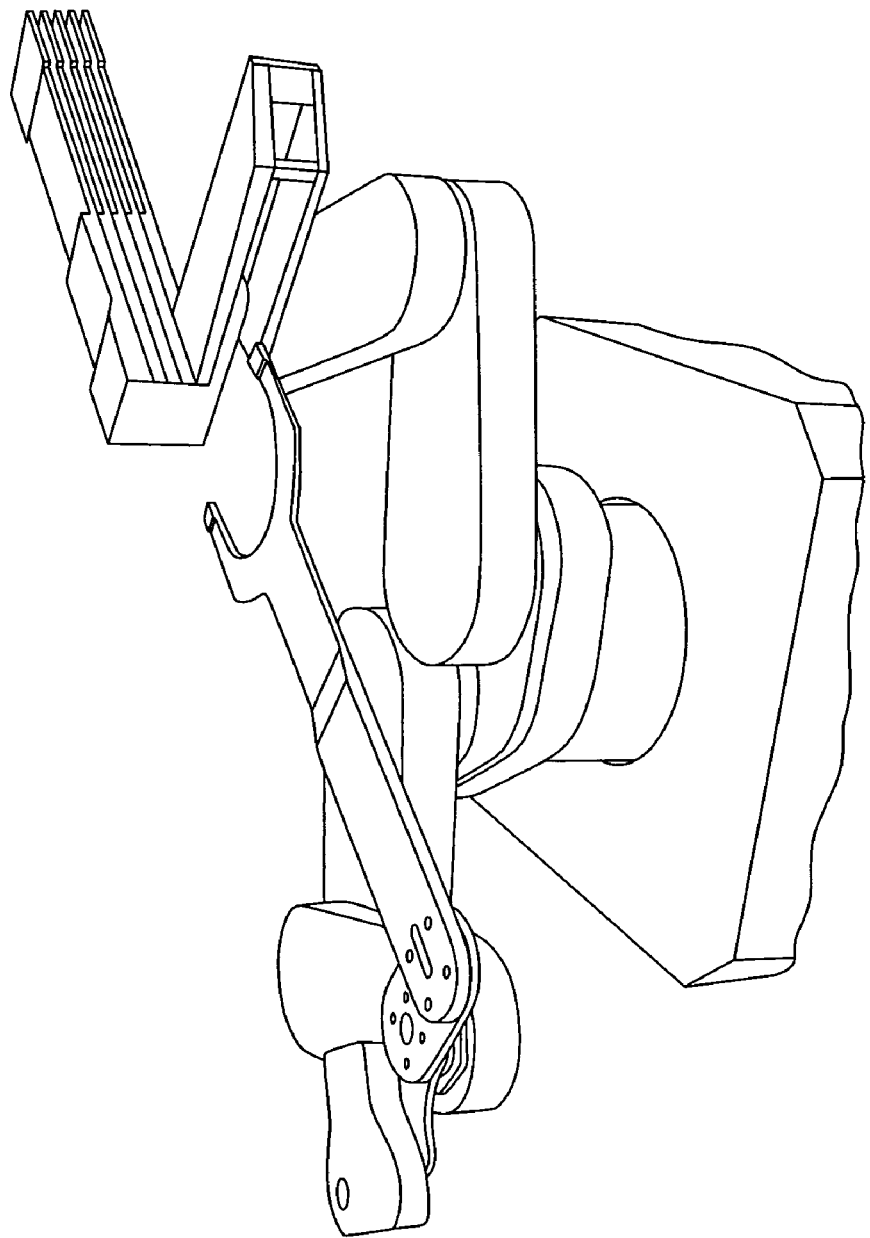
FIG. 1 is a prior art dual arm atmospheric robot.
Figure 2:
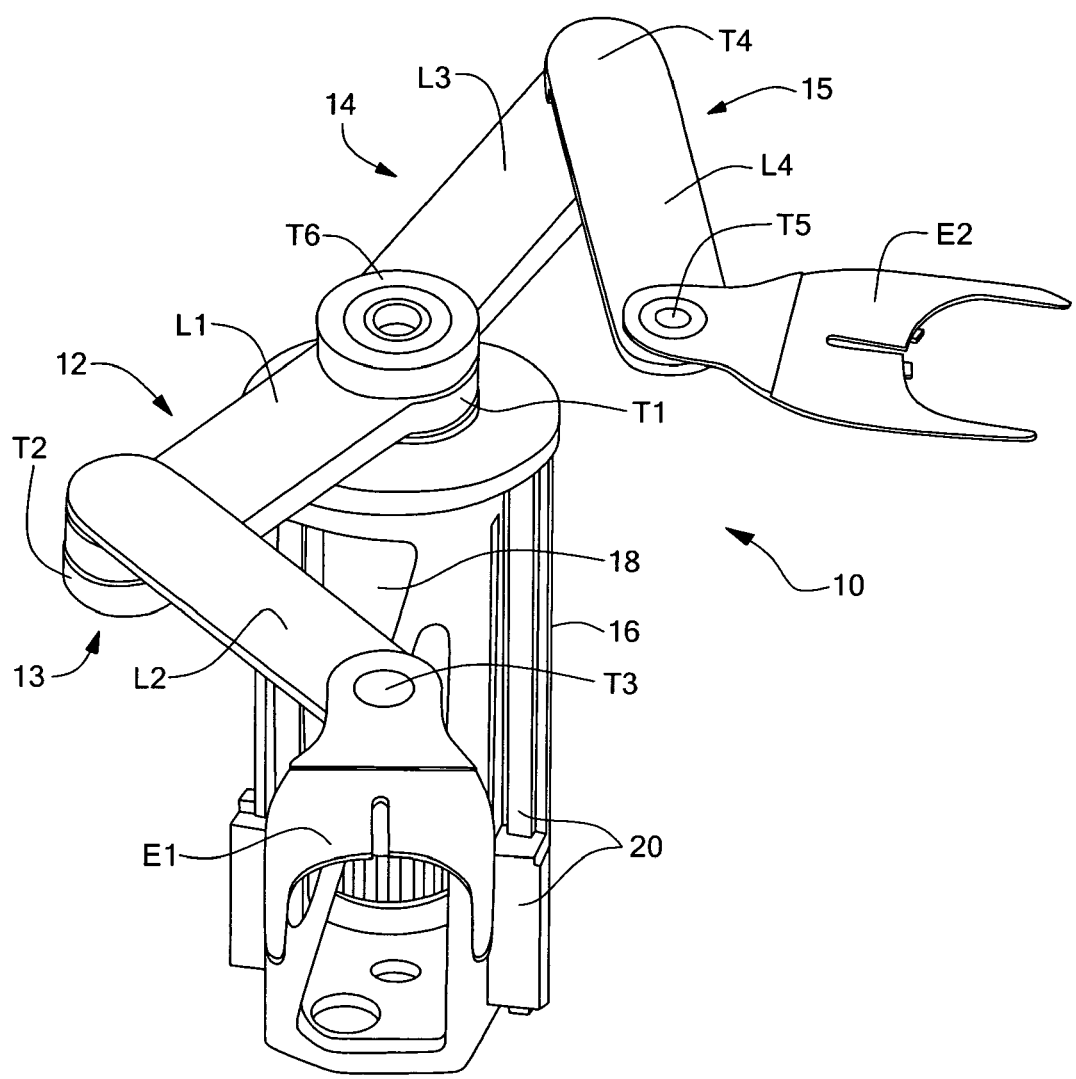
FIG. 2 is a first embodiment of a dual arm robot having two limbs providing a total of four degrees of freedom (4 DOF) according to the present invention.
Figure 3:
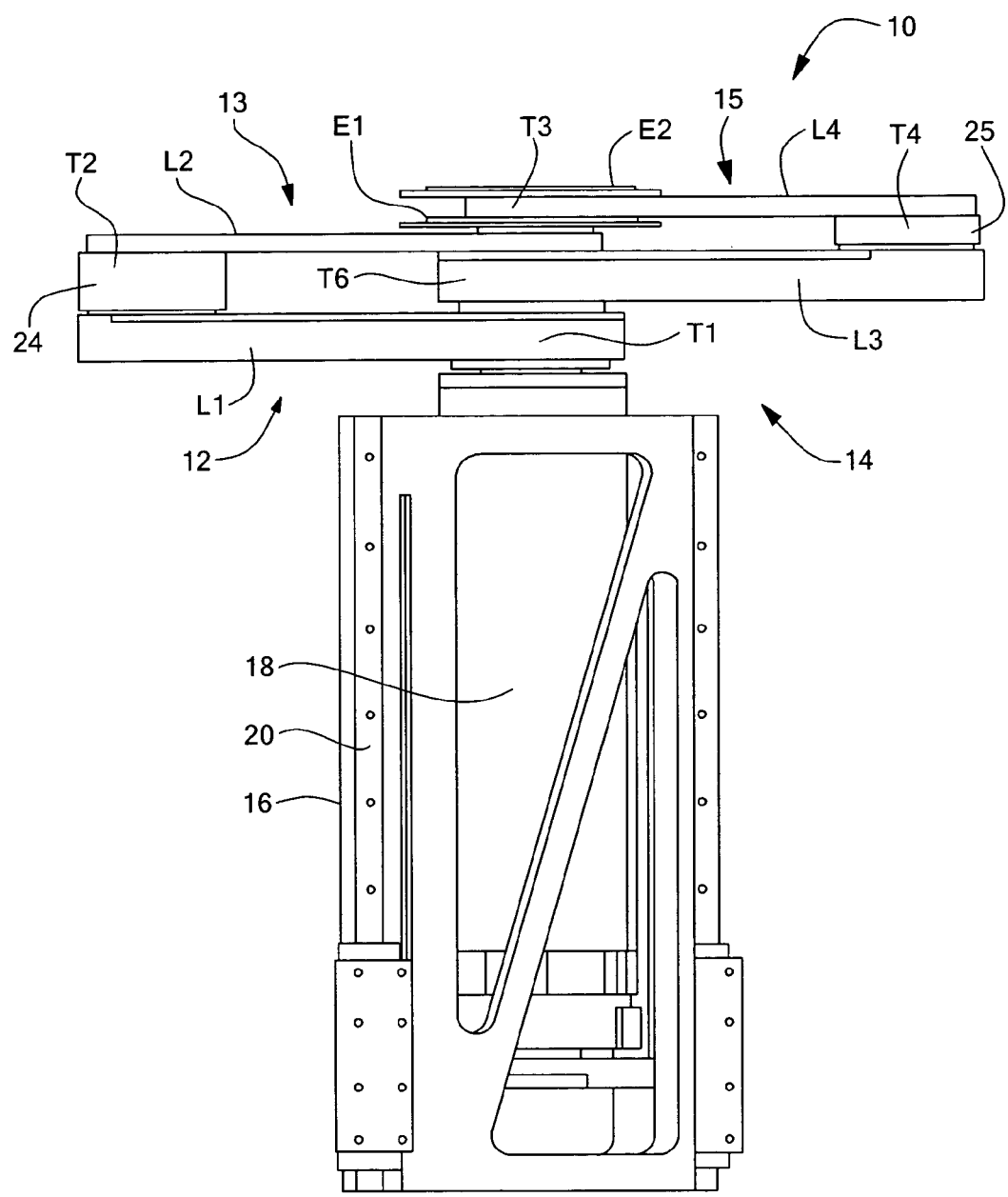
FIG. 3 is a side view of the robot of FIG. 2.

A first embodiment of a robot assembly 10 according to the present invention is illustrated in FIGS. 2 and 3. The assembly includes two arms 12, 14 that share a common prismatic joint 20/carriage 18 linkage. The common carriage link 18 is located within the envelope of a column 16. Each arm further includes a limb 13, 15 that is movable in a horizontal plane and mounted atop the common carriage link 18. Referring to the kinematic chain illustrated schematically in FIG. 4, four joint/link pairs are evident for each arm, with the arms sharing a prismatic joint 20/carriage 18. Referring to arm 12, these pairs are prismatic joint 20/carriage 18, revolute joint T1/inner link L1, revolute joint T2/outer link L2, and revolute joint T3/link E1. Referring to arm 14, these pairs are prismatic joint 20/carriage 18, revolute joint T6/inner link L3, revolute joint T4/outer link L4, and revolute joint T5/link E2. Thus, the limbs 13, 15 are mounted for revolution about the axis of revolute joints T1 and T6 respectively. As a result of this arrangement, a Z-axis 22 of infinite length positioned along the axis of the joints T1 and T6 can be located and described as a common axis 22 of the carriage 18. The limbs of both arms are able to extend and retract in a radial direction independently of each other.

Each distalmost link E1, E2 may support a tool. In the semiconductor industry, these links are referred to as end effector mounting flanges, and are connected in the present invention to the outer links of the manipulator via the wrist rotary joints T3 and T5. The tools supported by the end effector mounting flanges are often called end effectors. The end effector mounting flanges may be identical or different, depending on the application.

Motion of a particular joint causes the links attached to that joint to move. Upon actuation, each limb is able to move in a distal or a proximal direction to provide straight-line radial translation of the end effector, maintaining a projection of the axis of the end effector aligned to intersect the common axis 22 of the carriage 18, about which the links L1 and L3, connected via the rotary joints T1 and T2, rotate. For purposes of describing the present invention, the term "distal" is a relative term that refers to a direction generally away from the common axis 22. The term "proximal" is a relative term that refers to a direction generally toward the common axis 22.

The carriage 18 is connected via the prismatic joint 20 to a vertical column 16 for vertical linear motion along the axis $Z_{20}$ of the vertical column 16. See FIG. 4. The axis $Z_{20}$ is parallel to the common axis 22 of the carriage 18, about which the links L1 and L3 rotate. The two limbs 13, 15 are supported by the carriage 18 on the column 16. The vertical column may also be mounted for rotation on a base 21 via a revolute joint T7, as indicated schematically in FIG. 5A. The base may also be referred to a link L0. In this manner, the column allows for vertical movement of the arm assemblies and the carriage as a unit in the Z direction and, if the revolute joint T7 is present, the column may rotate about the axis of the joint T7 with respect to the robot's base 21 containing the joint's actuator.

As noted above, each inner link L1, L3 is attached to the carriage 18 via a proximal, or shoulder, rotary joint T1, T6. The shoulder joints T1, T6 of the two arms 12, 14 are co-linear on the common axis 22 of the carriage 18 and vertically offset, one above the other. The end effector mounting flanges E1, E2 move in horizontal planes that are parallel to each other, one horizontal plane offset vertically from the other horizontal plane. The elbow joint of at least one arm, joint T2 of arm 12 in the embodiment illustrated, includes a spacer 24 to space the outer link L2 from the inner link L1 by an amount sufficient to offset the two end effector mounting flanges E1, E2 vertically, as best seen in FIG. 3. In the embodiment illustrated in FIG. 3, in which the limbs are the same length, the joint T4 also includes a spacer 25 to space the outer link L4 from the inner link L3 by an amount sufficient to offset the two end effector mounting flanges E1 and E2 vertically. In this manner, the end effectors do not interfere with each other when the two arm assemblies are moving independently.

In a first embodiment, referred to as a four-axis system, the two limbs 13, 15 of the robot assembly 10 are independently operable. In this context, it will be appreciated that the term "four-axis" refers to the system of revolute joint/link pairs that allow the motion of the limbs of the arms in a plane described by polar R-θ coordinates. The mechanism of the vertical displacement of the arm is not included in the term "four-axis." Thus, the number of degrees of freedom (described as four-axis) does not take into account the entire robot's manipulator, but rather only the limbs.

In this embodiment, the limbs are independently rotatable about the revolute joints T1 and T6, wherein rotation of an individual limb is a change in the θ coordinate of the end effector mounting flange, the last link of the manipulator. As a result of the coaxial position of the T1 and T6 joints, the rotation occurs about the common axis 22 of the carriage 18. Also, the end effector mounting flanges E1, E2 are independently extendible and retractable via the linkage defined by the inner links L1, L3, the outer links L2, L4, and the rotary joints T1 through T6 along a centerline drawn along the end effector and projected toward the common axis 22 of the carriage 18. Two actuator assemblies are provided for each arm to effect these extension/retraction and rotation motions. The four actuators are housed in the carriage 18 and connected via co-axially located shafts 34, 44, 54, 64 to the arms. (See FIG. 7.) Two actuators are connected to the housings of the inner links L1 and L3, while the other two actuators are connected to pulleys located in the joints T1 and T6 of the inner links L1 and L3. The action of the linkages and the actuator assemblies, in particular when embodied as motors M1, M2, M3, M4, is discussed further below.

Figure 4:
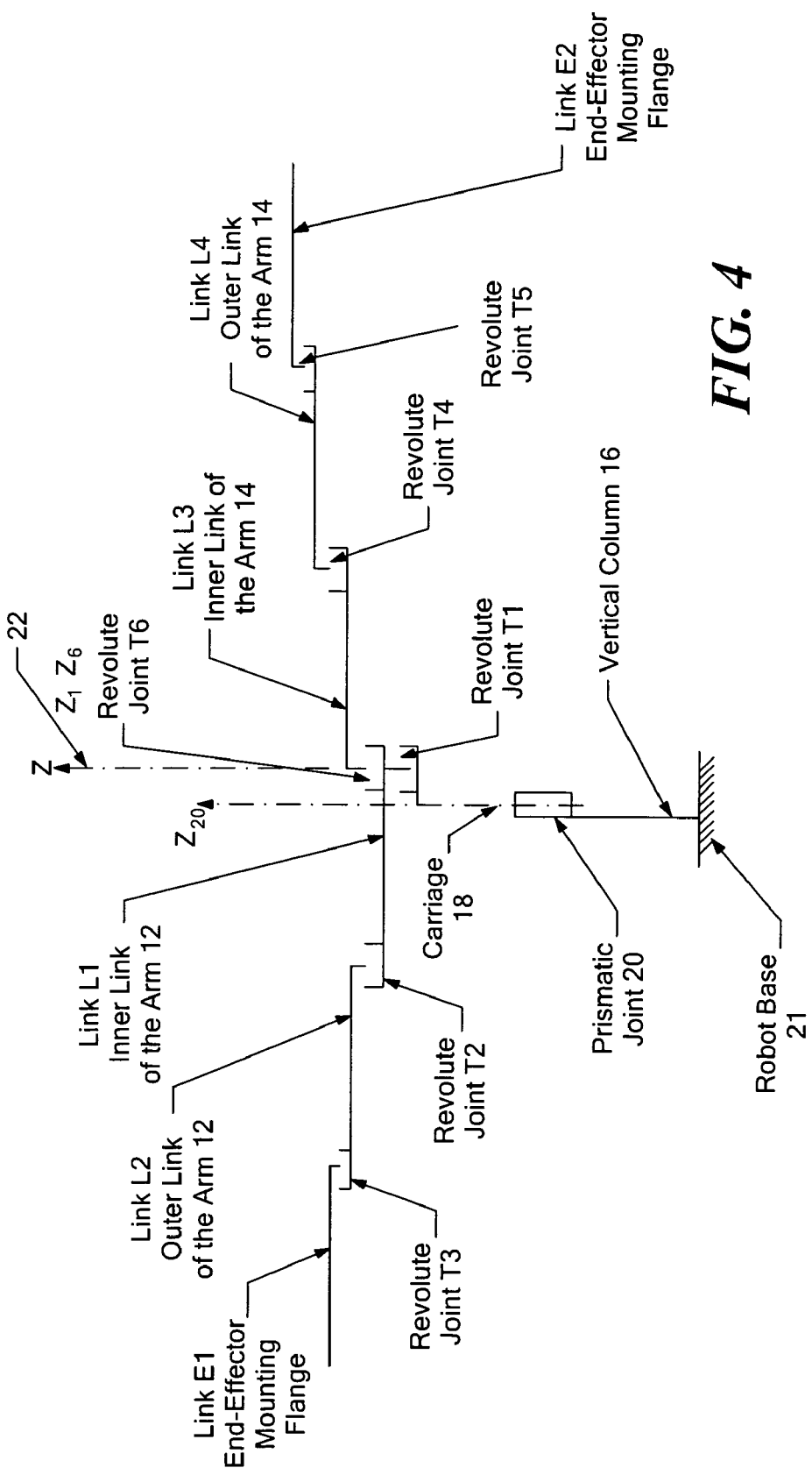
FIG. 4 is a schematic diagram of the robot of FIG. 2.
Figure 5A:
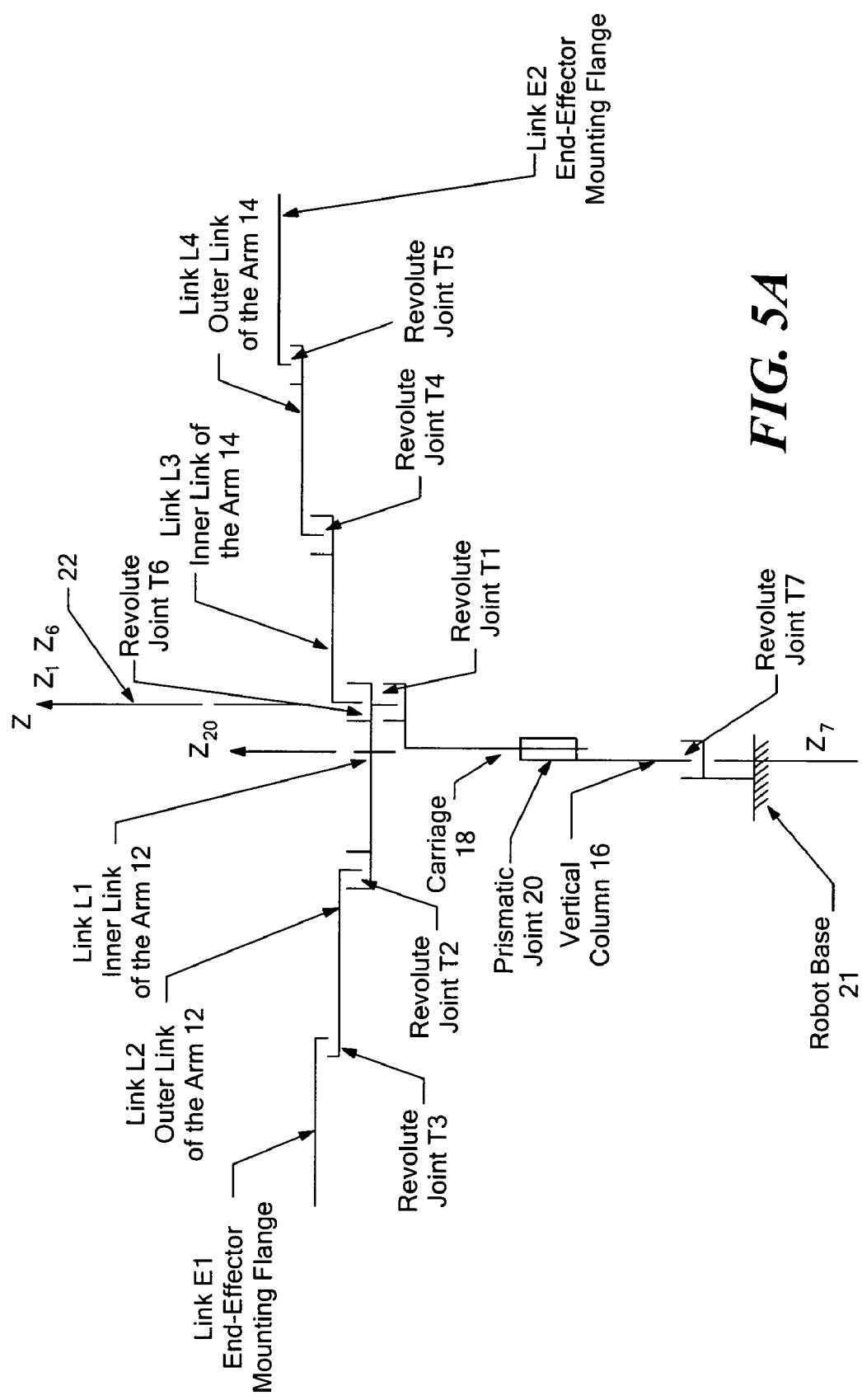
FIG. 5A is a schematic diagram of a further embodiment of the robot of FIG. 2.
Figure 5B:
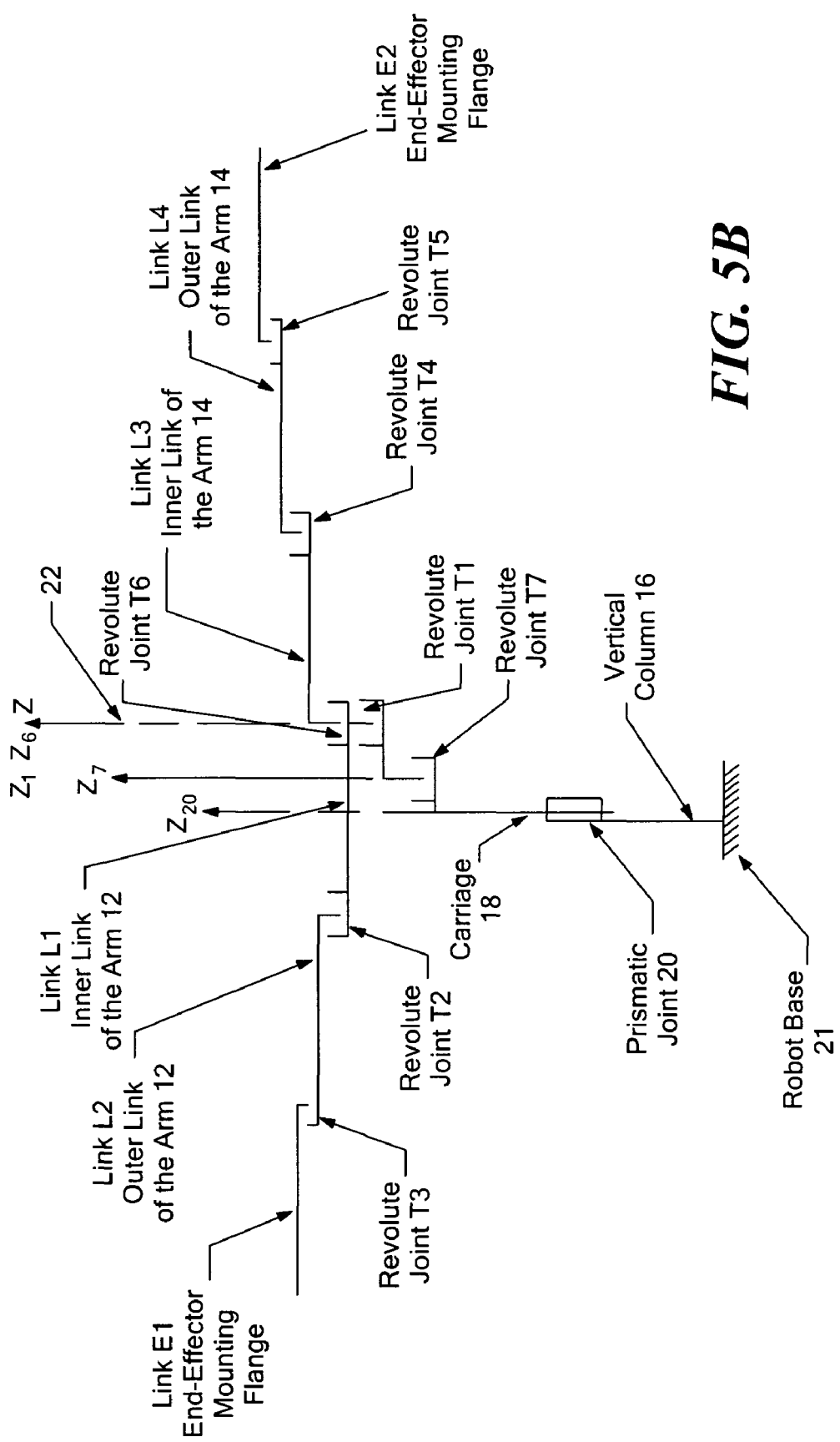
FIG. 5B is a schematic diagram of a further embodiment of the robot of FIG. 2.

In the embodiment illustrated, motion of the end effector mounting flanges E1, E2 is produced by manipulation of the inner and outer links incorporating a series of belts and pulleys. The motion of the end effector mounting flange E1 of the arm 12 is discussed with reference to the schematic diagrams of FIGS. 4 and 5A and the kinematic diagram of FIG. 6. As illustrated in FIGS. 4 and 5A, the inner link L1 is connected to the carriage 18 via the shoulder rotary joint T1 (or via the rotary joint T1 and an additional rotary joint T7 located as shown in FIG. 5B). The outer link L2 is connected to the inner link L1 via the elbow rotary joint T2. The end effector mounting flange E1 is connected to the outer link L2 via the wrist rotary joint T3. The links and joints of this part of the manipulator form a kinematic chain that is open at one end and connected to the carriage 18 at the other. The carriage 18 is connected to the robot base 21 via a prismatic joint 20, a shown in FIG. 4 and also in FIG. 5B, or using an additional revolute joint T7 located between the column 16 and the robot base 21, as shown in FIG. 5A. The end effector, which is not a part of the schematic and is not shown, is connected to the end effector mounting flange E1.

Figure 6:
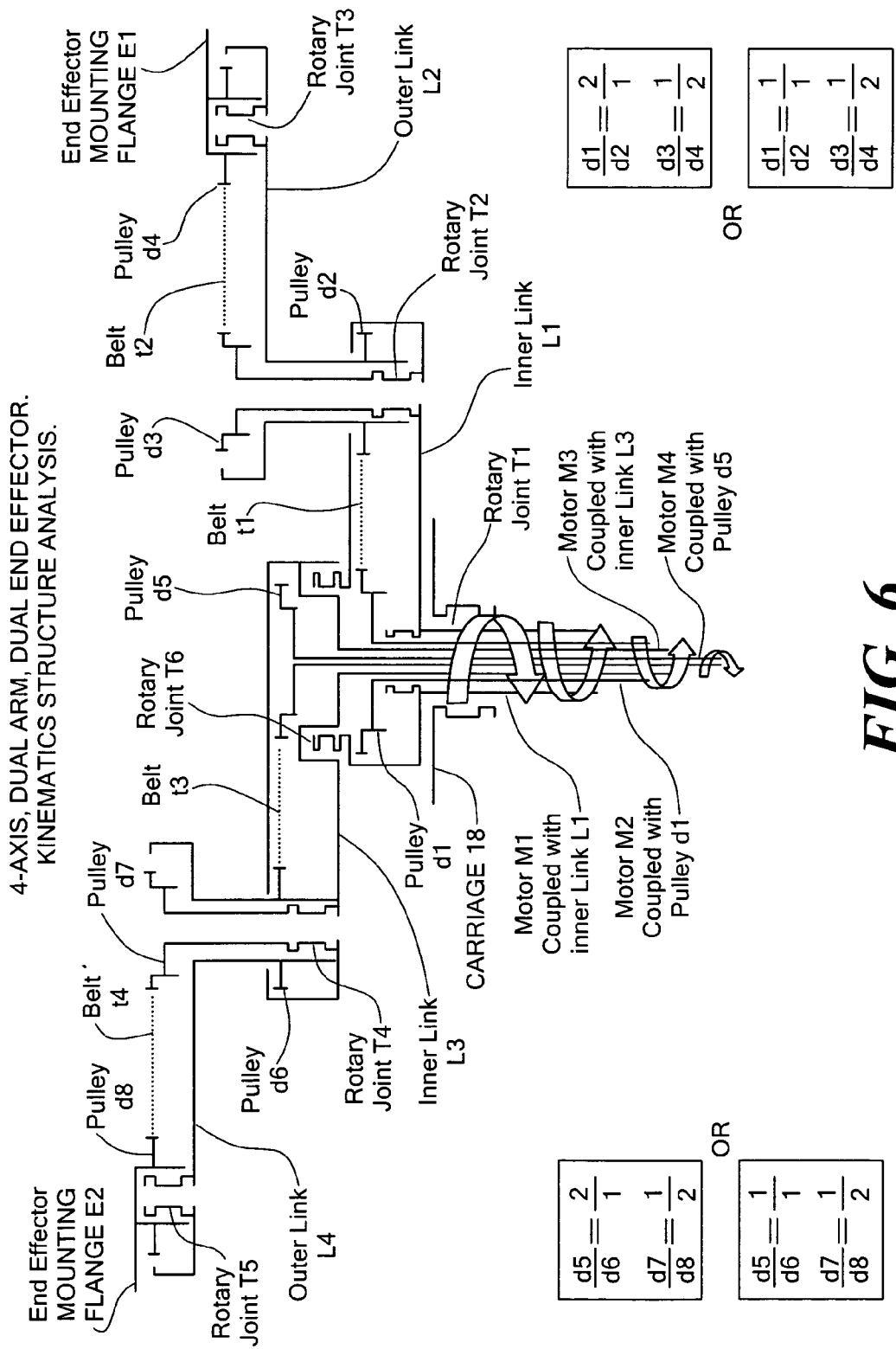
FIG. 6 is a kinematic diagram of the robot of FIG. 2.

Referring to FIG. 6, a pulley d1 is provided at the shoulder rotary joint T1, and a pulley d2 is provided at the elbow rotary joint T2. A belt t1 extending along the inner link L1 is connected to the pulleys d1 and d2. The pulley d2, while physically located in the inner link L1, is mounted to the link L2 and, as a part of the elbow rotary joint T2, allows rotation of the link L2 about the joint axis of the preceding link L1. A pulley d3 is also provided at the elbow rotary joint T2, and a pulley d4 is provided at the wrist rotary joint T3. The pulley d3, while located physically in the link L2, is attached to the link L1 and is a part of the axis about which the elbow joint T2 of the link L2 revolves. The pulley d4, while physically located within the link L2, is attached to the end effector mounting flange E1 and, as a part of the wrist joint T3, allows the rotation of the end effector mounting flange E1 about the joint axis of the preceding link L2. A belt t2 is connected to the pulleys d3 and d4. The pulley d3, fixed to the link L1 at the axis about which the elbow joint T2 of the link L2 rotates, travels with the housing of the link L1 when the shoulder joint T1 of the link L1 is rotated about the common axis 22. When the link L1 is rotated, the pulley d2 is also constrained to move with the link L1, which causes the pulley d2 to move in a fashion similar to the movement of a satellite gear of a planetary gear box. The pulley d2 rotates around the common axis 22 of the shoulder joint T1, because it is attached to the distal axis of the inner link L1 via the elbow joint T2. As a part of the elbow joint T2, the pulley d2 also rotates about the distal axis of the preceding link L1. The rotation occurs as a result of the pulley d2 being connected to the pulley d1 via a belt t1, such as a timing belt, chain, or cable works.

The ratio between the diameters of the pulleys d1 and d2 effects the relative angular displacement of the pulley d2, depending on the amount of angular displacement given to the actuator input connected to the link L1 (e.g., motor M1) and the actuator input connected to the pulley d1 (e.g., motor M2). A complete description of the position of the axis and orientation of the elbow joint T2 (of which the pulley d2 is a part), in the polar coordinate system based at the polar axis located co-axially with the axis Z1 of the shoulder joint T1, depends upon the length of the link L1, the input angular displacement values to the pulley d1 (via motor M2) and link L1 (via motor M1), and the pulley diameter ratio d1/d2. Thus, the R-θ coordinates of the proximal end of the subsequent link L2 attached to the elbow joint T2 and the orientation of the link L2 around the T2 joint axis of rotation are defined. R-θ coordinates of the distal end of the link L2, which contains the axis of rotation of the wrist joint T3, depend on the length of the link L2.

The position in the R-θ coordinate system of the proximal end of the end effector mounting flange, link E1, attached to the wrist joint T3 and the orientation of E1 around the T3 joint axis of rotation depends on the following conditions: the angular input value to the link L1 (via motor M1), the angular input value to the pulley d2 (via motor M2), the length of the link L1, the pulley diameter ratio d1/d2, the length of the link L2, and the pulley diameter ratio d3/d4.

The other limb is similar. Thus, as illustrated in FIGS. 4, 5A, and 6, the inner link L3 is connected to the carriage 18 via the shoulder rotary joint T6 (or via rotary joint T6 and an additional rotary joint T7 located as shown in FIG. 5A). The outer link L4 is connected to the inner link L3 via the elbow rotary joint T4. The end effector mounting flange E1 is connected to the outer link L4 via the wrist rotary joint T5. The links and joints of this part of the manipulator form a kinematic chain that is open at one end and connected to the carriage 18 at the other. The carriage 18 is connected to the robot base 21 via a prismatic joint 20, as shown in FIGS. 4 and 5B or using an additional revolute joint T7 located between the column 16 and the robot base 21, as shown in FIG. 5A. The outer link L4 is coupled to the end effector mounting flange E2 via the wrist rotary joint T5.

A pulley d5 is provided at the shoulder rotary joint T6, and a pulley d6 is provided at the elbow rotary joint T4. A belt t3 extending along the inner link L3 is connected to the pulleys d5 and d6. The pulley d6, while physically located in the inner link L3, is a part of and mounted to the link L4 and, as a part of the elbow joint T4, allows rotation of the link L4 about the joint axis of the preceding link L3. A pulley d7 is also provided at the elbow rotary joint T4, and a pulley d8 is provided at the wrist rotary joint T5. The pulley d7, while located physically in the link L4, is attached to the link L3 and is a part of the axis about which the elbow joint T4 of the link L4 revolves. The pulley d8, while physically located within the link L4, is attached to the end effector mounting flange E2 and, as a part of the wrist joint T5, allows the rotation of the end effector mounting flange E2 about the joint axis of the preceding link L4. A belt t4 is connected to the pulleys d7 and d8. The pulley d7, fixed to the link L3 at the axis about which the elbow joint T4 of the link L4 rotates, travels with the housing of the link L3 when the shoulder joint T6 of the link L3 is rotated about the common axis 22. When the link L3 is rotated, the pulley d6 is also constrained to move with the link L3, which causes the pulley d6 to move in a fashion similar to the movement of a satellite gear of a planetary gear box. The pulley d6 rotates around the common axis 22 of the shoulder joint T6, because it is attached to the distal axis of the inner link L3 via the elbow joint T4. As a part of the elbow joint T4, it also rotates about the distal axis of the preceding link L3. The rotation occurs as a result of the pulley d6 being connected to the pulley d5 via a belt t3, such as a timing belt, chain, or cable works.

The ratio between the diameters of the pulleys d5 and d6 effects the relative angular displacement of the pulley d6, depending on the amount of angular displacement given to the actuator input connected to the link L3 (e.g., motor M3) and the actuator input connected to the pulley d5 (e.g., motor M4). A complete description of the position of the axis and orientation of the elbow joint T4 (of which the pulley d6 is a part), in the polar coordinate system based at the polar axis located co-axially with the axis Z6 of the shoulder joint T6, depends upon the length of the link L3, the input angular displacement values to the pulley d5 (via motor M4) and link L3 (via motor M3), and the pulley diameter ratio d5/d6. Thus, the R-θ coordinates of the proximal end of the subsequent link L4 attached to the elbow joint T4 and the orientation of the link L4 around the T4 joint axis of rotation are defined. R-θ coordinates of the distal end of the link L4, which contains the axis rotation of the wrist joint T5, depend on the length of the link L4.

The position in the R-θ coordinate system of the proximal end of the end effector mounting flange, link E2, attached to the wrist joint T5 and the orientation of E2 around the T5 joint axis of rotation depends on the following conditions: the angular input value to the link L3 (via motor M3), the angular input value to the pulley d5 (via motor M4), the length of the link L3, the pulley diameter ratio d5/d6, the length of the link L4, and the pulley diameter ratio d7/d8.

Figure 7:
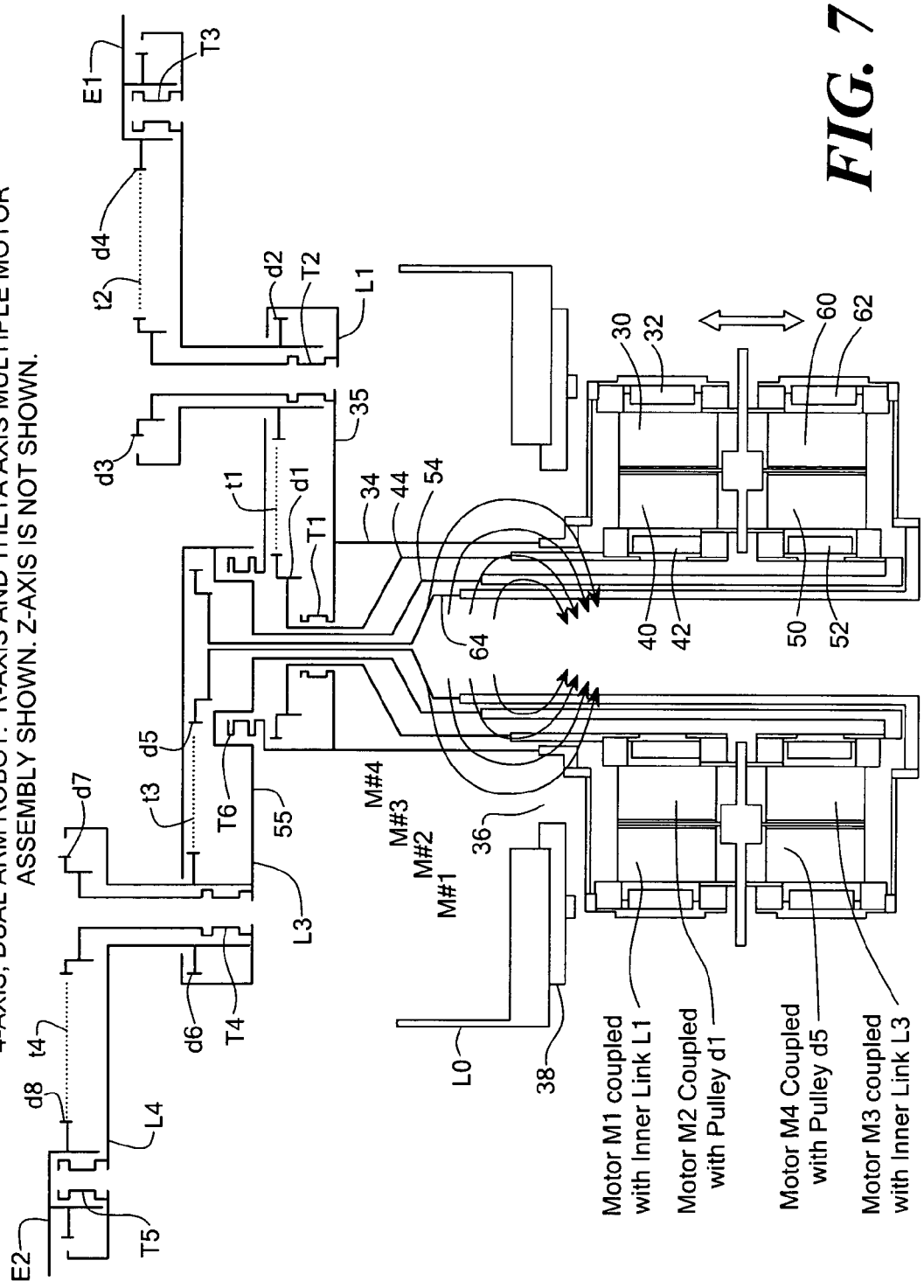
FIG. 7 is a schematic diagram of an actuator assembly of the robot of FIG. 2.

In the embodiments illustrated, the actuators are embodied as motors. Referring to FIG. 7, a motor M1 is coupled via shaft 34 with the inner link L1. A motor M2 is coupled via shaft 44 with the pulley d1. A motor M3 is coupled via shaft 54 with the inner link L3. A motor M4 is coupled via shaft 64 with the pulley d5.

Figure 7A:
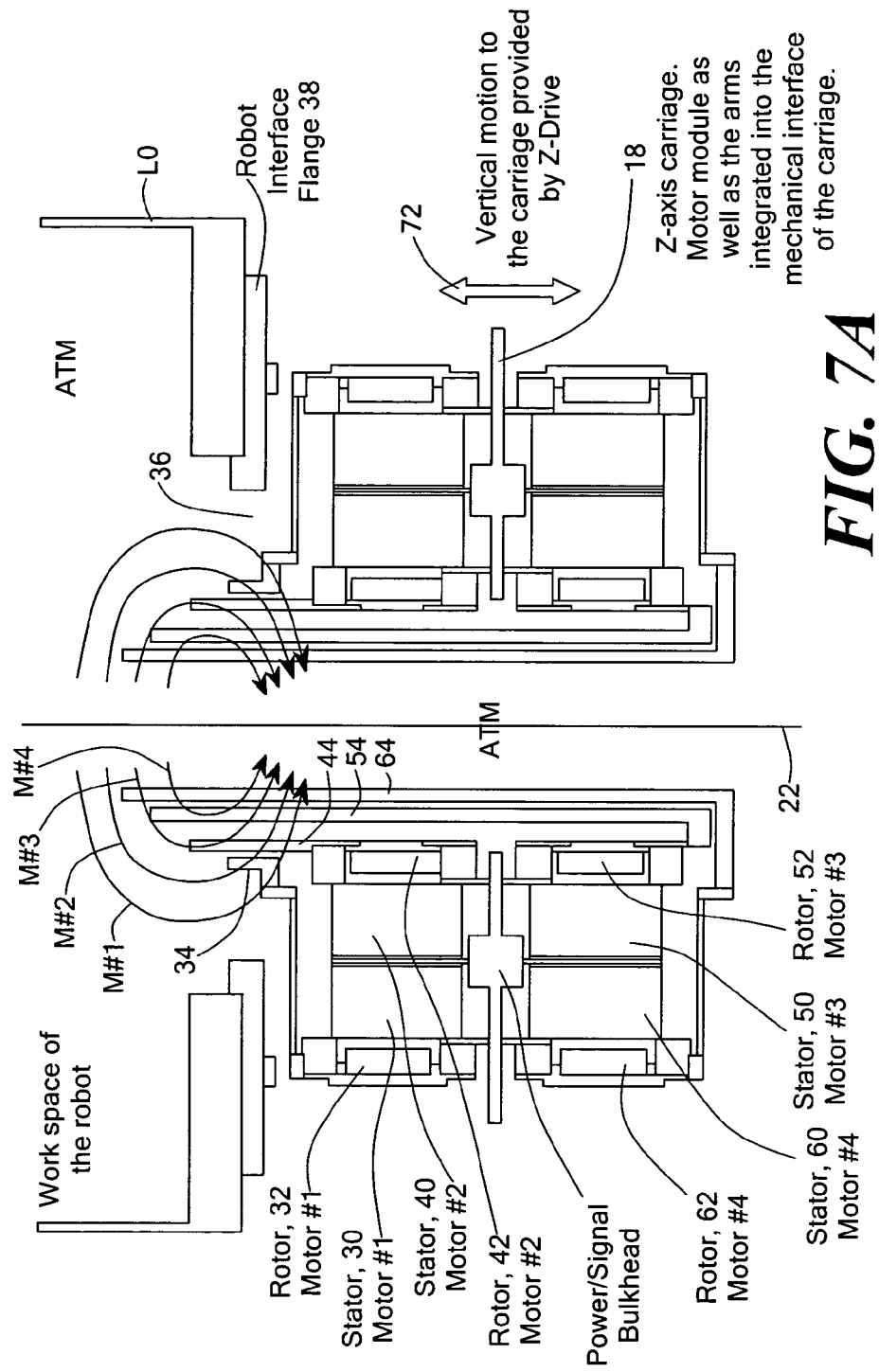
FIG. 7A is a schematic diagram of an embodiment of an atmospheric environment actuator assembly of the robot of FIG. 2.

FIG. 7A shows with more particularity an arrangement of the motors suitable for use with an atmospheric robot. The motor M1 includes a stator 30 and a rotor 32 concentrically surrounding the common axis 22 of the carriage 18. The rotor is coupled to a hollow shaft 34 that extends upwardly through an opening 36 in an interface flange 38 at the top of the base L0 to couple with the housing 35 of the inner link L1 (see FIG. 7A). In this way, the shaft rotates with the rotor.

The motor M2 includes a stator 40 and a rotor 42, also concentrically surrounding the common axis 22 of the carriage 18 and located inwardly of the motor M1. The rotor 42 of the motor M2 is coupled to a hollow shaft 44 that extends upwardly to couple with the pulley d1 (see FIG. 7). The shaft is located concentrically inwardly of the shaft 34 of the motor M1 and rotates with the rotor 42.

The motors M3 and M4 are located below the motors M1 and M2. The motor M3 includes a stator 50 and a rotor 52 concentrically surrounding the common axis 22 of the carriage 18. The rotor 52 is coupled to a hollow shaft 54 that extends upwardly to couple with the housing 55 of the inner link L3 (see FIG. 7). The shaft 54 is located concentrically inwardly of the shafts 34, 44 of the motors M1 and M2 and rotates with the rotor 52.

The motor M4 includes a stator 60 and a rotor 62, also concentrically surrounding the common axis 22 of the carriage 18 and located outwardly of the motor M3. The rotor of the motor M4 is coupled to a shaft 64, which may or may not be hollow, that extends upwardly to couple with the pulley d5 (see FIG. 7). The shaft 64 is located concentrically inwardly of the shafts 34, 44, 54 of the motors M1, M2, and M3 and rotates with the rotor 62. A hollow shaft is useful to contain power or signal cabling to the end effectors, if desired.

The four motors M1 through M4 are mounted within the carriage 18 for vertical travel, as indicated by the arrow 72 and described further below. Power and signal cables (not shown) are provided for connection to the motors through appropriate openings in the housings, as would be known in the art.

The illustrated arrangement of the motors, in which two motors are disposed annularly or concentrically, one inside the other, is advantageous in the present invention. In prior art arrangements, the motors are aligned linearly, resulting in a long motor package and long shafts for the motors furthest from the arm assemblies. The longest shafts are subject to greater torsional stress and limit the size of the motor. In the present invention, the size of the motor package is reduced linearly, allowing the use of shorter shafts and larger motors with greater torques. Additionally, in certain applications, the space in which the motors can be placed is limited. For example, in semiconductor equipment manufacturing, the height of the robot arms is set at a predetermined standard height above the floor. The present motor arrangement allows the use of four motors while minimizing the distance between the floor and the robot arms.

Figure 8:
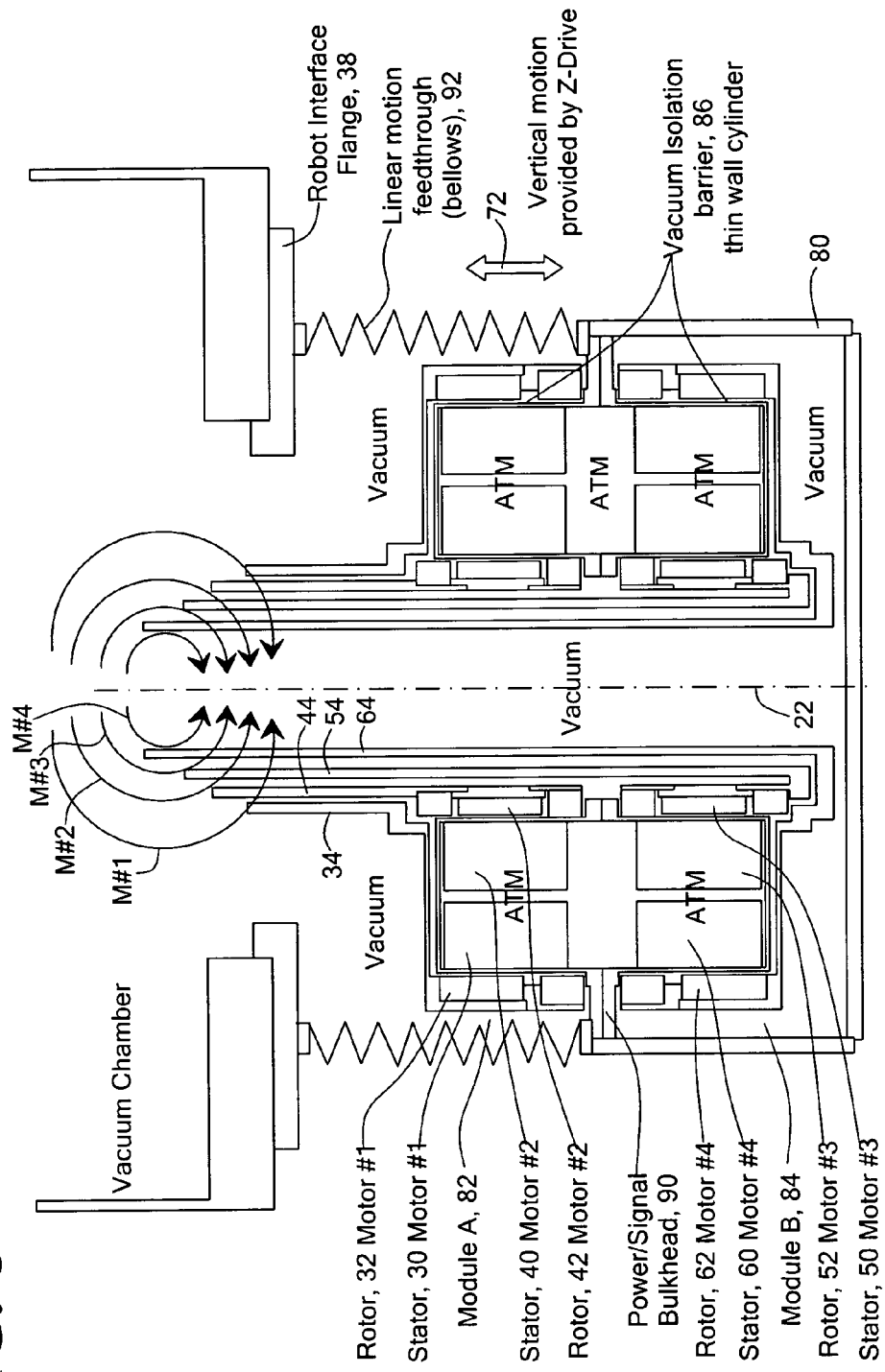
FIG. 8 is a schematic diagram of a further embodiment of a vacuum compatible actuator assembly of the robot of FIG. 2.
Figure 12:
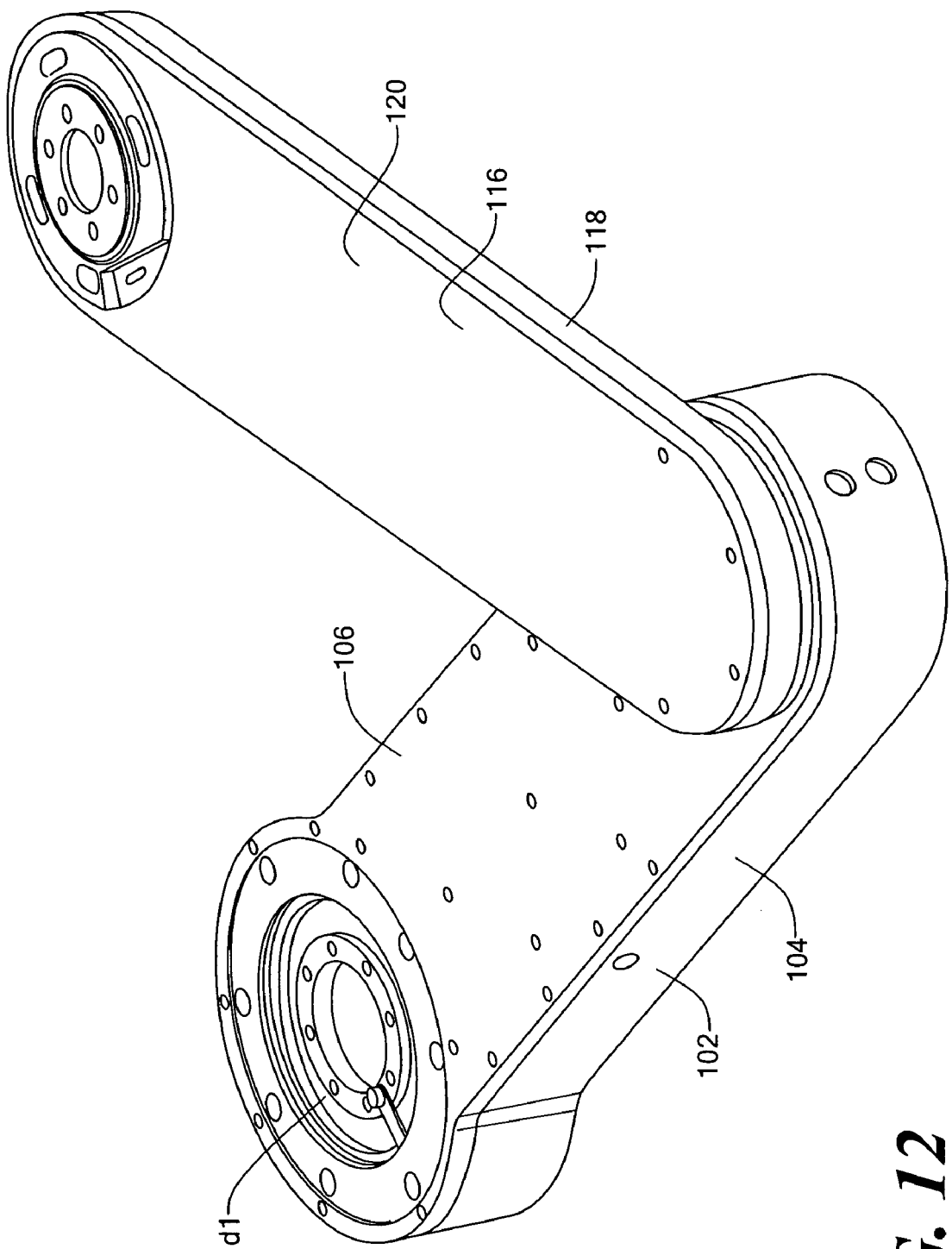
FIG. 12 is an isometric view of a limb of an arm according to the present invention.
Figure 13:
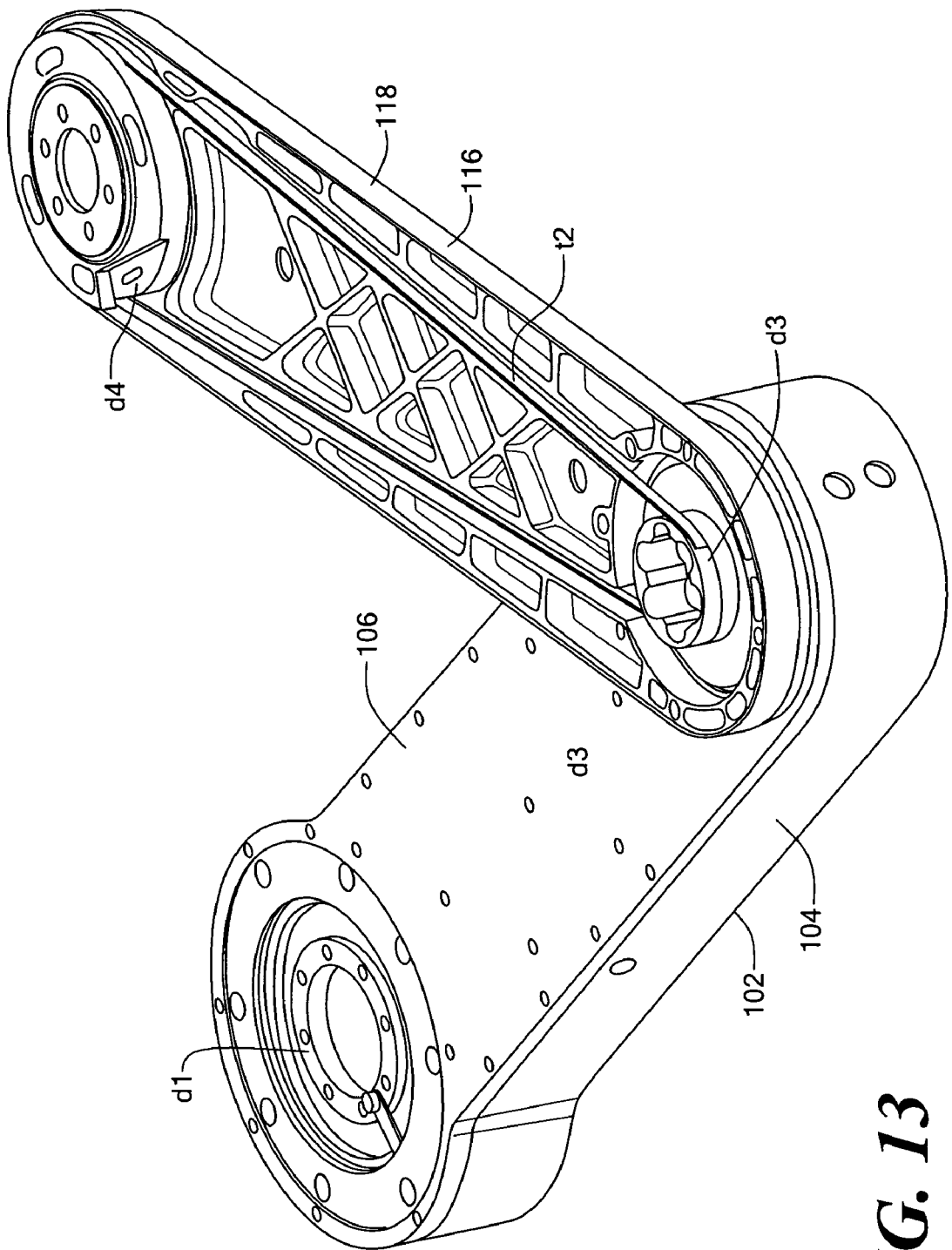
FIG. 13 is a partial view of the limb of FIG. 12.
Figure 14:
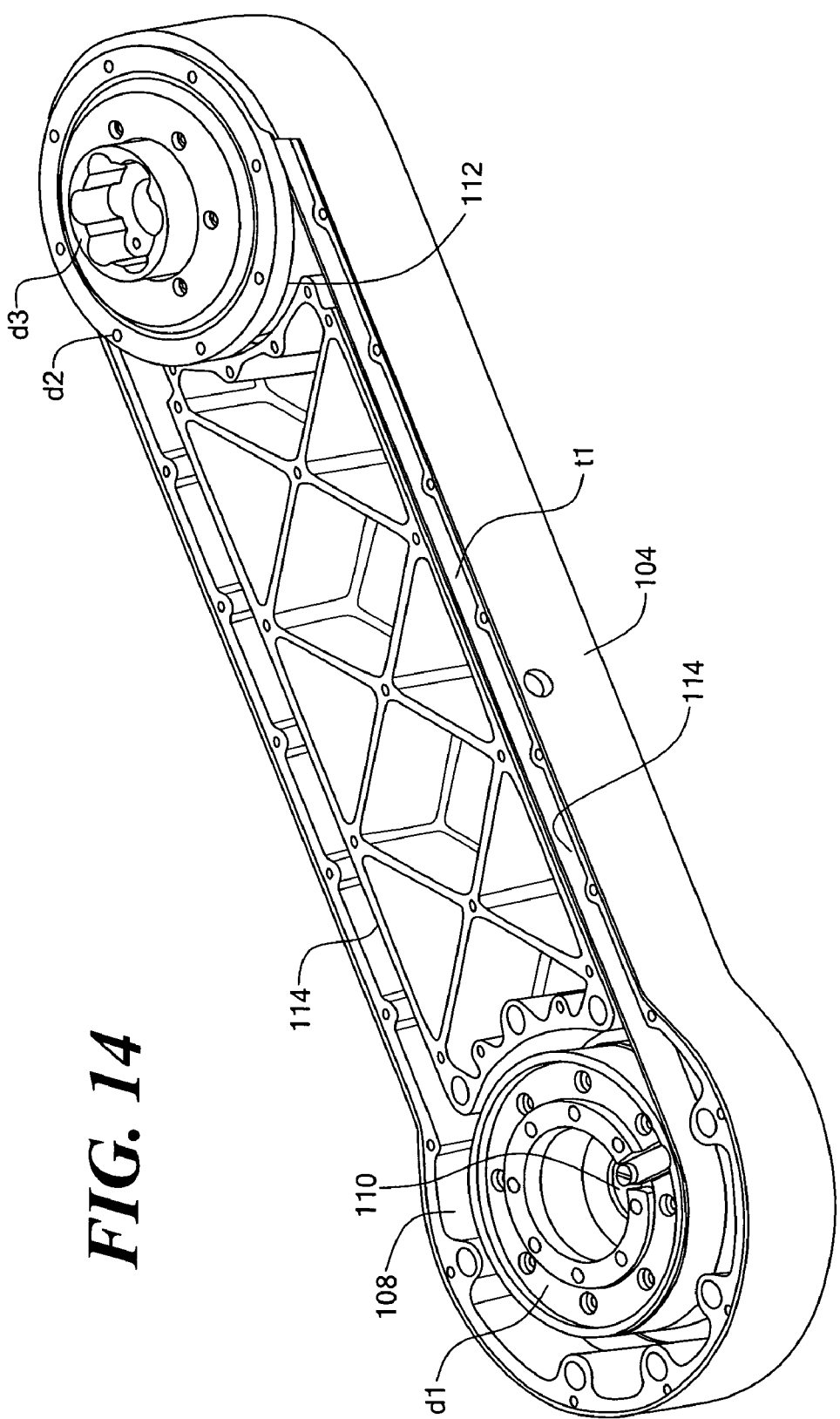
FIG. 14 is a partial view of the inner link assembly, including the inner link joint and the outer link joint, of FIG. 12.
Figure 15:
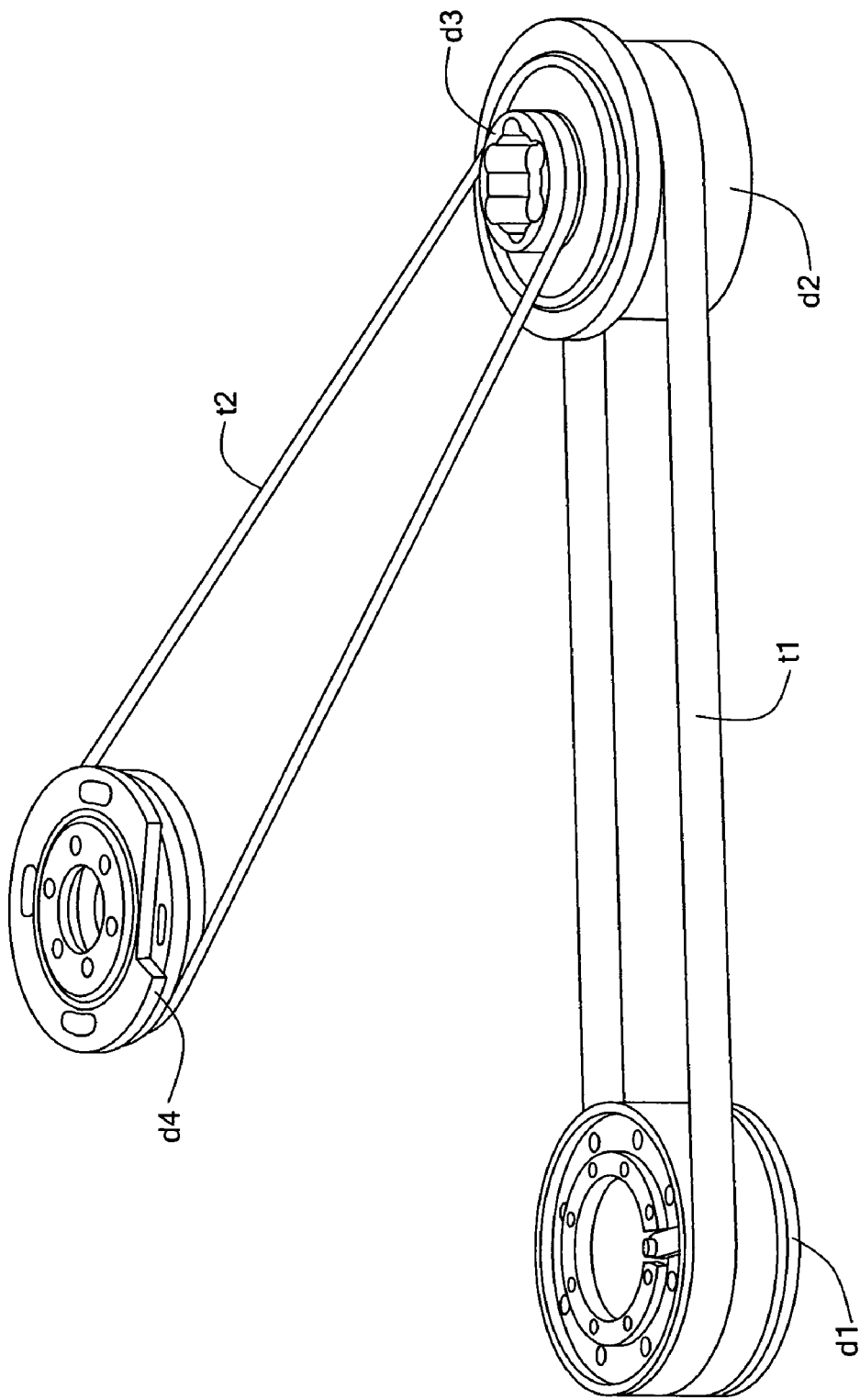
FIG. 15 is an isometric view of the belts and pulleys of the limb of FIG. 12.
Figure 16:
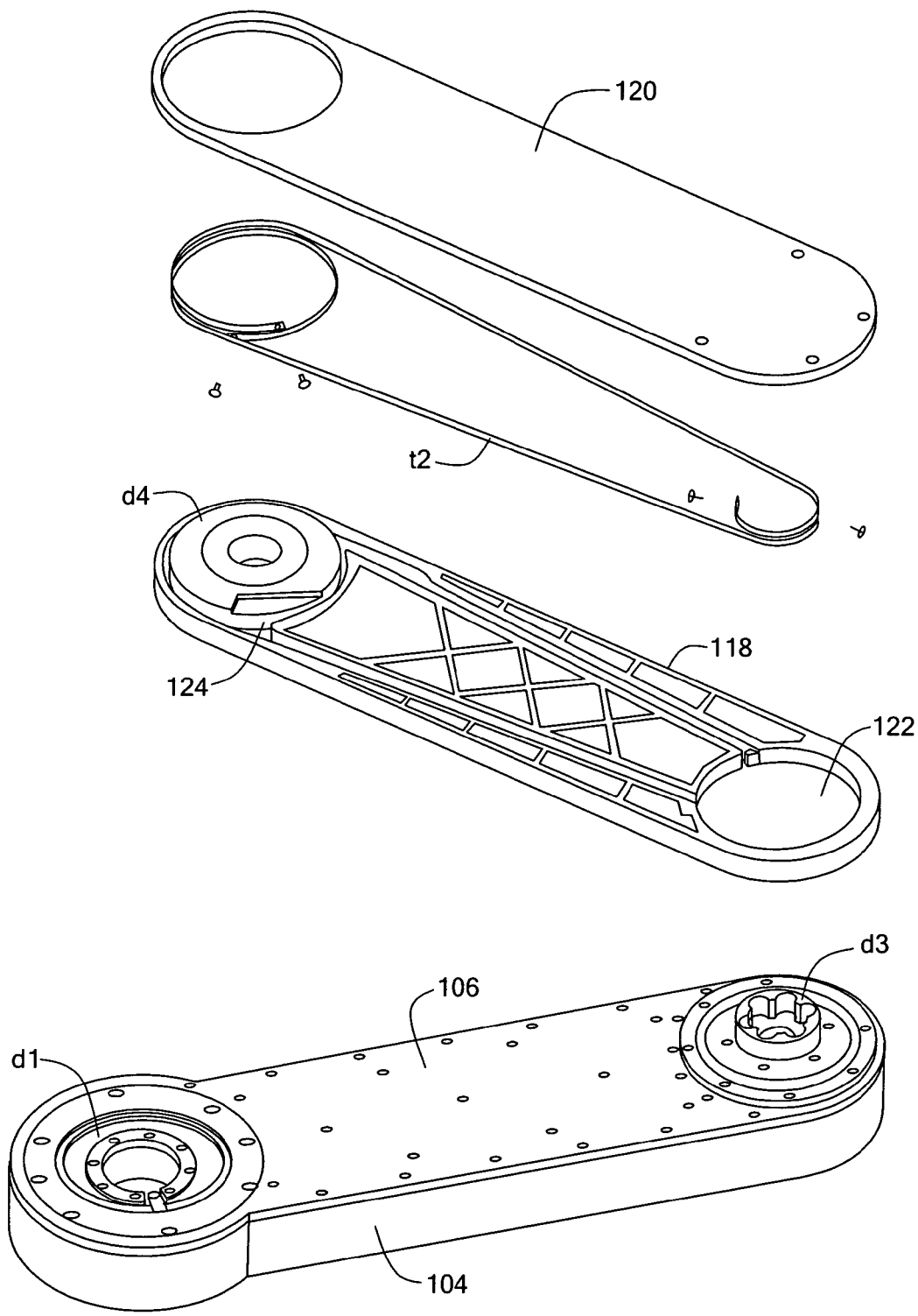
FIG. 16 is an exploded view of the limb of FIG. 12.
Figure 17:
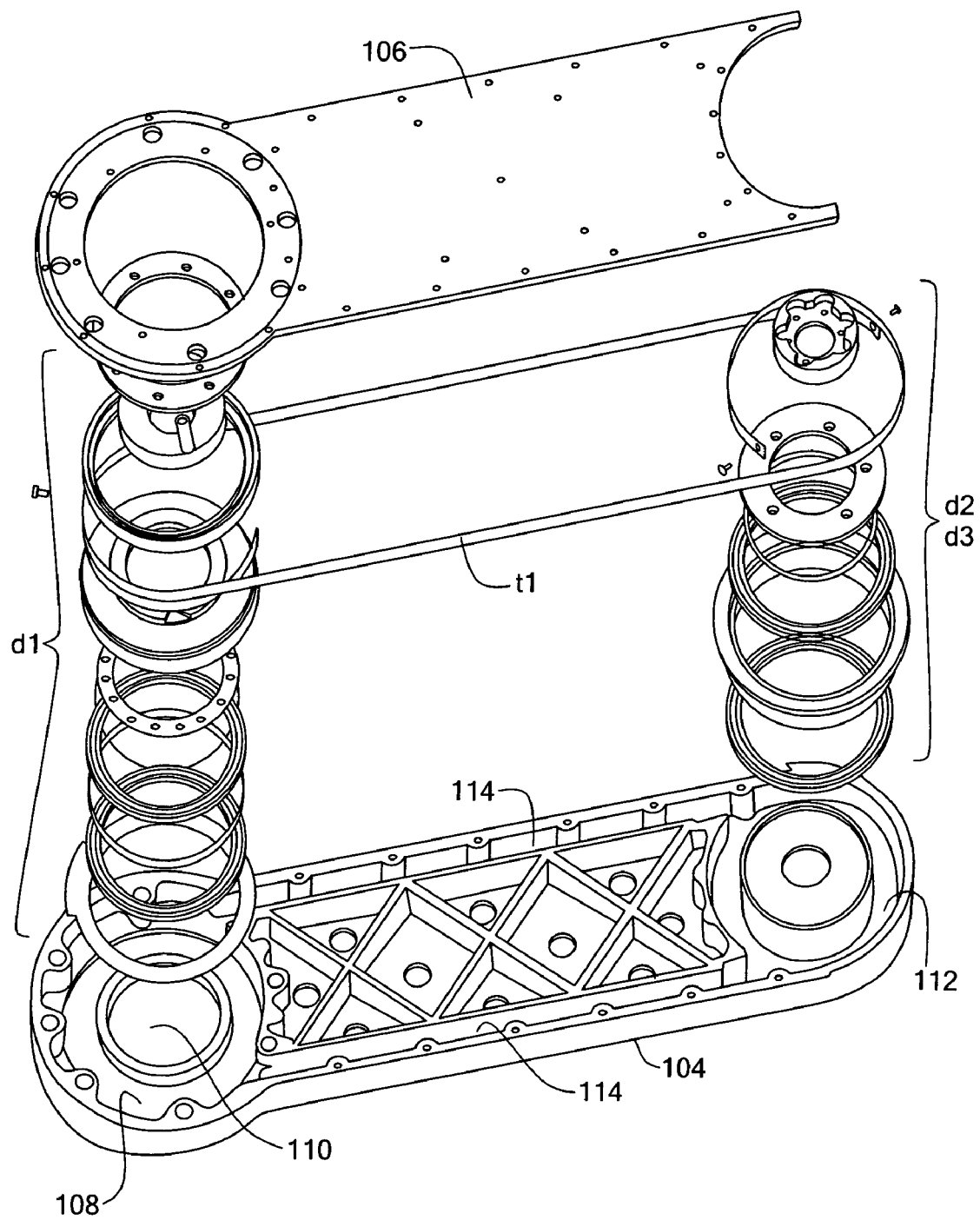
FIG. 17 is an exploded view of the inner link assembly, including the inner link joint and the outer link joint, of FIG. 12.
Figure 18:
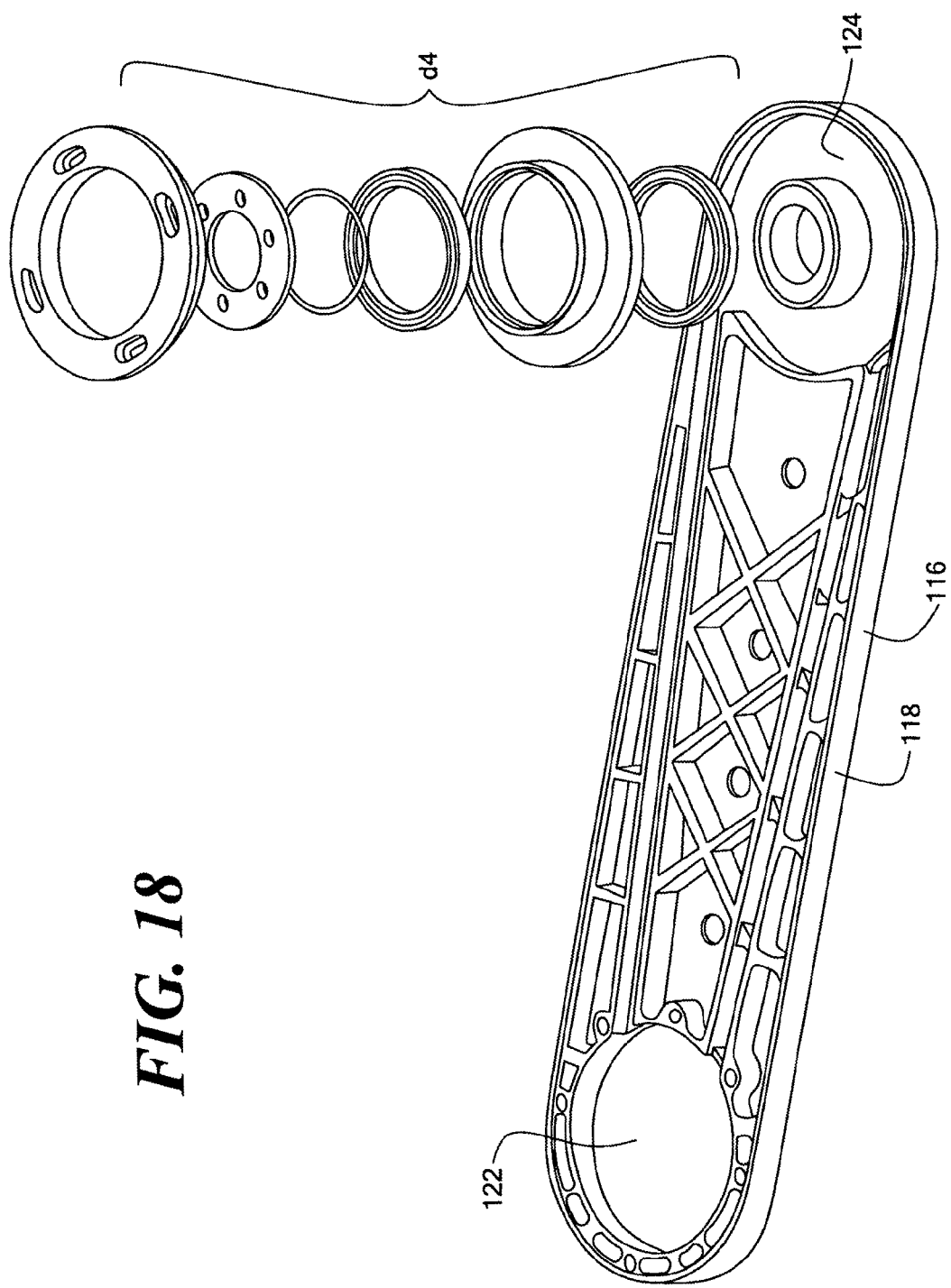
FIG. 18 is an exploded view of the outer link assembly, including the end effector mounting flange joint, of FIG. 12.

The robot assembly of the present invention can be utilized in a vacuum environment by, for example, choosing metal bands as the belts within the arms, low vapor pressure grease in the bearings, stainless steel and aluminum as the housing material of the arms, and vacuum compatible servo motors as the drives. FIG. 8 illustrates an embodiment of four motors M1, M2, M3, M4 suitable for use with a vacuum compatible robot.

A suitable housing 80 is provided surrounding the stators of the motors. Preferably the motors M1 and M2 are provided as one module 82, and the motors M3 and M4 are provided as a second module 84. The motors are arranged in a back-to-back configuration, in which the end shafts of the motor modules are oriented in opposite directions when the motors are assembled into a two-module unit. Vacuum isolation barriers 86, such as thin wall cylinders, are provided between the rotors 32, 42, 52, 62 and stators 30, 40, 50, 60, so that the stators are in an atmospheric environment. The power and signal cables (not shown) are introduced through suitably sealed openings in a bulkhead 90 of the housing 80. A bellows 92 connects the motor housing 80 and the interface flange 38. During vertical travel of the carriage, the bellows expands and contracts. In this manner, the robot arms can be maintained in a vacuum environment.

Figure 7B:
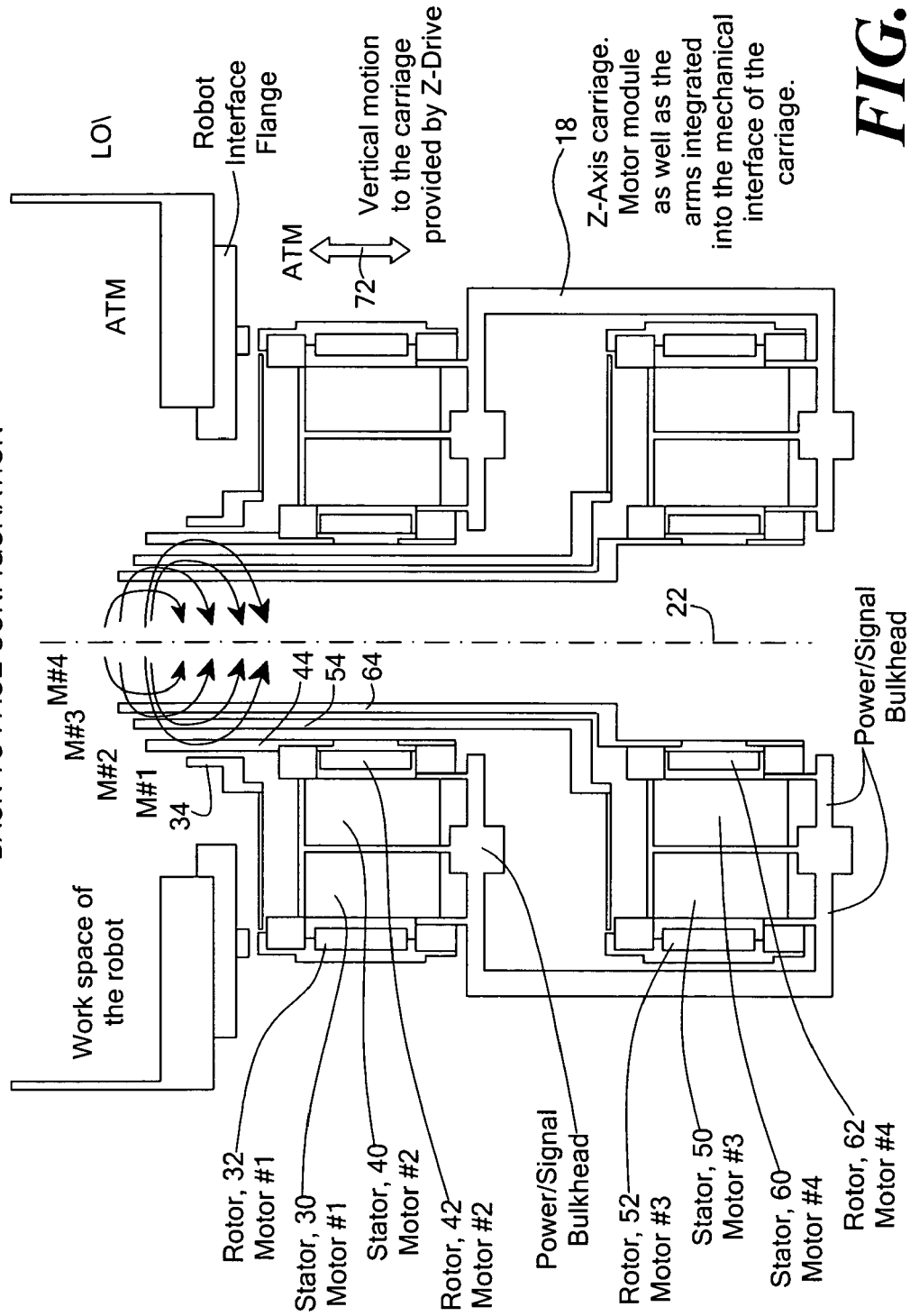
FIG. 7B is a schematic diagram of a further embodiment of an atmospheric environment actuator assembly of the robot of FIG. 2.

FIG. 9 illustrates a further embodiment for use with a vacuum compatible robot in which the motors are arranged in a back-to-face configuration, in which the end shafts of the motor modules are oriented in the same direction when the motors are assembled into a four-module unit. Power and signal cables extend through a bulkhead 91 below the motors M1, M2 and a bulkhead 93 below the motors M3, M4. The back-to-face motor configuration can also be utilized with atmospheric robots, illustrated in FIG. 7B.

As noted above, the ratio of the diameter of the pulleys determines the motion of the end effector mounting flanges. To achieve linear radial translation of the end effector mounting flanges, in one embodiment, the pulleys d1 and d2 have a diameter ratio of 2:1 and the pulleys d3 and d4 have a diameter ratio of 1:2. Similarly, the pulleys d5 and d6 have a diameter ratio of 2:1, and the pulleys d7 and d8 have a diameter ratio of 1:2.

The table in FIG. 10 illustrates the various motions of the end effector mounting flanges when the ratio of the diameters of the inner pulleys d1:d2 and d5:d6 is 2:1. For example, to extend the end effector mounting flange E1, the motor M1 is rotated, counterclockwise in the embodiment shown, while the other three motors maintain a standfast mode. The motion of motor M1 causes the inner link L1 to rotate counterclockwise. Because the outer link L2 is connected via the joint T2 to the inner link L2 as described more fully above, the outer link rotates clockwise at the elbow joint and the end effector mounting flange rotates counterclockwise at the wrist joint while maintaining its orientation centered on the central column. The result is an extension of the end effector mounting flange E1.

The ratio of the diameters of the inner pulleys d1:d2 and d5:d6 may also be 1:1. In this case, the motions of the end effector mounting flanges are as set out in the table in FIG. 11. As can be seen, to extend or retract an end effector mounting flange, the motors M1 and M2 are both actuated in opposite directions.

A suitable embodiment of one of the limbs is illustrated with more particularity in FIGS. 12-18. An inner link 102 includes a housing 104, which may have a separate cover plate 106. A recess 108 is formed at the proximal end in the housing for the components of pulley d1. See FIGS. 14 and 17. An opening 110 is provided through the floor aligned on the central axis of the recess through which the shaft of the motor M2 extends for connection to the pulley d1. The shafts of the motors M3 and M4 extend through the opening 110 for connection to the link L3 housing and the pulley d5 (not shown). The shaft (not shown) of the motor M1 connects to the housing 104. A recess 112 is provided at the distal end in the housing 104 for the components of the pulleys d2 and d3. In the embodiment shown, the pulleys d1 and d2 have a diameter ratio of 1:1. The belt t1 extends between the two pulleys d1 and d2 within the housing 104, in channels 114 in the embodiment shown.

An outer link 116 similarly includes a housing 118, which may have a separate cover plate 120. An opening 122 is formed in the proximal end of the housing 118 for passage of the components of pulley d3. See FIGS. 13, 16, and 18. A recess 124 is formed at the distal end in the housing 118 for the components of the pulley d4. As indicated more particularly in FIGS. 17 and 18, the pulleys d1, d2, d3, and d4 are formed of various components, such as bearings, as would be known by those of skill in the art.

In the embodiment shown, the belts t1 and t2 are each formed as a two-piece metal band. See FIGS. 16 and 17. The pieces are connected in any suitable manner, as with screws, to their respective pulleys. One piece pulls on a respective pulley during rotation in one direction, while the other piece pulls on the other pulley during rotation in the opposite direction. The belts may also be, for example, timing belts having teeth that grip corresponding surfaces on the pulleys. For semiconductor applications, however, a two-piece metal band formed of stainless steel or another high alloy steel is preferred, as it generates fewer particles.

It will be appreciated that the motion of the limbs in the above-described embodiment must be coordinated so that the elbow joints do not collide. Such coordination can be readily accomplished by a suitably programmed controller.

Figure 19:
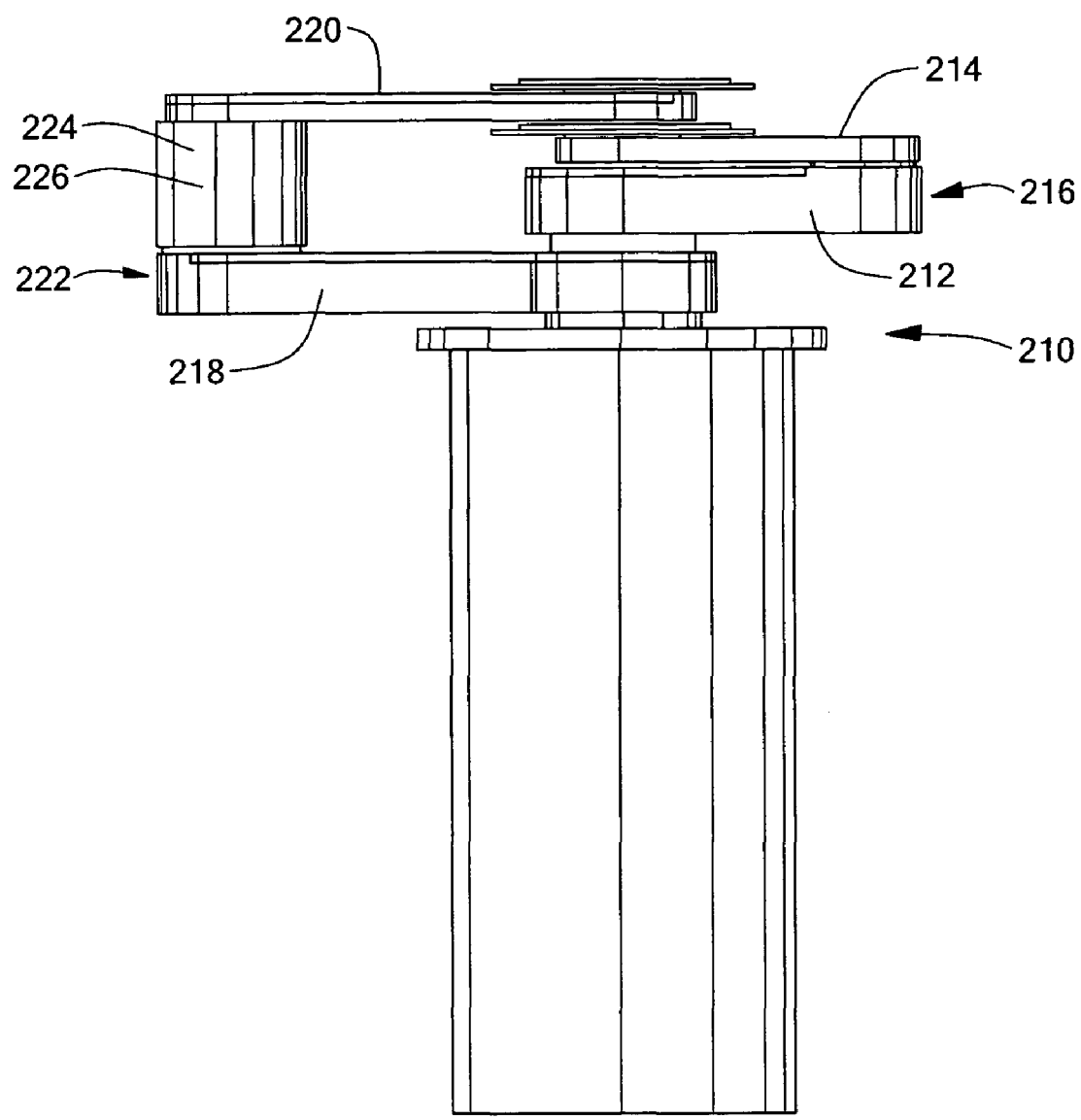
FIG. 19 is a side view of a further embodiment of a dual arm robot having limbs of different length providing a total of four degrees of freedom (4 DOF)
Figure 20:
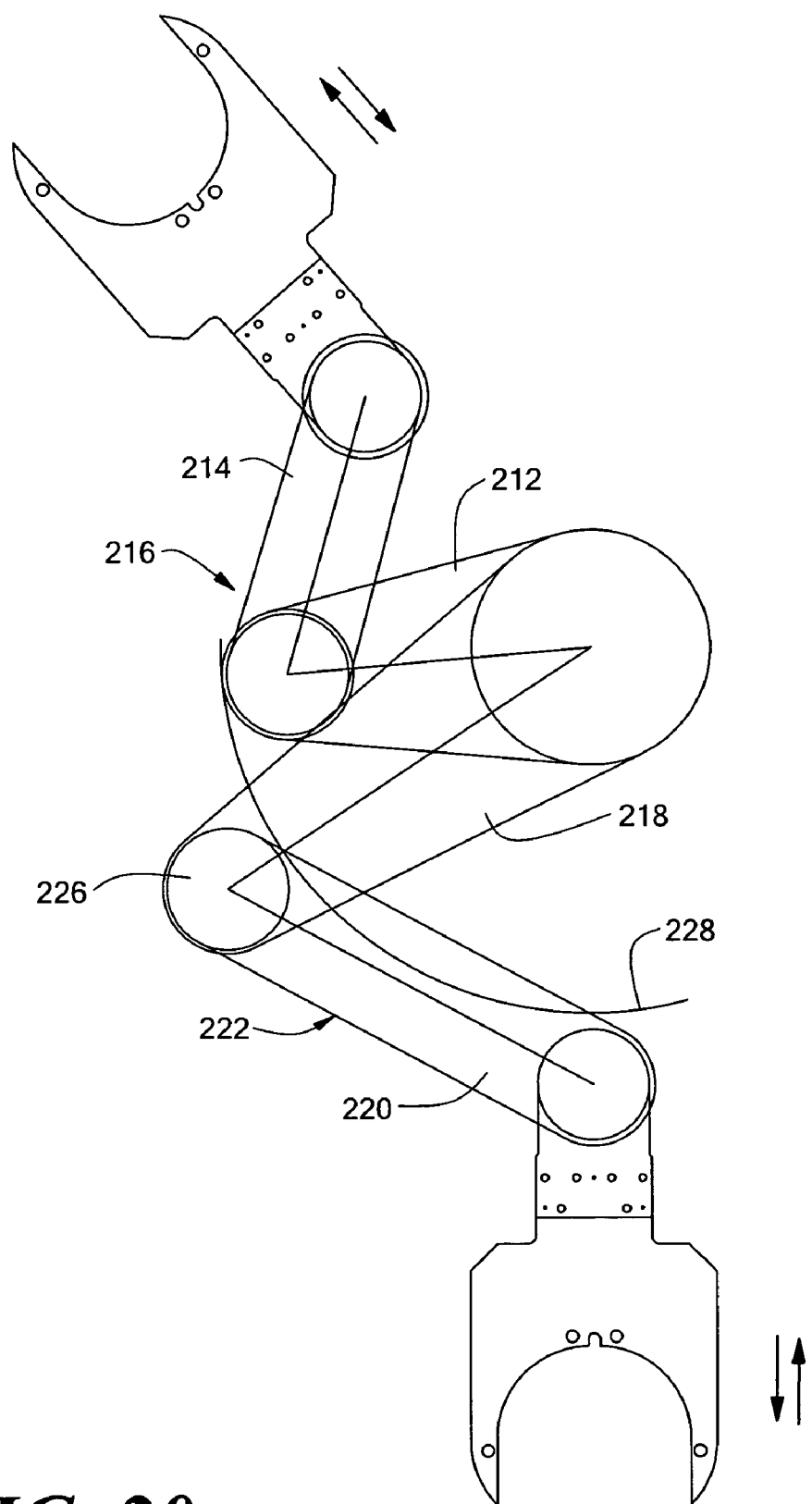
FIG. 20 is a top plan view of the robot of FIG. 19.

The possibility of such a collision can be avoided by a further embodiment of the present invention, illustrated in FIGS. 19 and 20. In the robot assembly 210 of this embodiment, the inner and outer links 212, 214 of one limb 216 are shorter than the inner and outer links 218, 220 of the other limb 222 by an amount equal to or greater than the diameter of the elbow rotary joint 224 of the longer limb 222. The spacer 226 at the elbow joint 224 is located in the longer limb 222. In this manner, the rotary joints of the two limbs cannot collide, as indicated by the path 228 in FIG. 20.

The present invention also provides a three-degree-of-freedom system, in which the inner links of the two arms of the robot assembly are coupled at the shoulder joint such that rotation of both arms about the axis of the central column is coupled. Rotation of both arms is actuated by a single actuator. A second and a third actuator are provided for extension of the arms. This configuration also prevents collision of the elbow joints.

Figure 21:
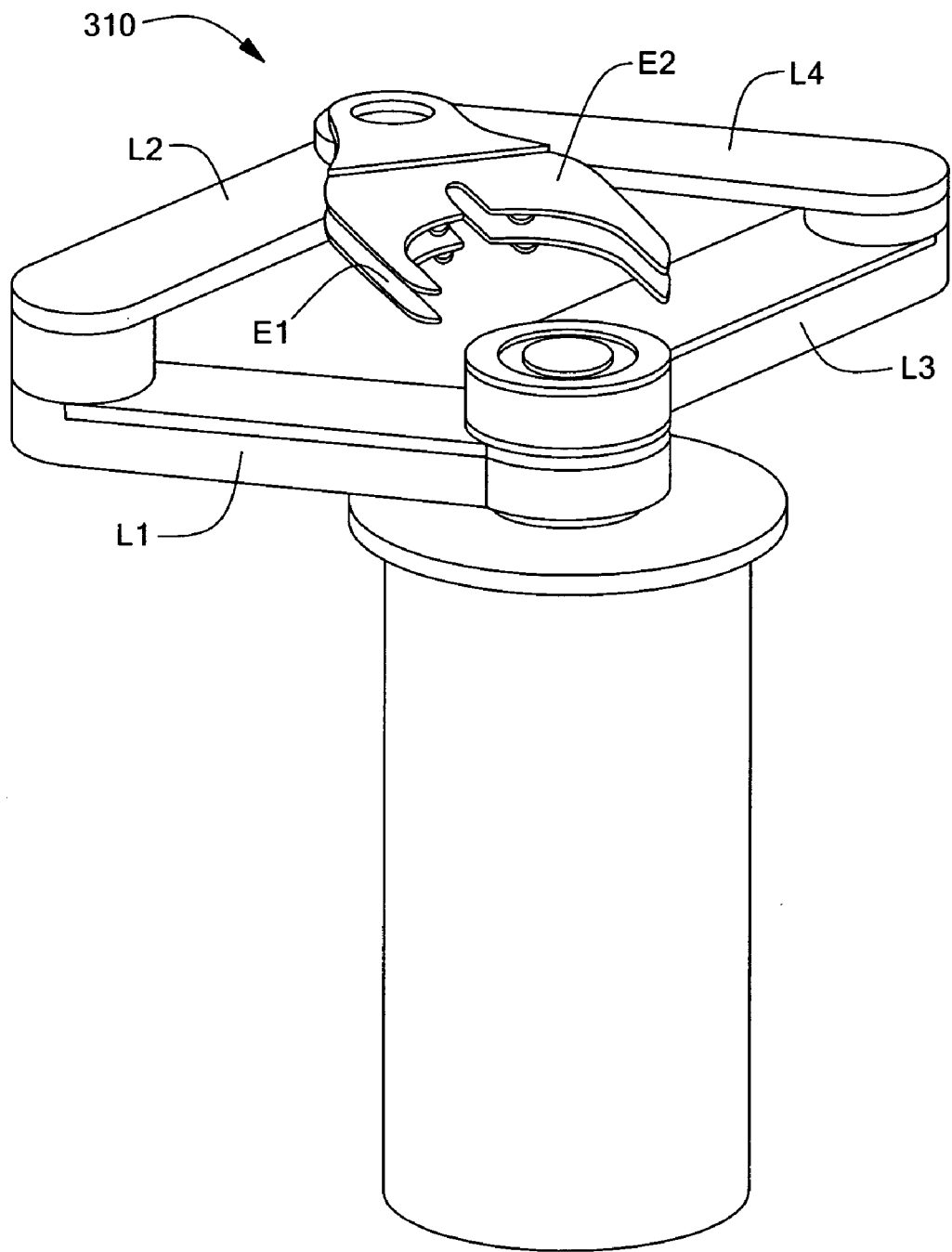
FIG. 21 is an isometric view of a dual arm robot having two limbs providing a total of three degrees of freedom (3 DOF) and having co-directional end effector mounting flanges.
Figure 22:
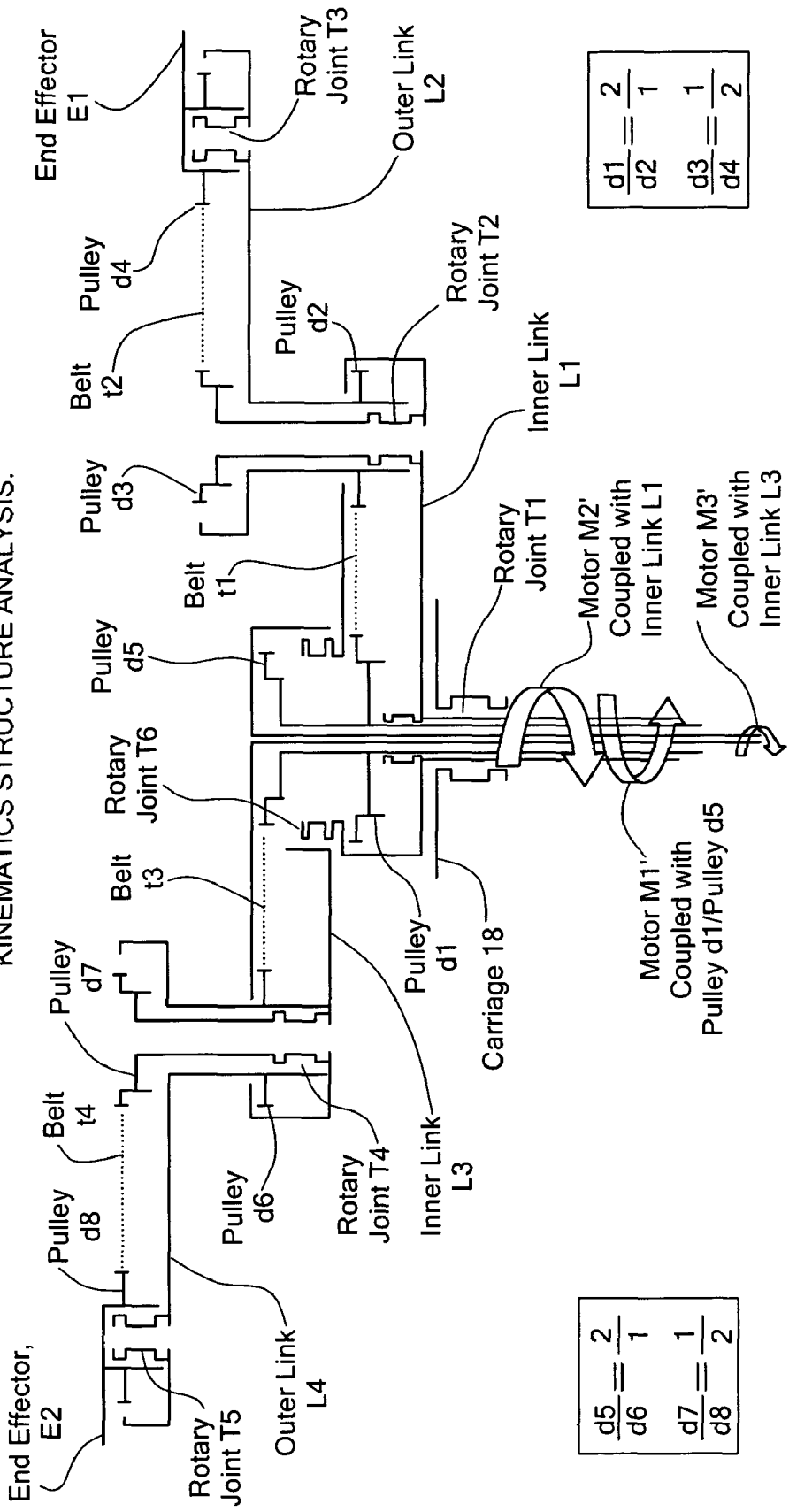
FIG. 22 is a kinematic diagram of the robot of FIG. 21.

FIGS. 21 and 22 illustrate an embodiment of a three-degree-of-freedom robot assembly 310. In this embodiment, the end effector mounting flanges E1, E2 are oriented in the same direction. The links L1 through L4, E1, E2, and the joints T1 through T6 are embodied with the same pulleys d1 through d8 and belts t1 through t4 as described above, and the same reference designations are, accordingly, used for these elements. The pulleys d1 and d5 are, however, coupled on a single shaft to a motor M1'. Thus, rotation of the motor M1' results in rotation of both pulleys d1 and d5 simultaneously. A motor M2' is coupled with the inner link L1, and a motor M3' is coupled with the inner link L3. Thus, the inner links L1 and L3 are independently actuatable to extend and retract the end effector mounting flanges E1 and E2 respectively.

Figure 24A:
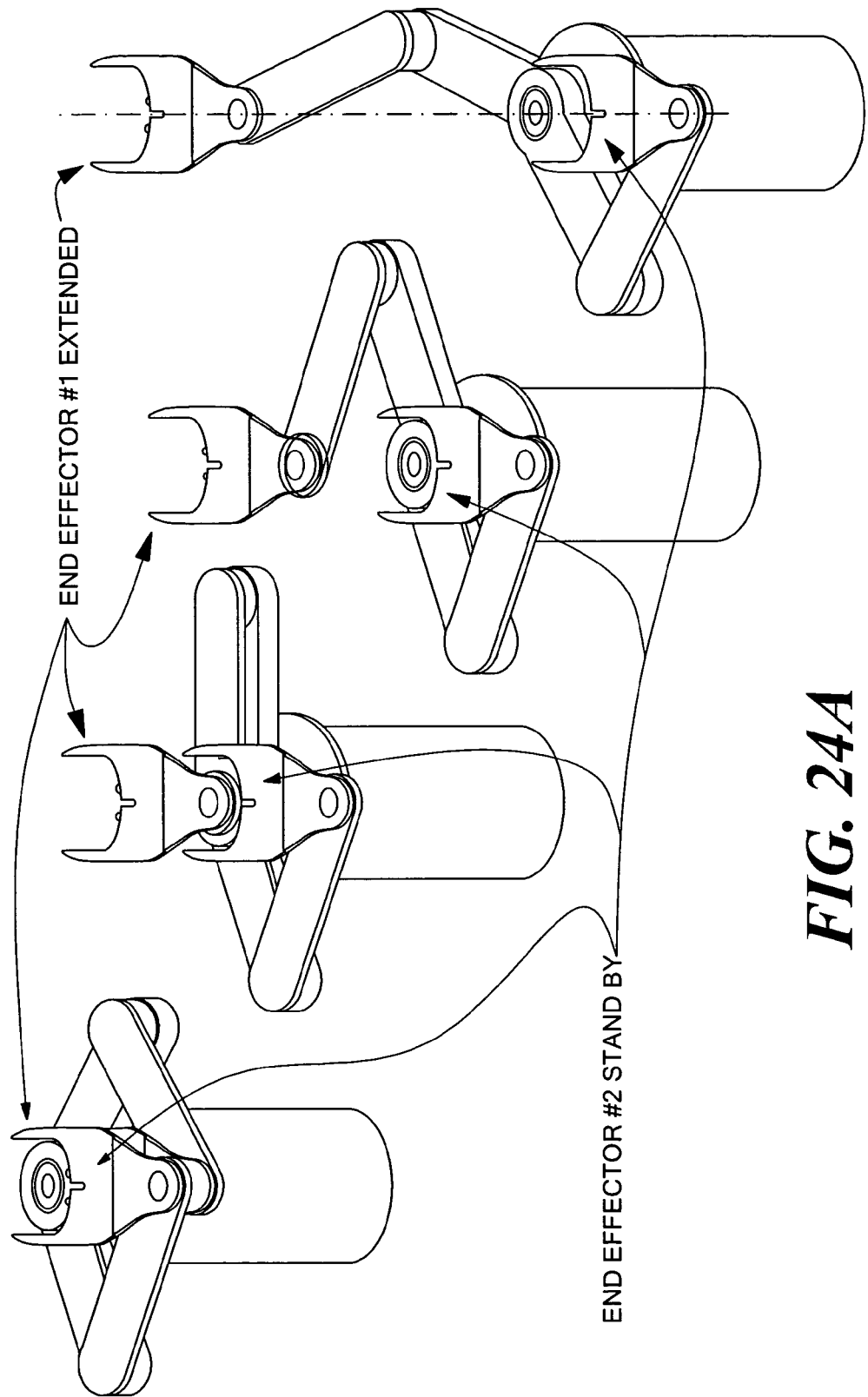
FIG. 24A is a diagram of a sequence of motions of one of the end effector mounting flanges of the robot of FIG. 21.
Figure 24B:
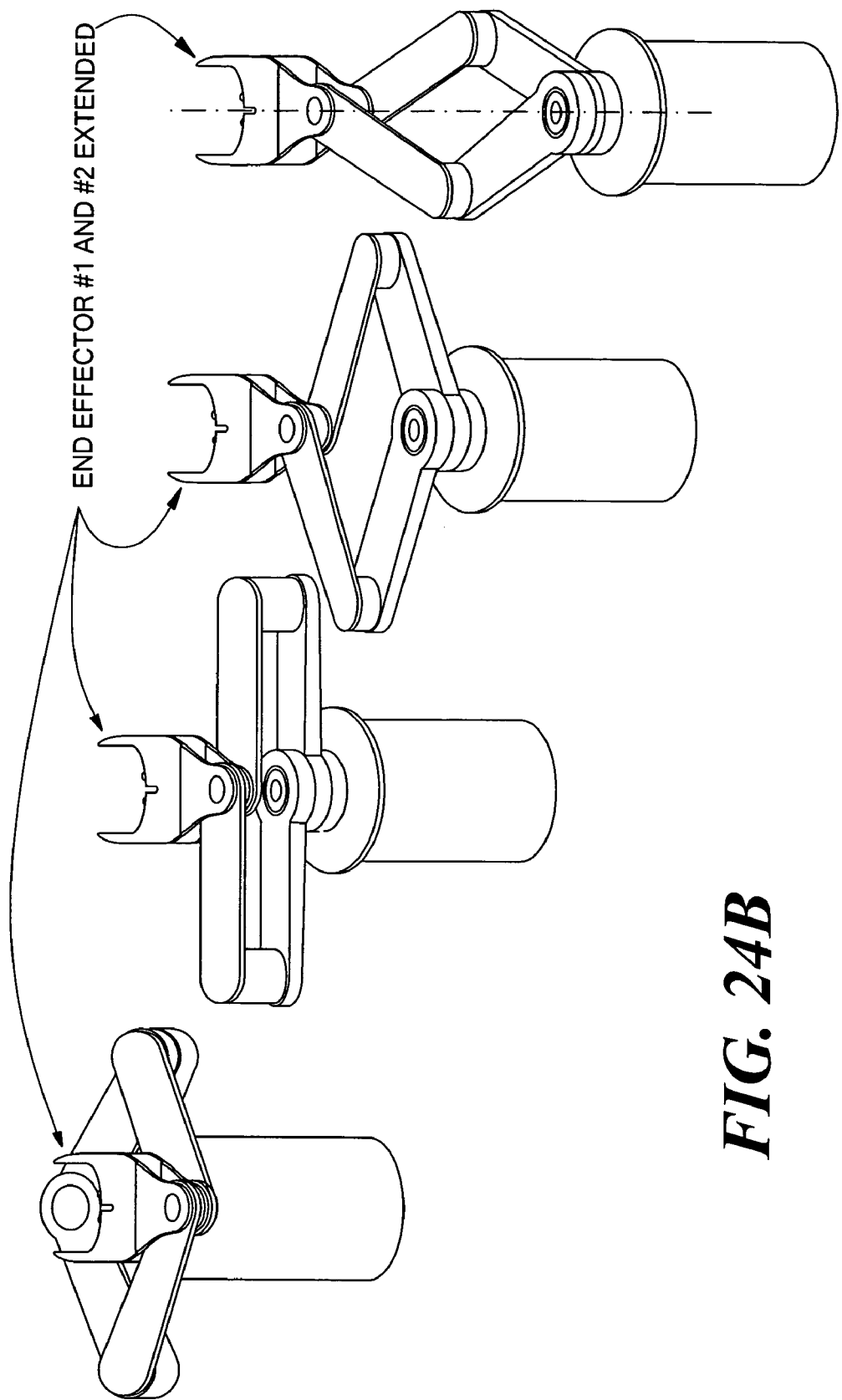
FIG. 24B is a diagram of a sequence of simultaneous motions of two end effector mounting flanges of the robot of FIG. 21.

In FIG. 22, the ratio of the diameters of the pulleys d1:d2 and d5:d6 is 2:1. The ratio of the diameters of the pulleys d3:d4 and d7:d8 is 1:2. A table of the motions of the end effector mounting flanges in this embodiment is set forth in FIG. 23. For example, to extend the end effector mounting flange E1, the motor M2' connected to the inner link L1 is actuated to rotate counterclockwise, while the motors M1' and M3' are maintained in a standfast mode. Retraction of the end effector mounting flange E1 is caused by rotation of the motor M2' clockwise. Similarly, to extend the end effector mounting flange E2, the motor M3' connected to the inner link L3 is actuated to rotate clockwise, while the motors M1' and M2' maintain a standfast mode. To change the orientation of the end effectors, all three motors are actuated. Rotation of all three motors counterclockwise causes both arms and the end effectors to rotate counterclockwise. Similarly, rotation of all three motors clockwise causes both arms and the end effectors to rotate clockwise. Note that rotation of the motor M1' alone would also cause extension or retraction of the end effectors. Thus, to change the orientation of the end effectors without extension or retraction thereof requires actuation of all three motors. FIG. 24A illustrates an extension sequence of one end effector mounting flange independently of motion of the other end effector mounting flange. FIG. 24B illustrates a sequence of simultaneous motions of both end effector mounting flanges.

Figure 25:
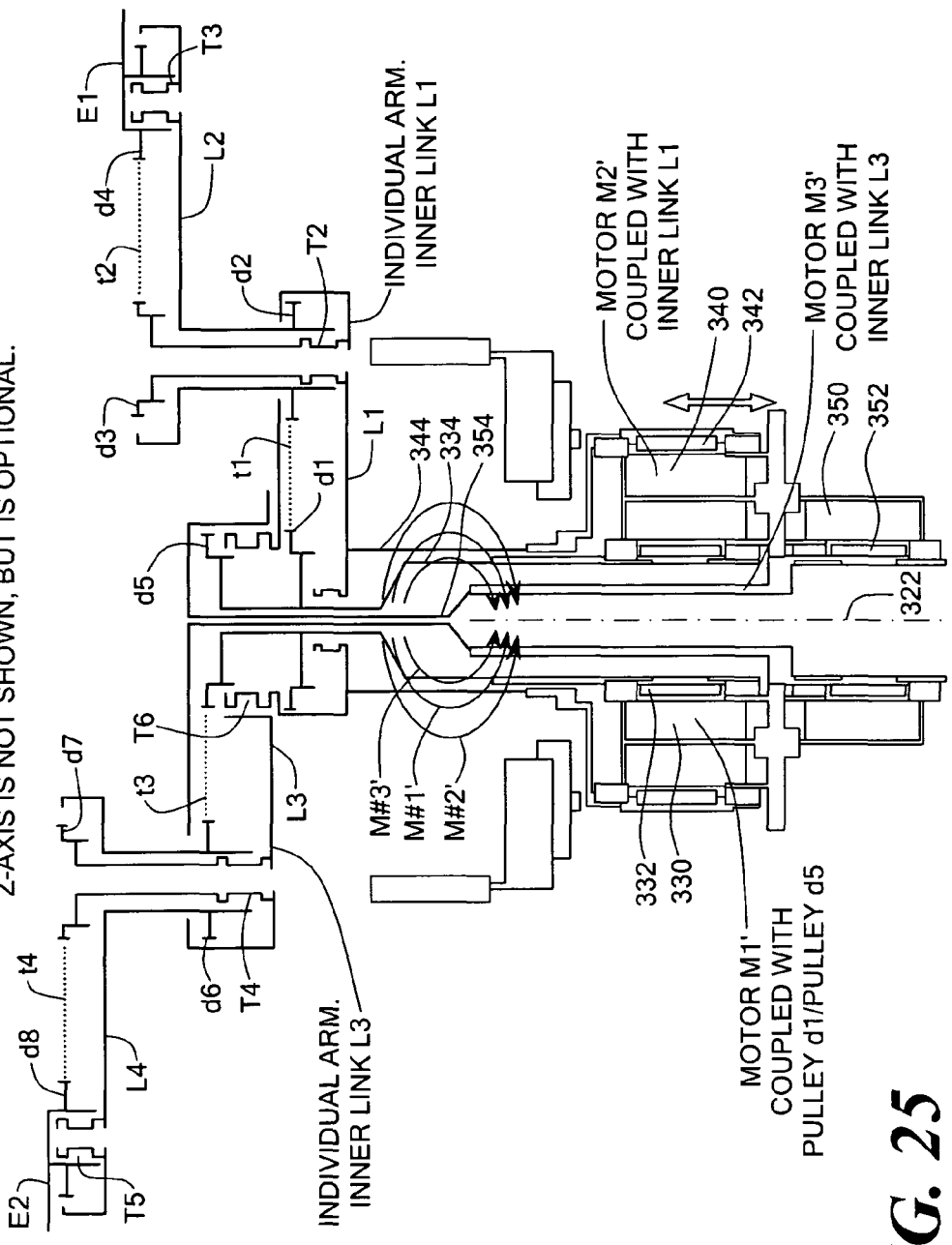
FIG. 25 is a schematic diagram of an actuator assembly of the robot of FIG. 21.

Referring to FIG. 25, the motor M1' includes a stator 330 and a rotor 332 concentrically surrounding the central axis 322 of the column. The rotor 332 is coupled to a hollow shaft 334 that extends upwardly to couple with the pulleys d1 and d5. The motor M2' includes a stator 340 and a rotor 342 concentrically surrounding the central axis 322 of the column and the motor M1'. The rotor 342 of the motor M2' is coupled to a hollow shaft 344 located concentrically outwardly of the shaft 334 of the motor M1' to couple with the inner link L1.

The motor M3' is located below the motors M1' and M2'. The motor M3' includes a stator 350 and a rotor 352 concentrically surrounding the central axis 322 of the column. The rotor 352 is coupled to a hollow shaft 354 that extends upwardly to couple with the inner link L3. The shaft 354 is located concentrically inwardly of the shafts 334, 344 of the motors M1' and M2'.

Figure 26:
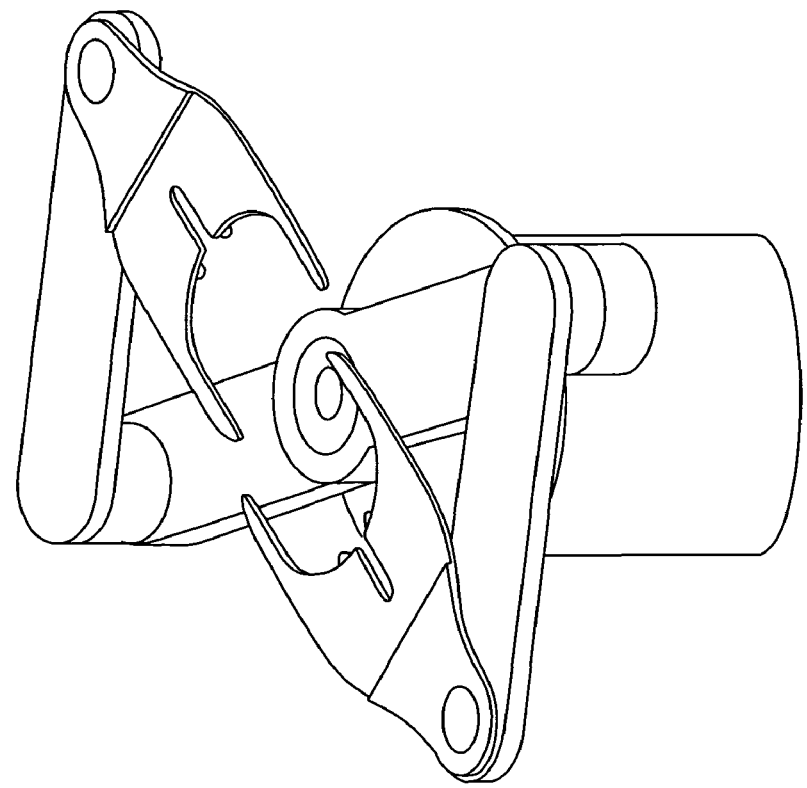
FIG. 26 is an isometric view of a dual arm robot having two limbs providing a total of three degrees of freedom (3 DOF) and having oppositely directed end effector mounting flanges.

In the above three-degree-of-freedom embodiment, the end effector mounting flanges are oriented in the same direction. The end effector mounting flanges may also be oriented to face in the opposite directions, as illustrated in FIG. 26. In this case, both motors M2' and M3' are rotated in the same direction, counterclockwise in the embodiment shown, to extend the end effector mounting flanges, as indicated in the table in FIG. 27.

Figure 28:
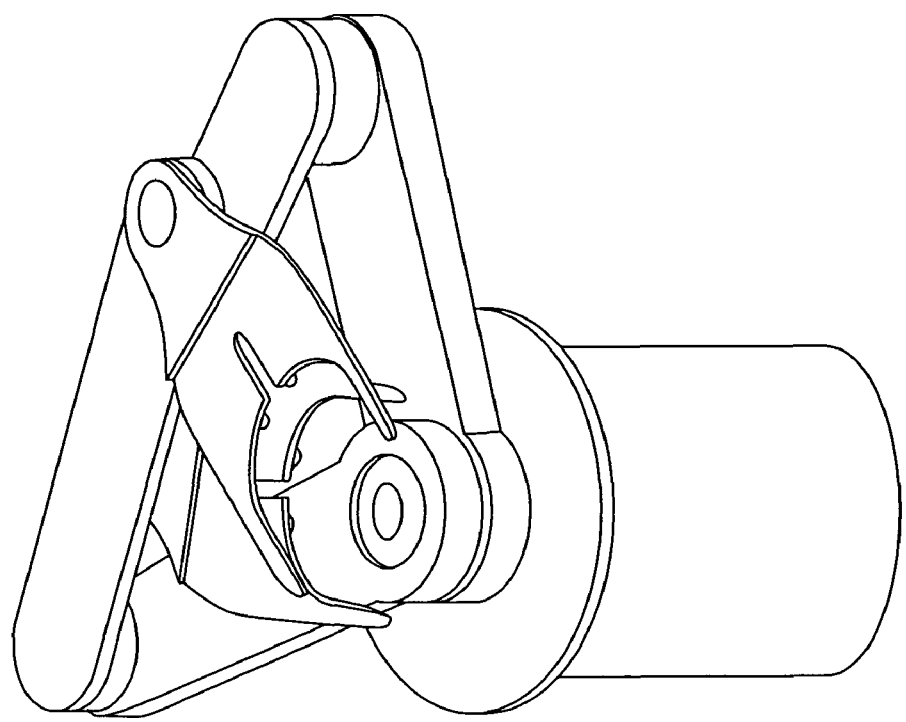
FIG. 28 is an isometric view of a dual arm robot having two limbs providing a total of three degrees of freedom (3 DOF) and having acutely angled end effectors.

In a further embodiment, the end effector mounting flanges can be oriented at an acute angle to each other. See FIG. 28. The extension, retraction, and rotation motions of the end effector mounting flanges are the same as set forth above with respect to the co-directional three-degree-of-freedom system in the table in FIG. 23.

Figure 30:
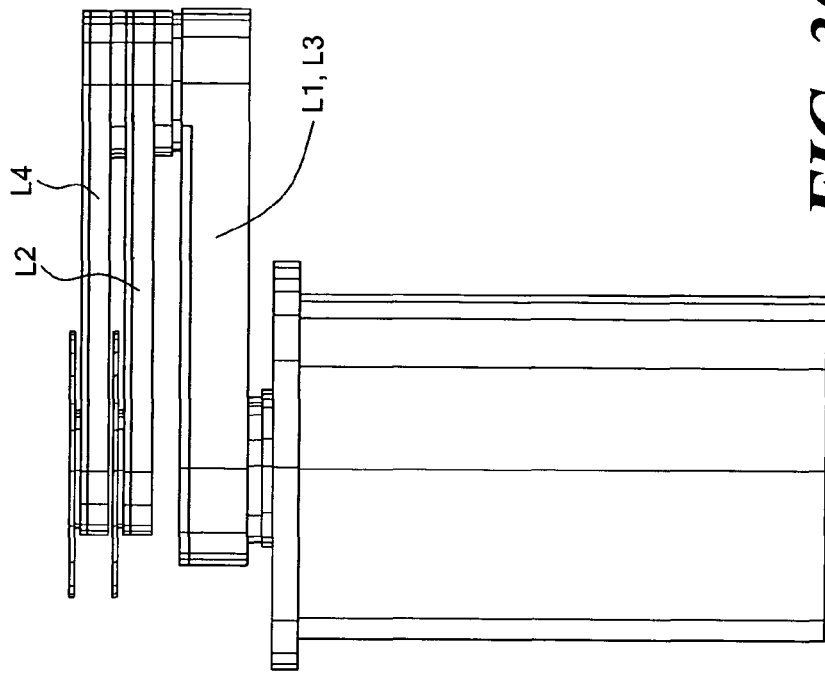
FIG. 30 is a side view of the robot of FIG. 29.
Figure 29:
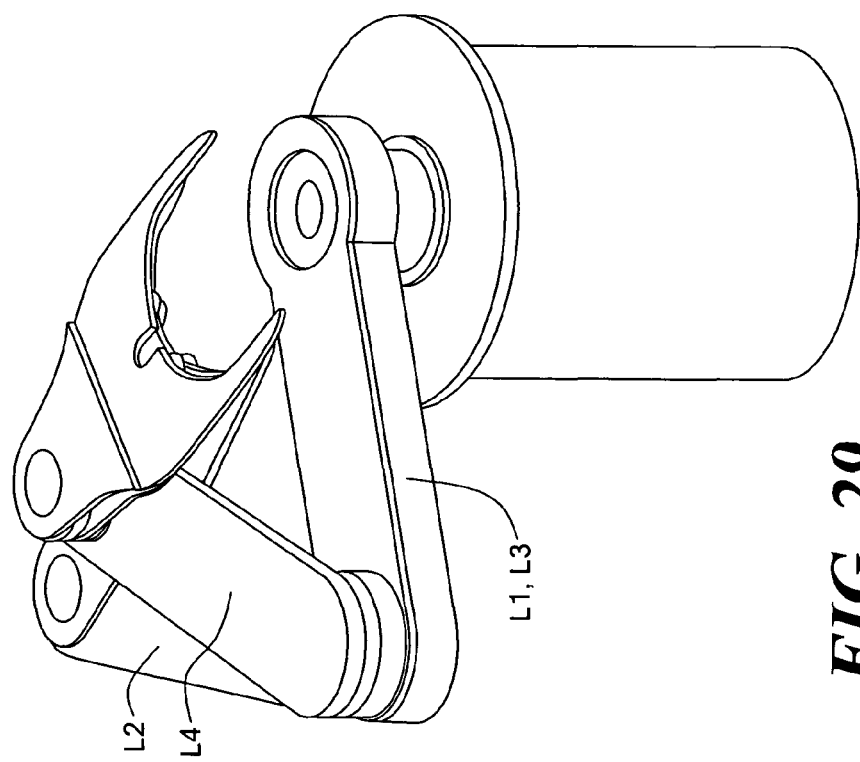
FIG. 29 is an isometric view of a dual arm robot having two limbs and providing a total of three degrees of freedom (3 DOF) and having aligned inner links combined within one housing.
Figure 33:
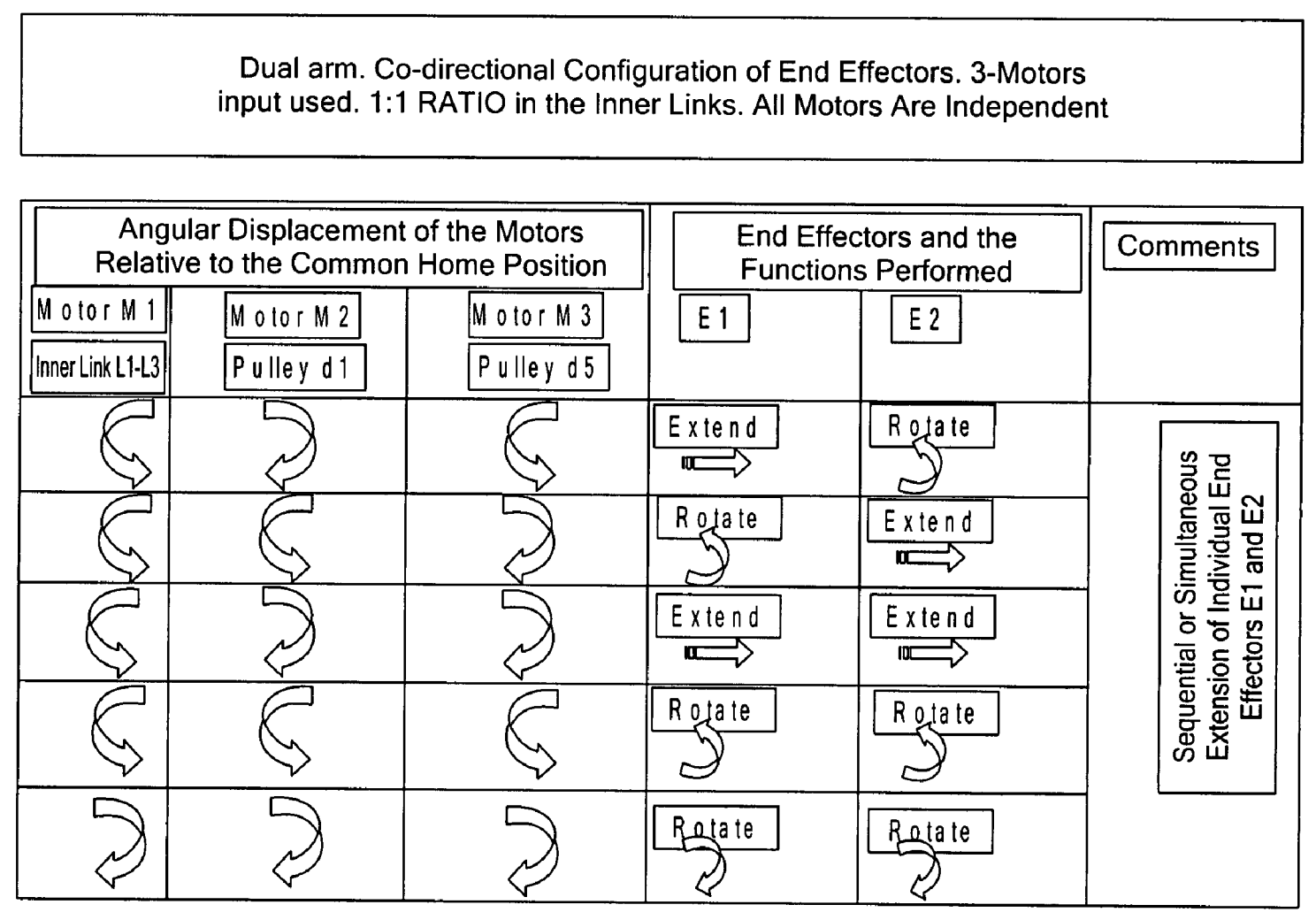
Figure 33A:
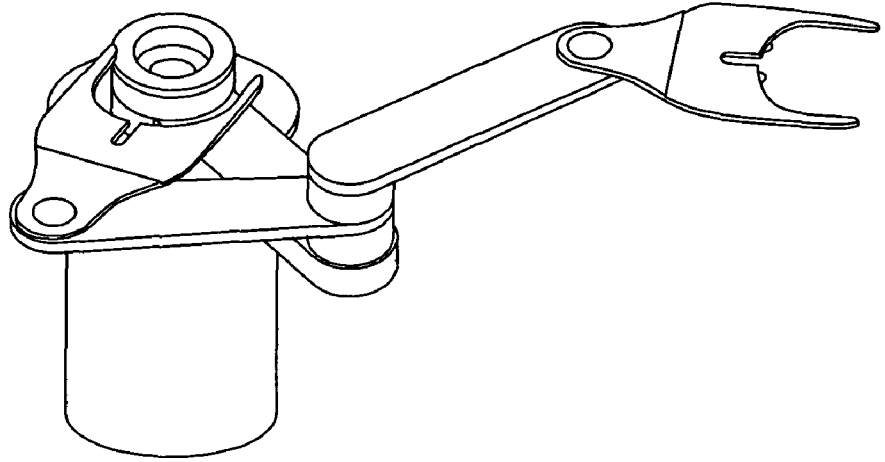
FIGS. 33A and 33B illustrate extensions of one end effector of the robot of FIG. 29.
Figure 33B:
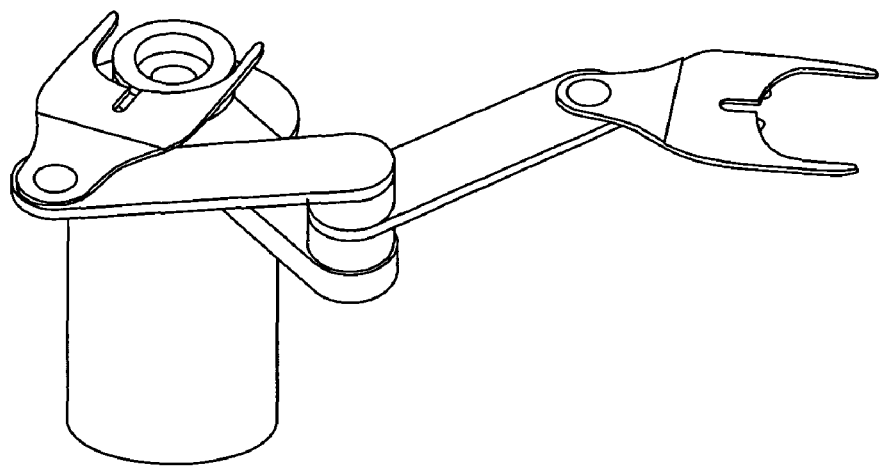
Figure 33C:
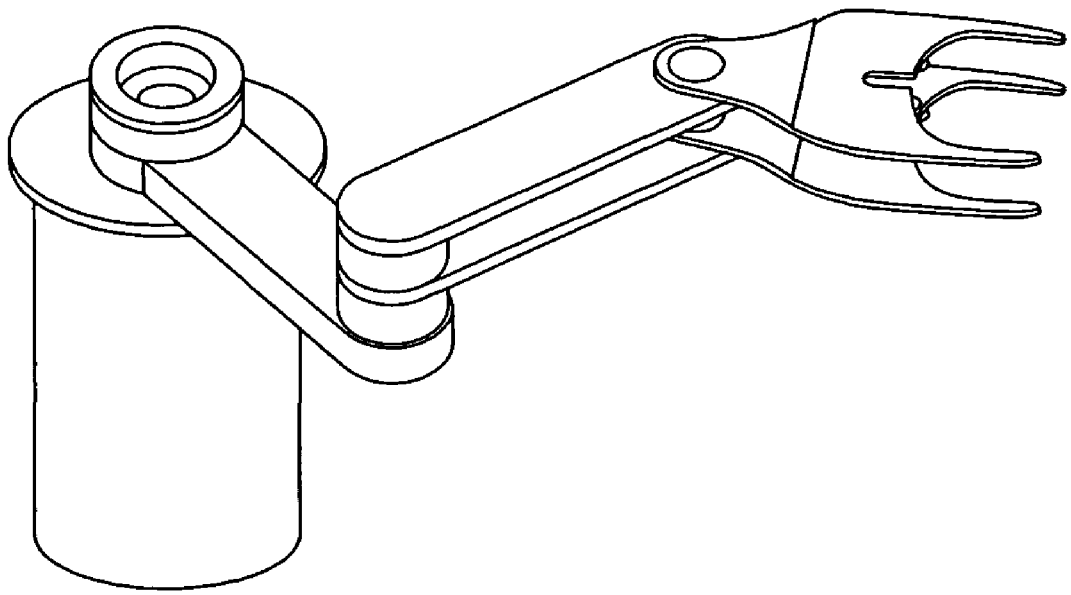
FIG. 33C illustrates extension of both end effectors of the robot of FIG. 29.
Figure 34:
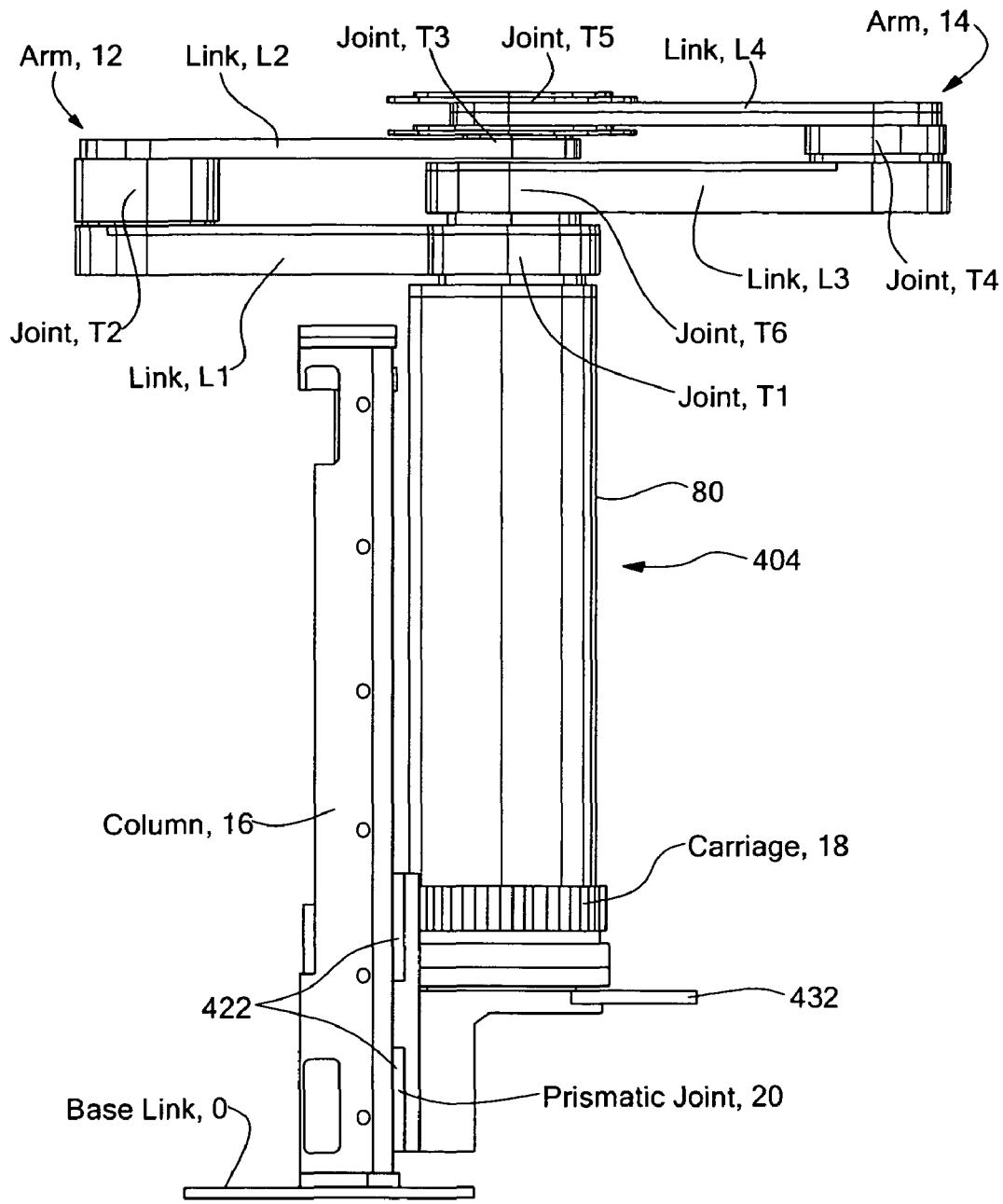
FIG. 34 is a side view illustrating integration of the arms of the robot of FIG. 2 with the carriage for vertical motion.
Figure 35:
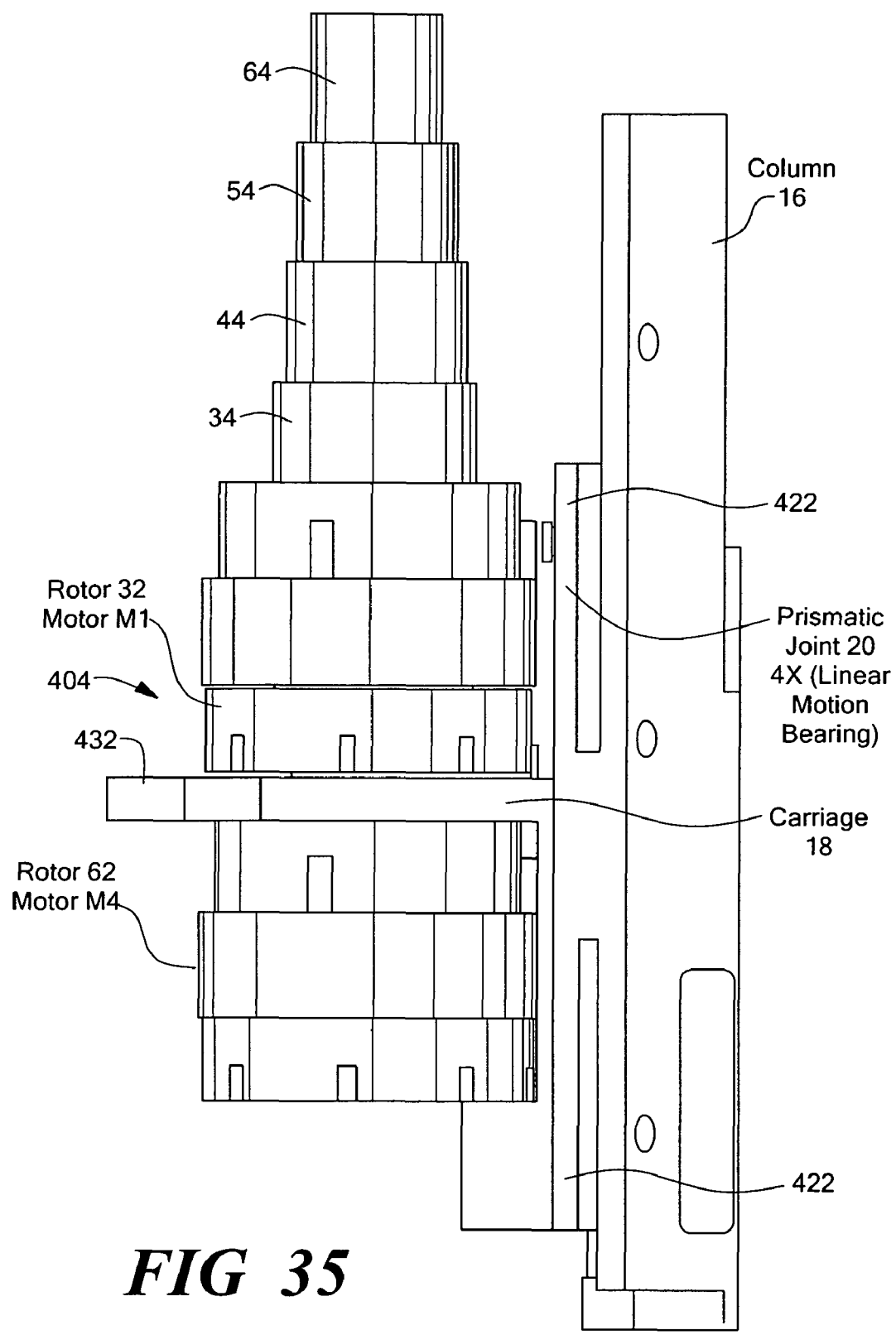
FIG. 35 is a side view of a motor stack mounted on the carriage assembled with a prismatic joint onto the column of the robot of FIG. 2.
Figure 36:
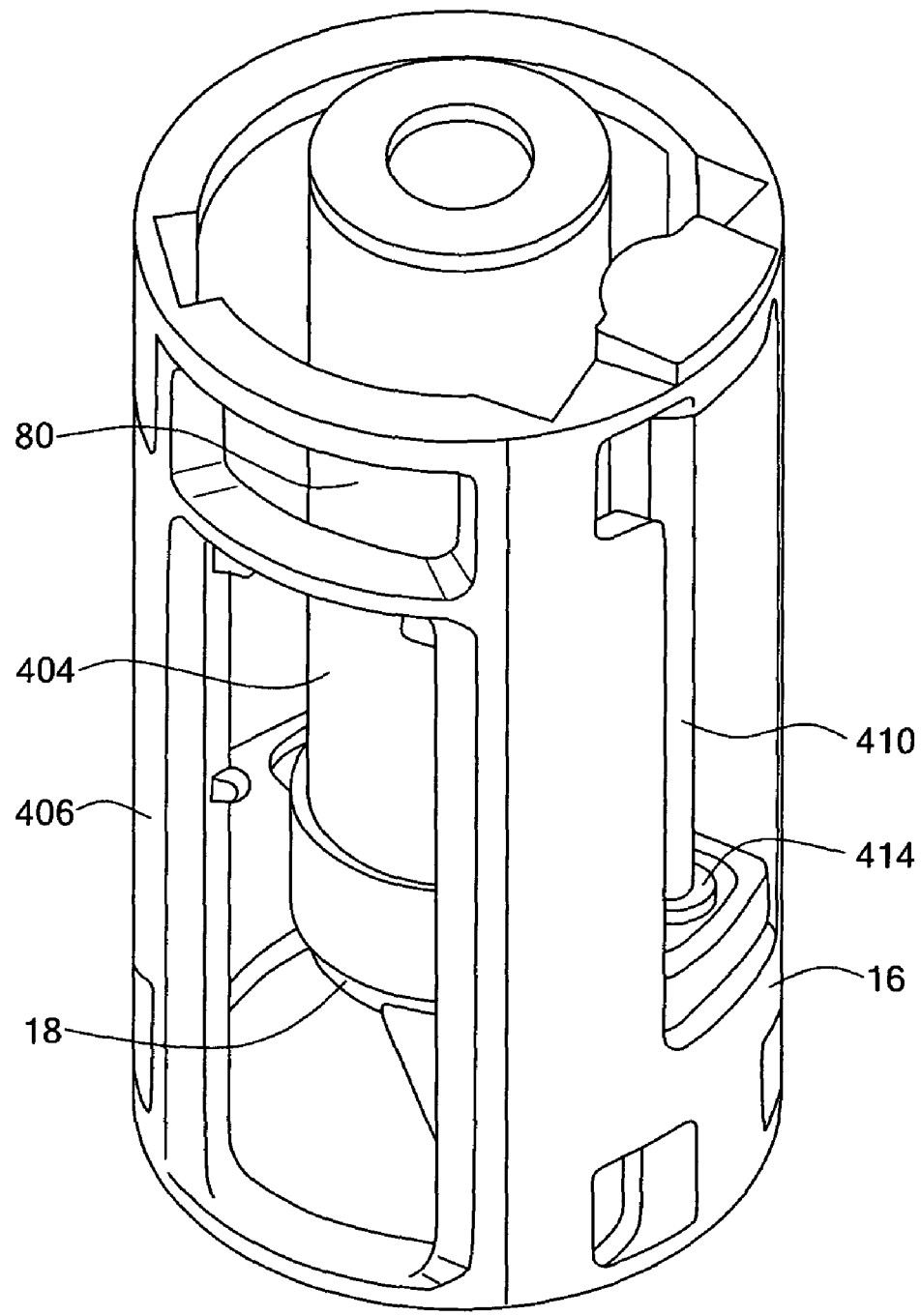
FIG. 36 is a partial isometric view of a linear vertical motion system integrating the column and the prismatic joint linkage into the body of the robot of FIG. 2.
Figure 37:
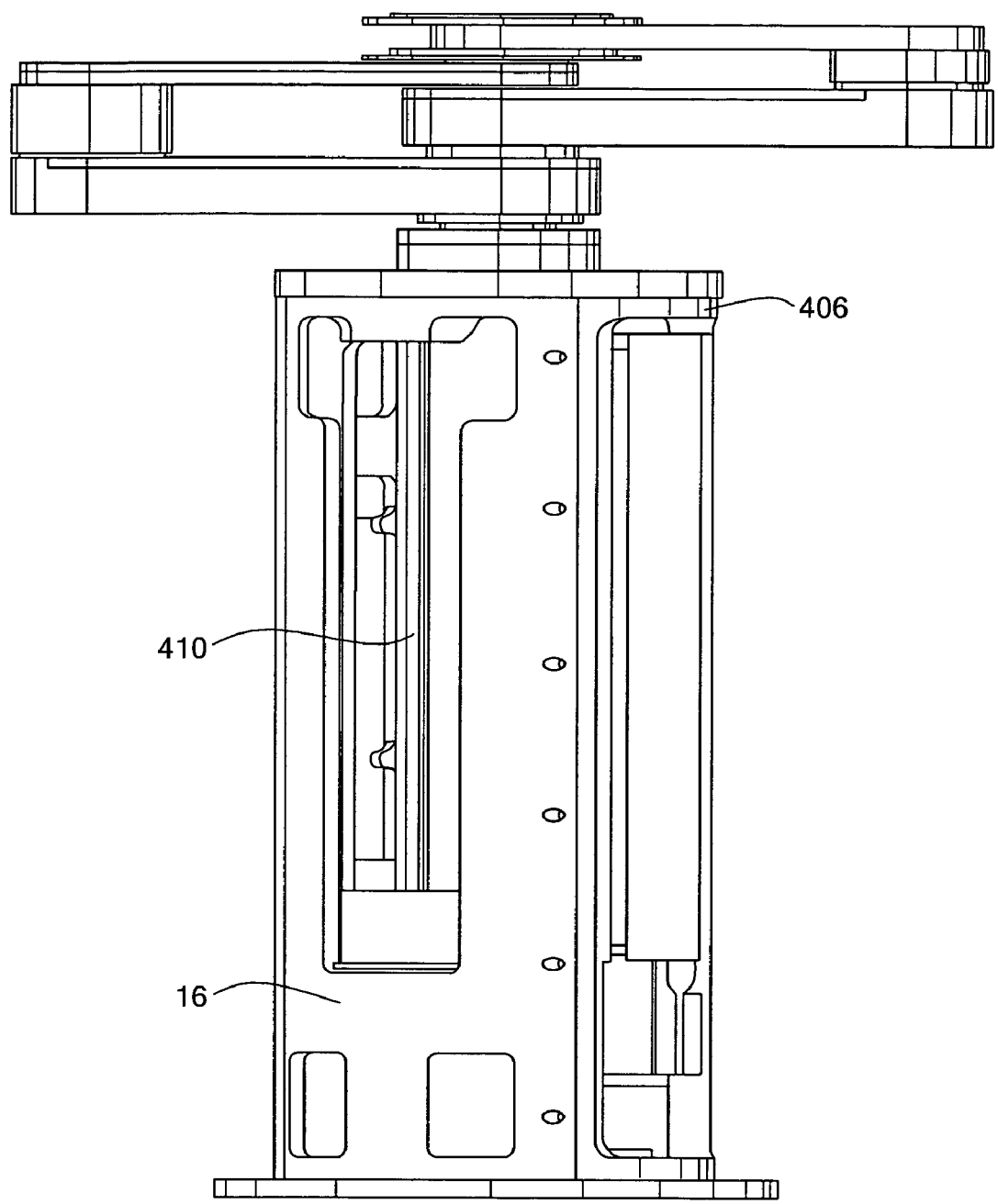
FIG. 37 is a side view illustrating integration of the arms of the robot of FIG. 2 with the body of the robot.

In a still further embodiment, illustrated in FIGS. 29-31, the inner links L1, L3 are aligned and disposed in a single inner link housing. The outer links L2, L4 are mounted co-axially on the inner links at elbow joints T2, T4. The inner link housing is mounted for rotation about a rotary joint T1 on a shaft of motor M1". Within the inner link housing, belt t1 is connected to pulley d1 and pulley d2, and belt t3 is connected to pulley d5 and pulley d6. Motor M2" is coupled with the outer link L2 via the pulley d1. Motor M3" is coupled with the outer link L4 via the pulley d5. For the configuration in which the diameter ratio of the inner pulleys d1:d2 and d5:d6 is 2:1, movements of the end effector mounting flanges are as set forth in the table in FIG. 32. For the configuration in which the diameter ratio of the inner pulleys d1:d2 and d5:d6 is 1:1, movements of the end effector mounting flanges are as set forth in the table in FIG. 33.

FIGS. 34-45 illustrate an embodiment for providing vertical motion of the arm assemblies. The motors, preferably enclosed in a housing 80, form a motor stack 404 that is supported on the carriage 18. The motor stack and carriage are mounted to the column 16 for vertical motion with respect to the column. A protective cage 406 is preferably cooperatively mounted to the column to fully enclose the carriage. See FIG. 36. In the final assembly, an outer covering (not shown) is also placed around the entire assembly to enclose the vertical motion assembly.

The column 16 supports an externally threaded rotatable lead screw 410 and a Z-axis actuator 412 to effect rotation of the lead screw. An internally threaded nut 414 is fixed to the carriage 18 and is disposed on the lead screw 410 such that rotation of the lead screw causes vertical translation of the nut 414 and the carriage 18. Two vertically extending linear guide rails 418 are mounted on the column 16. Linear bearings 422, forming the prismatic joint 20, are fixed to the carriage and engage with the linear guide rails for vertical travel along the guide rails. In this manner, the carriage, with the robot arms 12, 14 mounted thereon as discussed above, is able to travel vertically.

Figure 38:
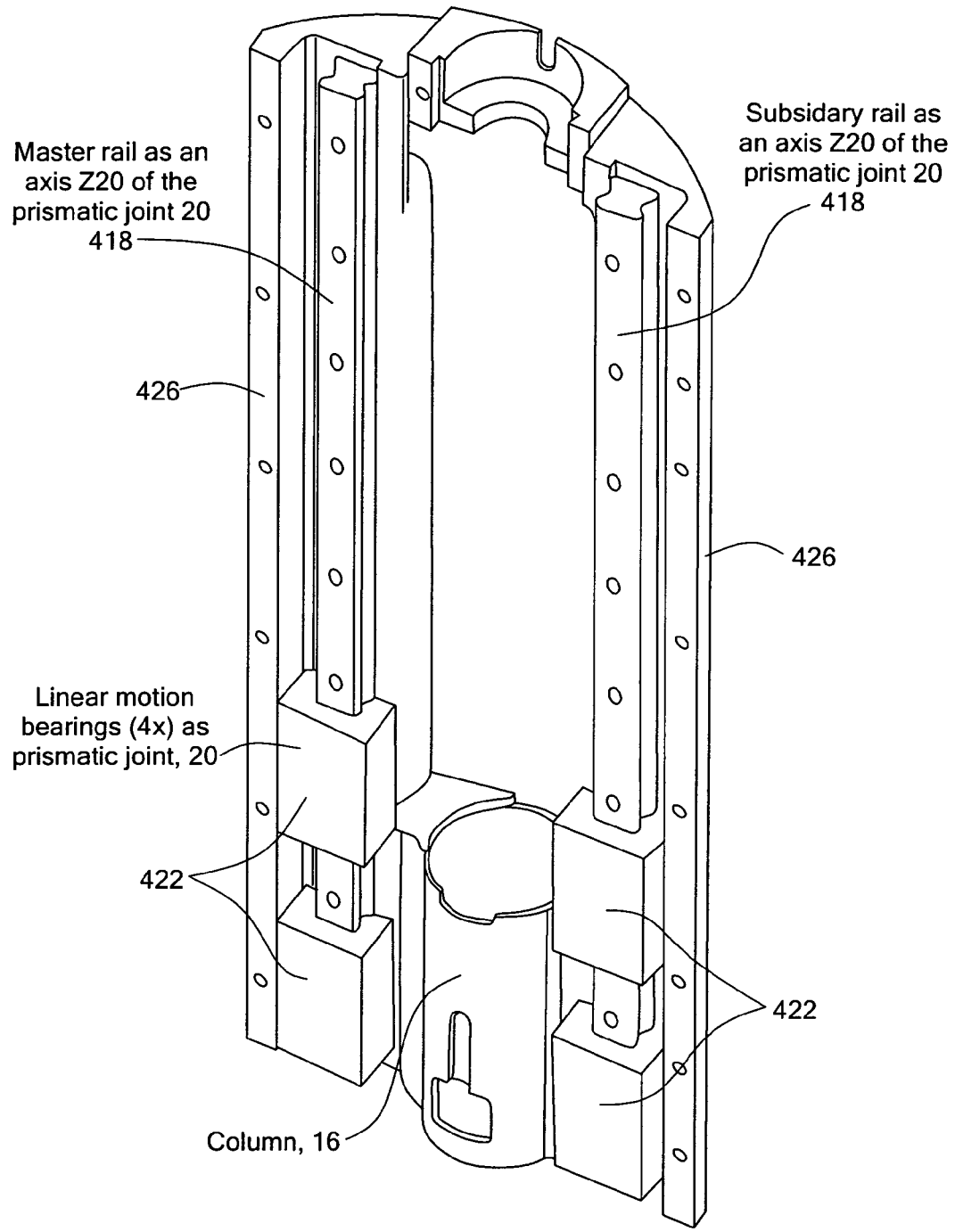
FIG. 38 is an isometric view of the column of the robot of FIG. 2 further illustrating the vertical prismatic joint.

More particularly, referring to FIG. 38, the column 16 includes two vertically extending side pieces 426 to which the two linear rails 418, a master rail and a subsidiary rail, are fixed. The two rails are parallel to the vertical axis Z20 of the prismatic joint. For illustrative purposes, four linear motion bearings 422 are illustrated in FIG. 38. It will be appreciated, however, that the bearings are fixedly attached to the carriage 18 and are able to travel vertically along the rails 418.

Figure 39:
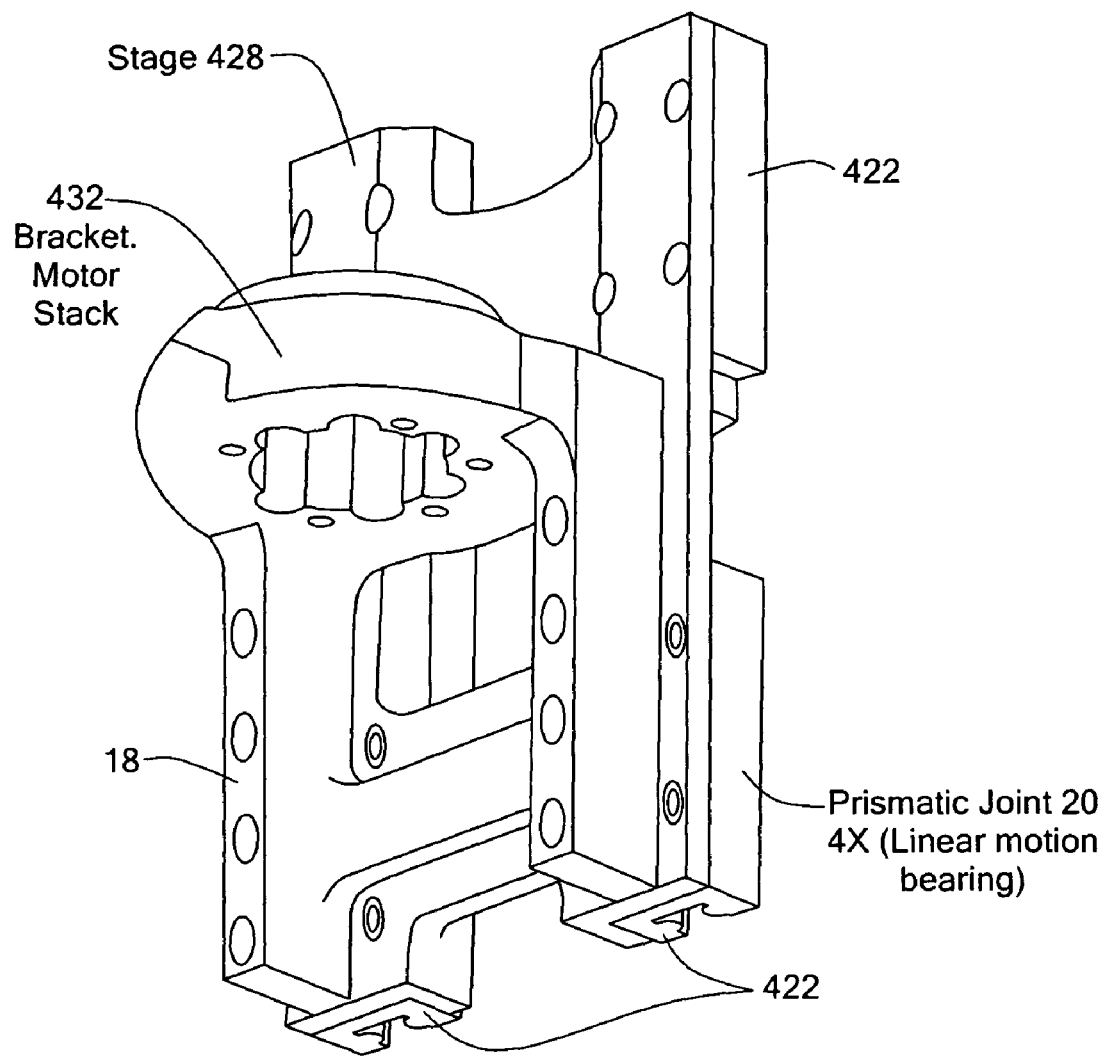
FIG. 39 is an isometric view of the carriage and linear motion bearings forming the vertical prismatic joint of the robot of FIG. 2.
Figure 40:
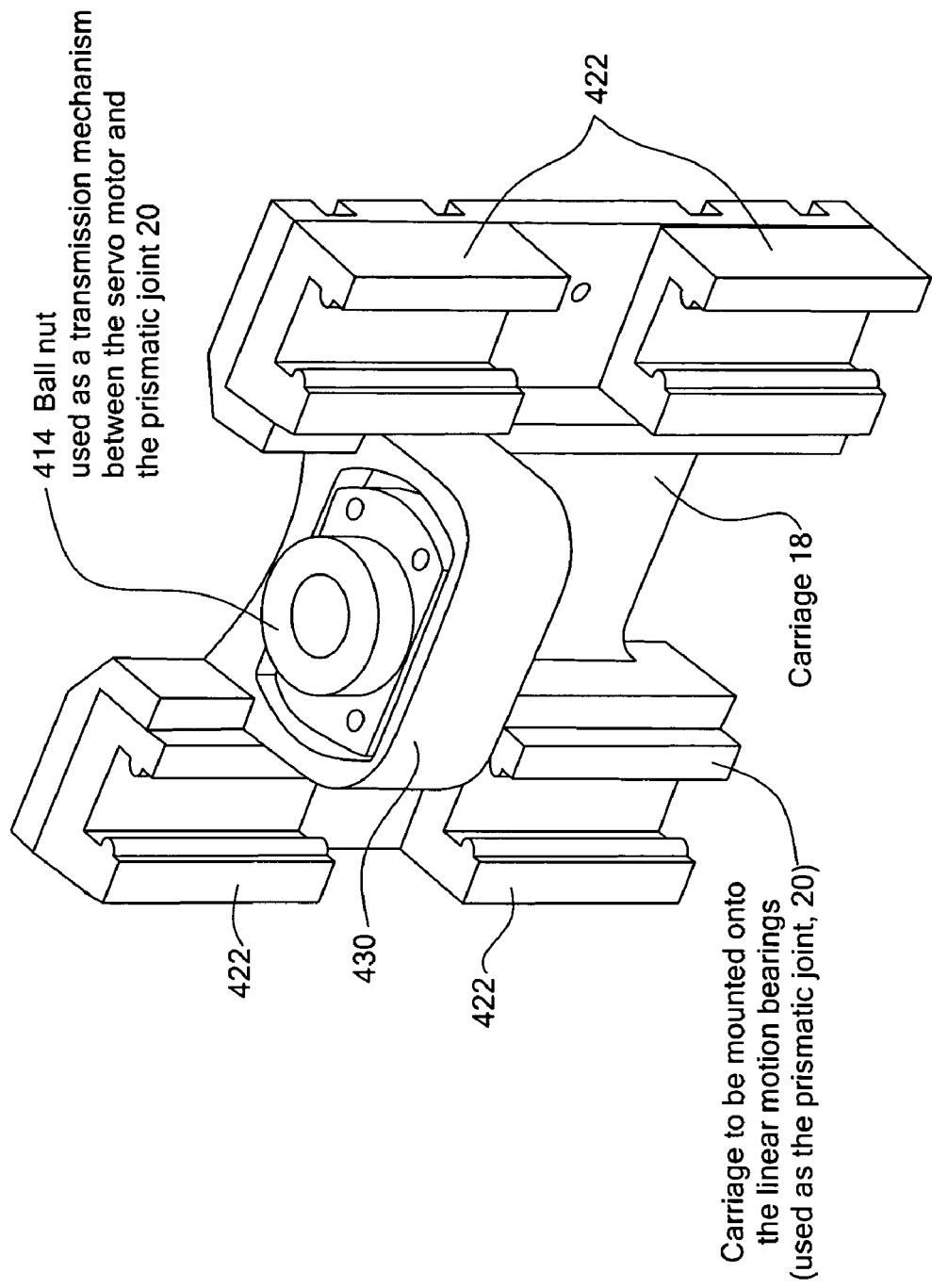
FIG. 40 is a further isometric view of the carriage and linear motion bearings forming the vertical prismatic joint of the robot of FIG. 2.
Figure 41:
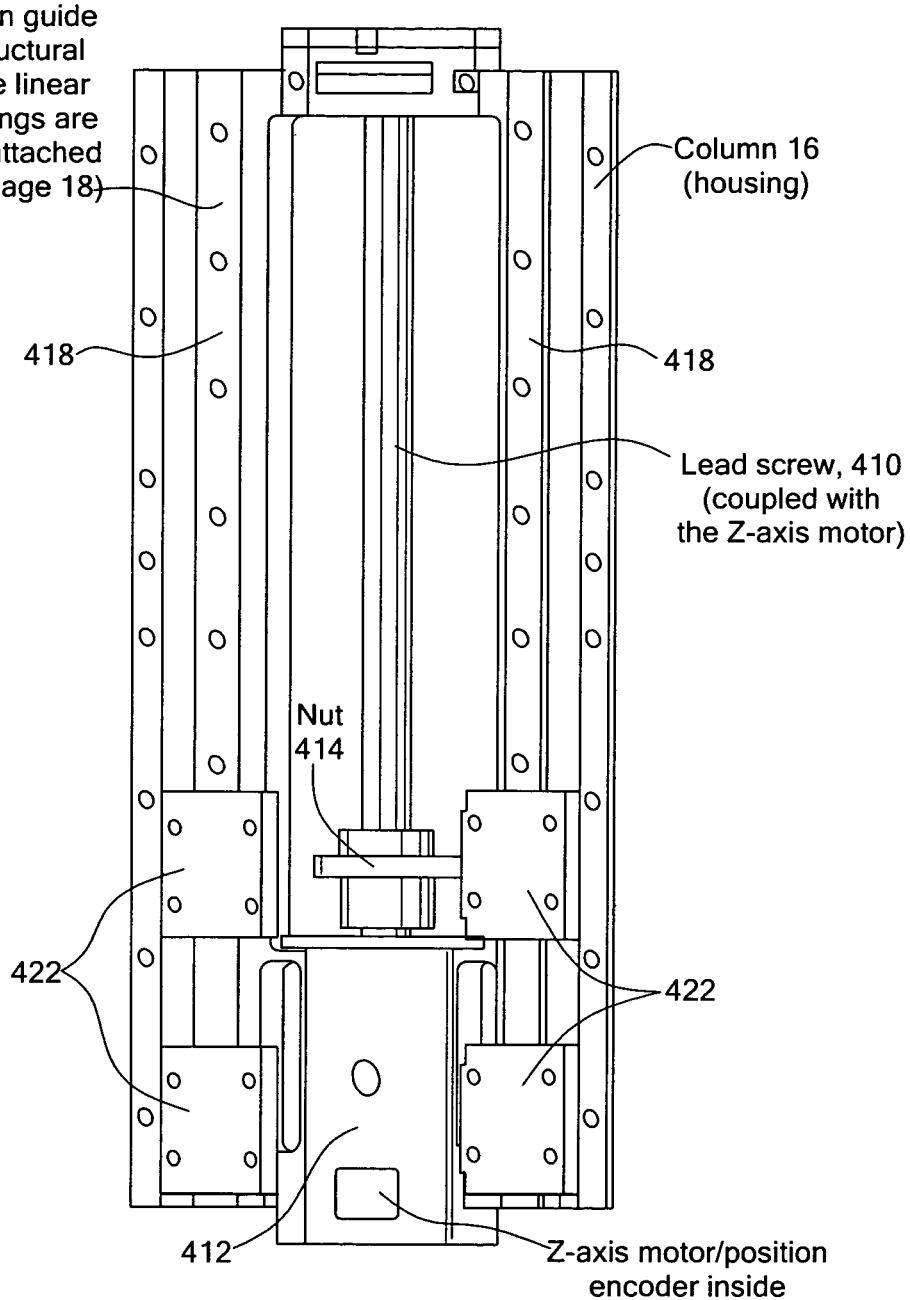
FIG. 41 is a side view of column with prismatic joint and Z-axis actuator of the robot of FIG. 2.
Figure 42:
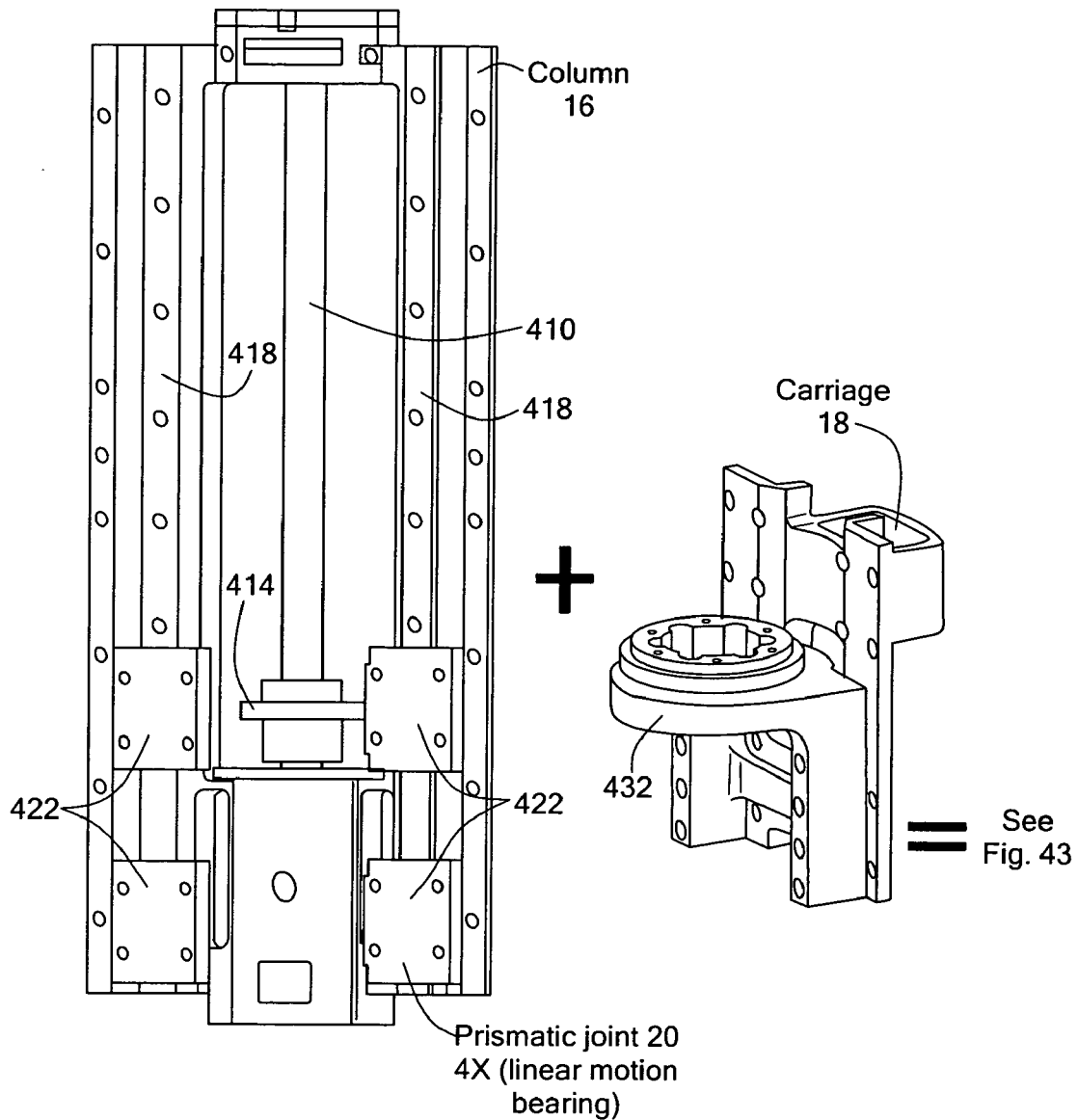
FIG. 42 is an exploded view of the column assembly of FIG. 41 with the carriage.
Figure 43:
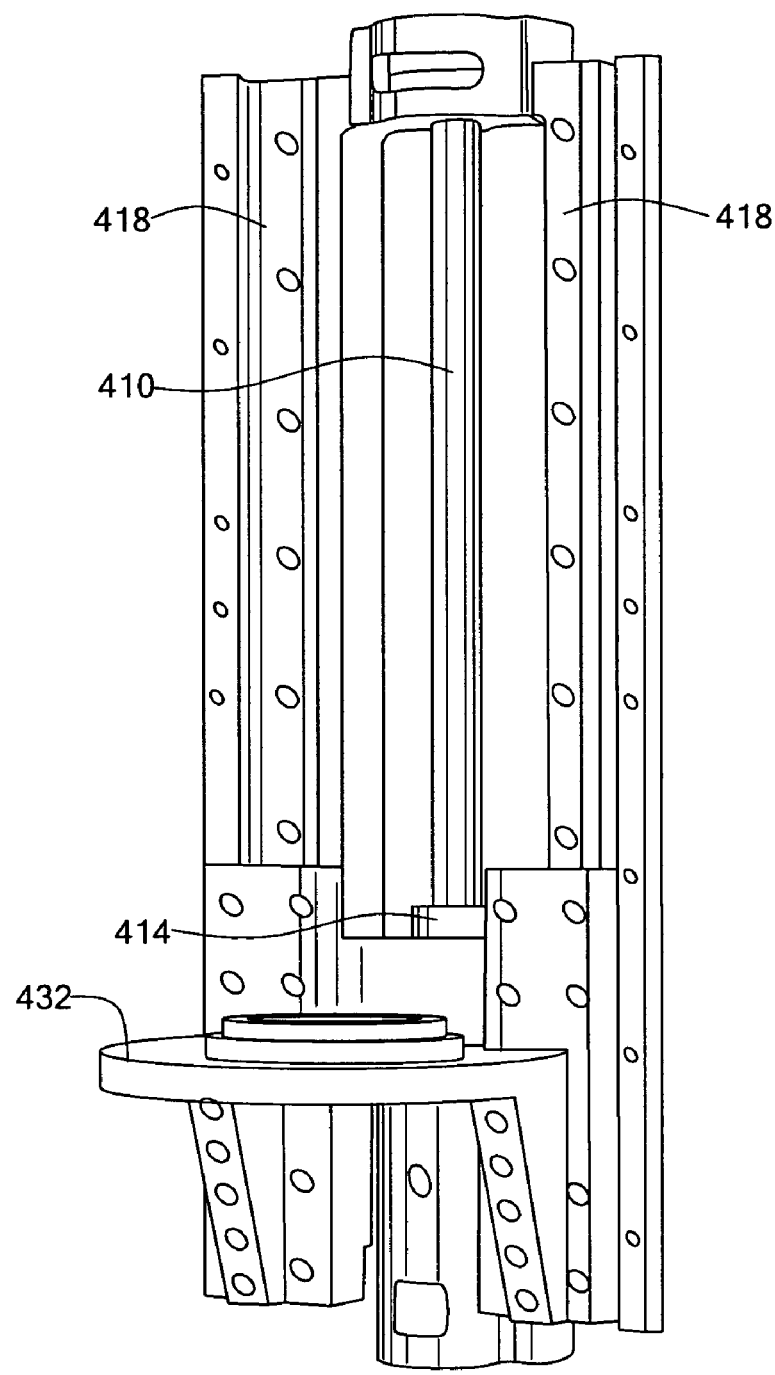
FIG. 43 is an assembled view of elements of FIG. 42.
Figure 44:
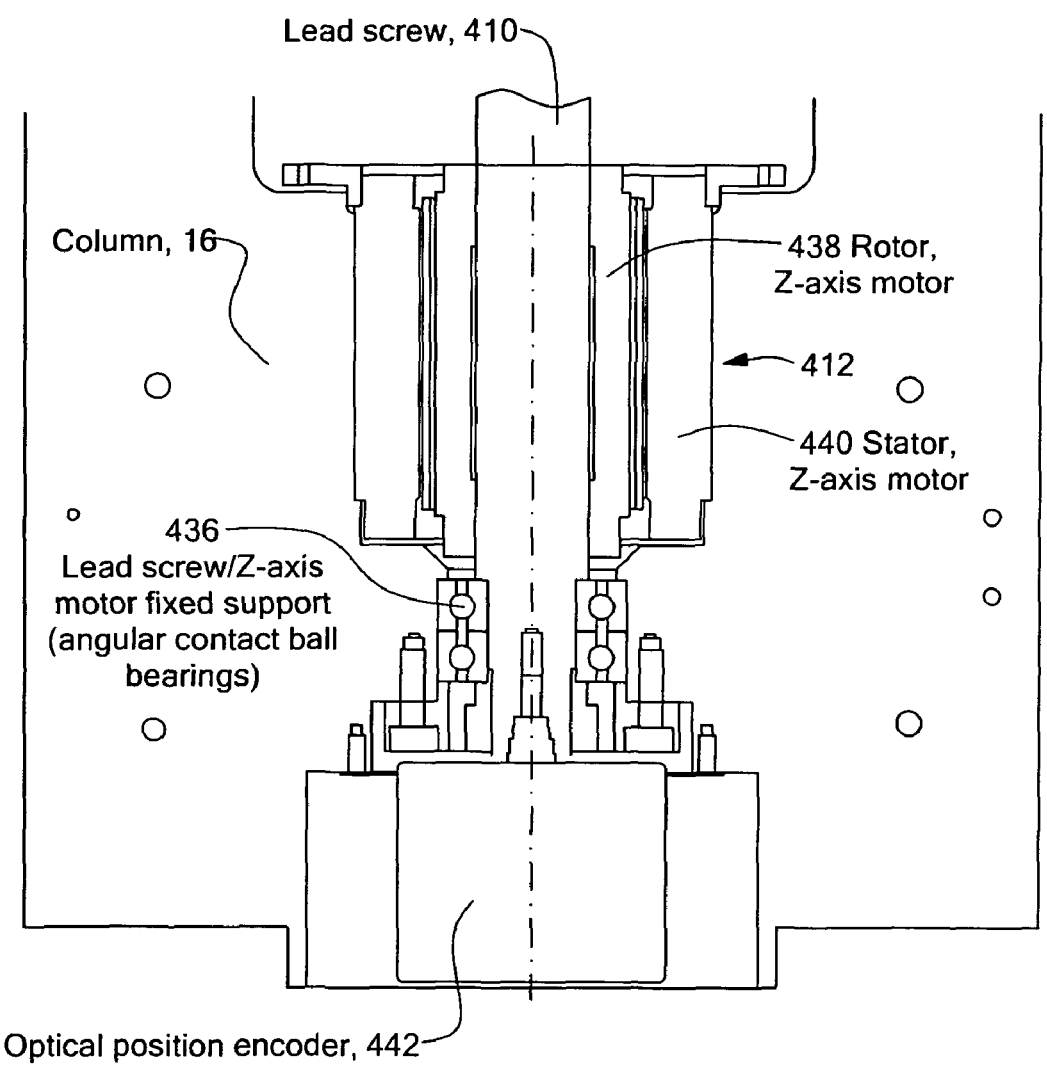
FIG. 44 is a side view of the Z-axis actuator of the robot of FIG. 2.
Figure 45:
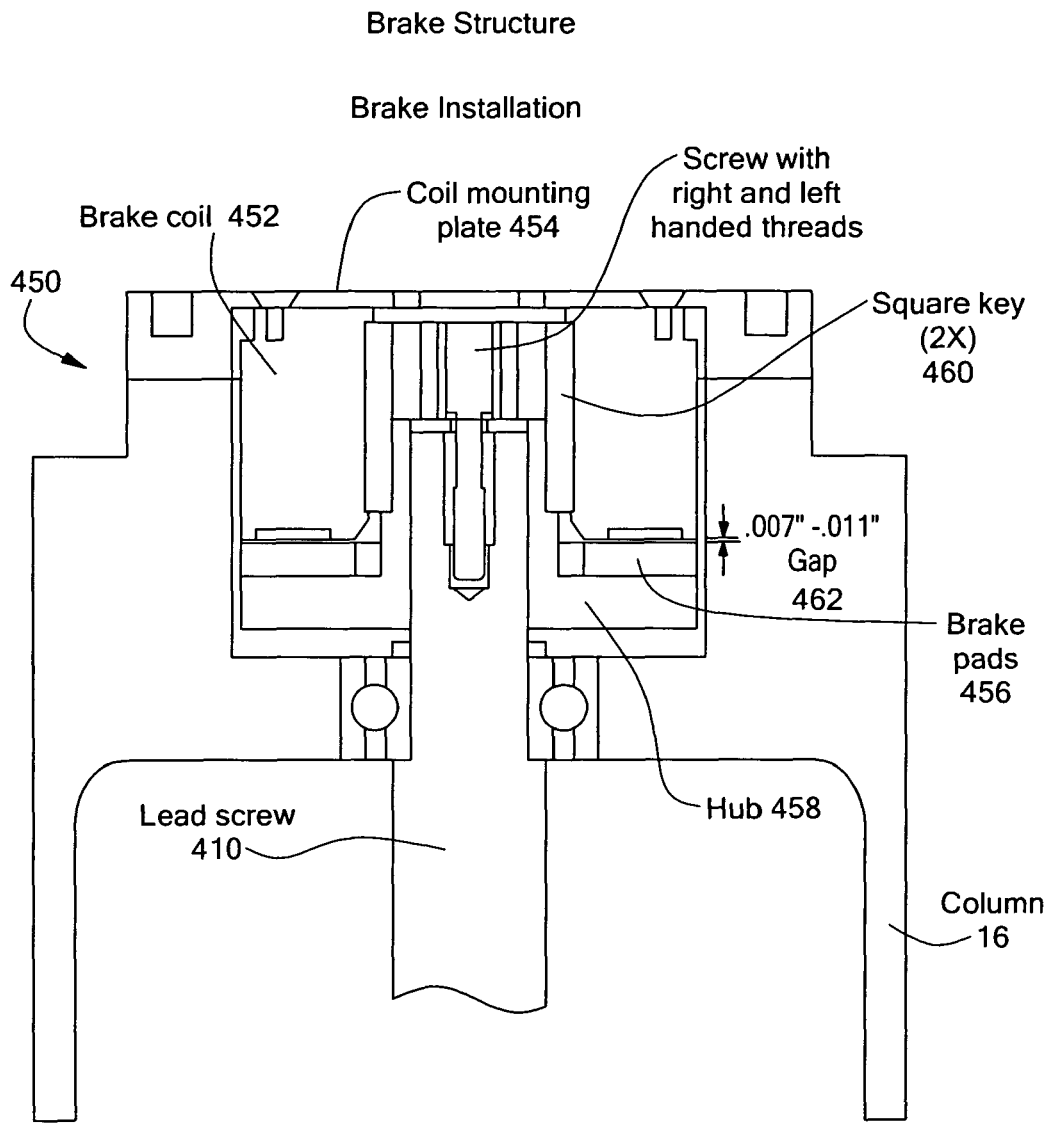
FIG. 45 is a side view of a brake assembly for use with the robot of FIG. 45.
Figure 46B:
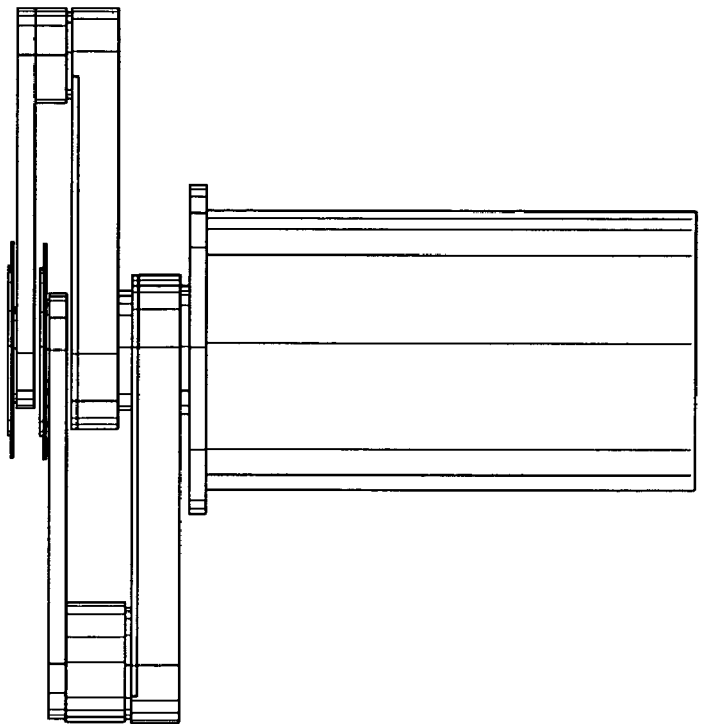
FIG. 46B is a side view of the robot of FIG. 46A.
Figure 46A:
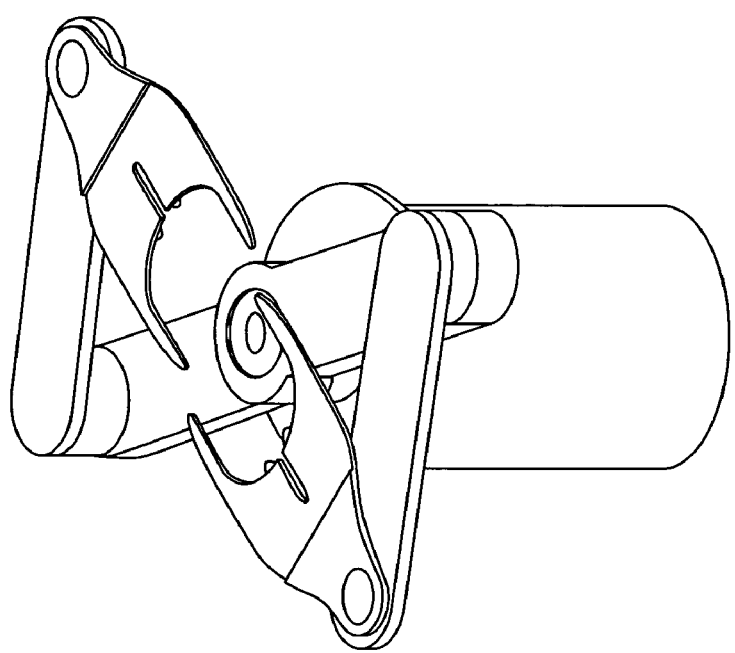
FIG. 46A is an isometric view of a dual arm robot with two oppositely directed end effectors and employing two actuators in which the inner links are in a fixed angular relationship.
Figure 47A:
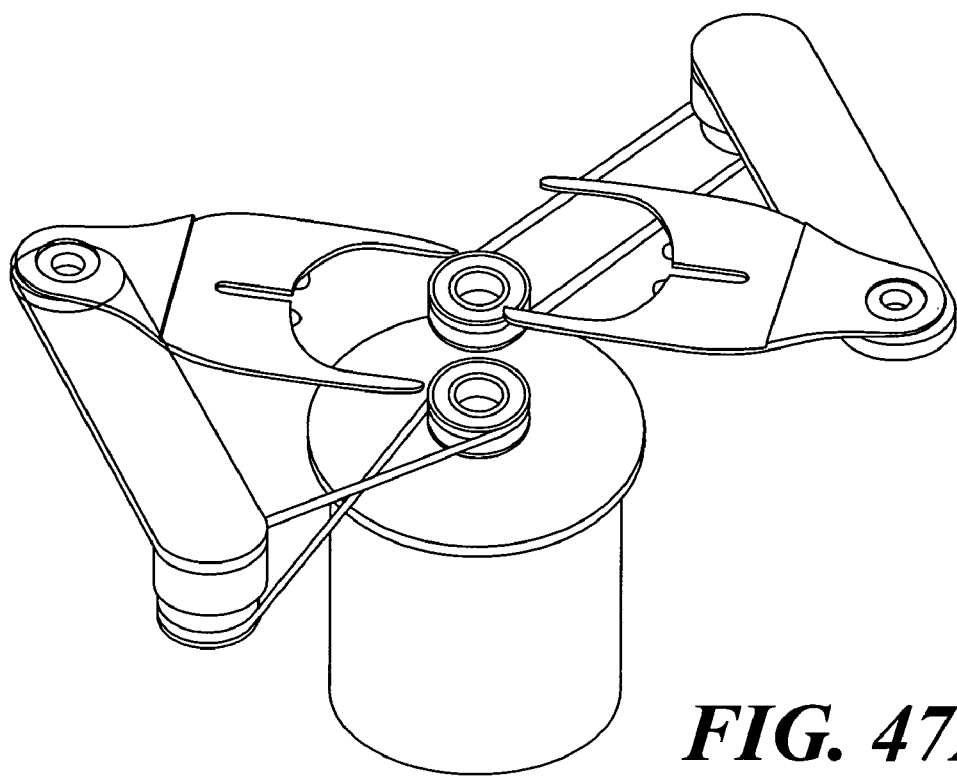
FIG. 47A is a partial view of the robot of FIG. 46A.
Figure 47B:
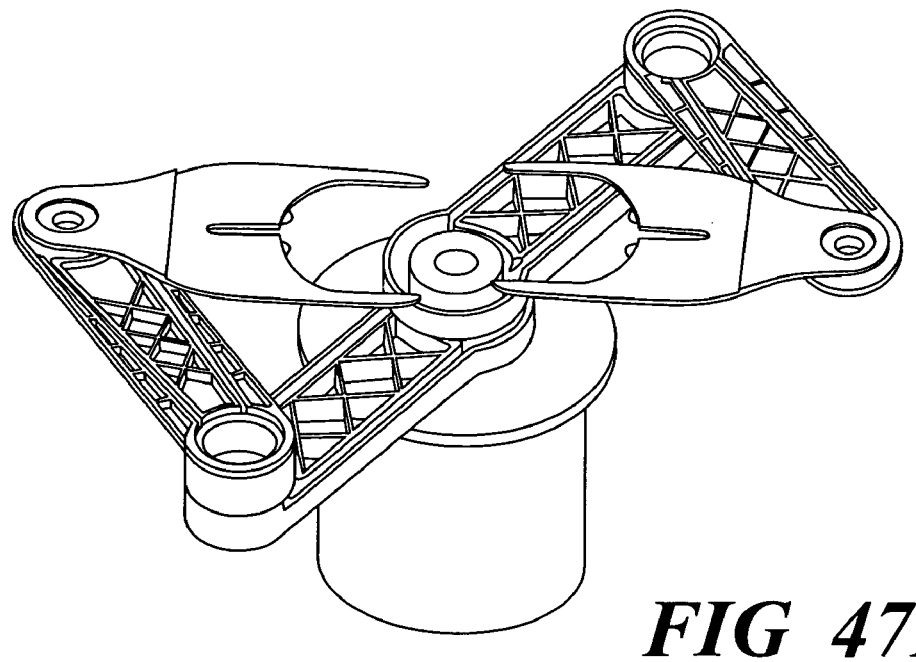
FIG. 47B is a further partial view of the robot of FIG. 46A.
Figure 47C:
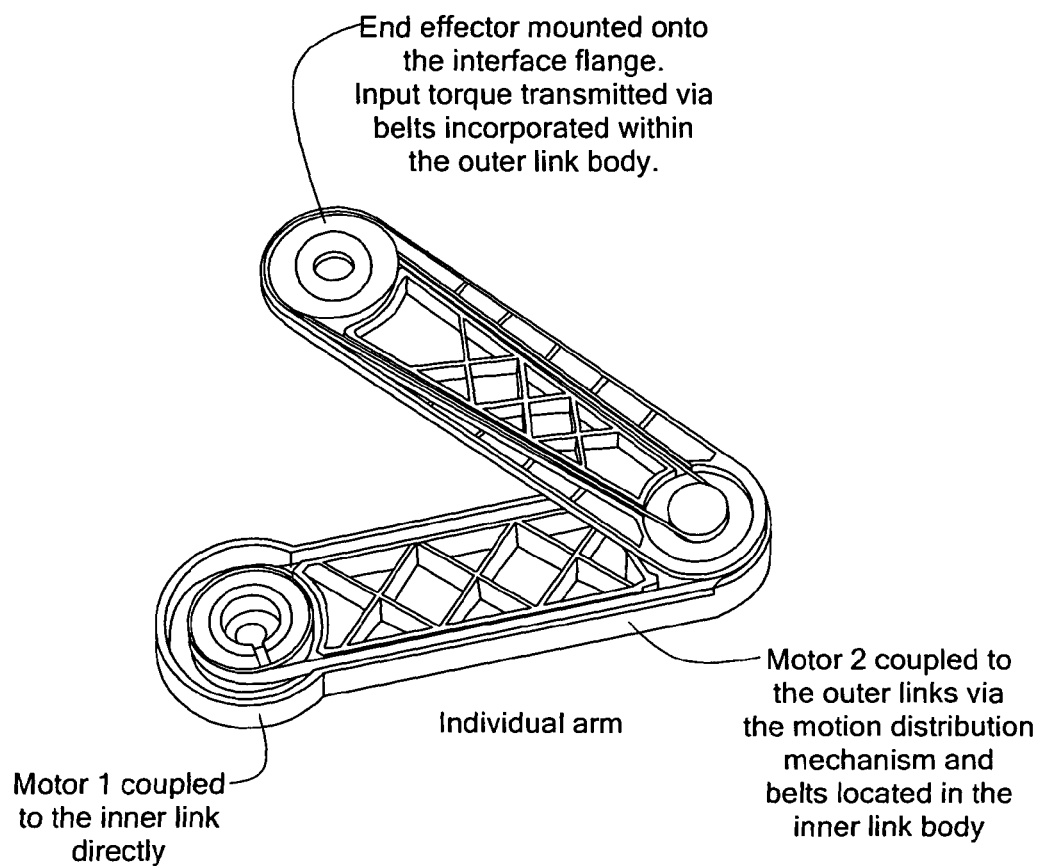
FIG. 47C is a partial view of a limb of the robot of FIG. 46A.

FIGS. 39 and 40 illustrate the carriage 18. The carriage includes a stage 428 that supports and unifies the linear motion bearings 422 that form the prismatic joint 20. The linear motion bearings ride along the master and subsidiary rails 418 on the column 16 to provide for vertical travel along the rails. Preferably four bearings are used, although any suitable number can be provided.

A nut housing 430 extends from one side of the stage 428 of the carriage 18, and a ball nut 414 is fixed into the nut housing so that it does not rotate with respect to the carriage. The ball nut serves as a transmission mechanism between the Z-axis actuator 412 and the prismatic joint 20.

A bracket 432 for mounting and supporting the motor stack 404 is attached to the stage 428 of the carriage 18, on an opposite side from the linear motion bearings 422. The bracket is preferably formed separately from the stage, so that the bracket can be designed to support various motor stacks without affecting the stage design. Thus, the carriage can be reconfigured to suit different requirements merely by replacing one motor stack bracket with a different motor stack bracket. Alternatively, the stage and bracket can be formed as a single piece if desired.

The lead screw 410 is mounted on the column 16 by, for example, angular contact ball bearings 436, for rotation about an axis parallel to the axis Z20. See FIG. 44. The Z-axis actuator 412 is mounted to the base of the column to provide rotation to the lead screw. In the embodiment illustrated, the Z-axis actuator comprises a servomotor including a rotor 438 coupled to the lead screw 410 and a stator 440 supported by the column 16. An optical position encoder 442 is located in the base.

The lead screw 410 passes through the ball nut 414, which is constrained from rotation by being fixed to the carriage 18. Thus, rotation of the lead screw is transformed into linear motion of the nut. In this manner, the carriage, supported by the linear bearings, moves vertically up or down in accordance with rotation of the lead screw.

A brake assembly 450 is provided at the top of the column. See FIG. 45. The brake assembly retains the arms in their vertical location in the event of a power failure. The brake assembly includes a brake coil 452 fixed by a coil mounting plate 454 to the column 16. A permanent magnetic (not visible in FIG. 45) is located within the coil. Brake pads 456, which are formed of a magnetic material and are attracted to the permanent magnet, are fixed to a hub 458 and biased away from the coil 452 by any suitable biasing mechanism, such as springs (not visible in FIG. 45). Additionally, when the coil is energized, the magnetic field from the coil overcomes the magnetic field of the permanent magnetic within the coil and, in conjunction with the biasing mechanism, pushes the brake pads away from the coil. The hub 458 is fixed to the lead screw 410 for rotation therewith via two square keys 460 that transfer torque from the lead screw to the hub. Thus, when the coil is energized, there is a gap 462 between the brake pads 456 and the coil 452. The brake pads rotate with the hub and lead screw, and no braking effect is provided.

When power is lost, the coil 452 is no longer energized. The brake pads 456 are then attracted into contact with the coil by the permanent magnetic within the coil. Friction between the pads and the coil, in conjunction with the keys that keep the hub fixed to the lead screw, thereby prevents motion of the hub and lead screw. In this manner, the lead screw cannot rotate when power is lost, and the arms are retained in their vertical location. It will be appreciated that other braking configurations can be provided.

In another aspect of the present invention, a dual-arm robot incorporating a modular design employing only two motors is provided. In these embodiments, the inner links of each of the two arms are attached together with a fixed angular relationship. The angle between the inner links can be any suitable angle. Once the robot is assembled, the angular relationship cannot be changed accept by disassembling the robot and reassembling the robot in another configuration.

A first actuator, such as a motor, actuates rotation of the inner link about a vertical axis. A second actuator, such as another motor, actuates extension of one end effector mounting flange, with an associated end effector, at a time. A coupling is provided that allows selection of the particular end effector to be extended or retracted.

Figure 48:
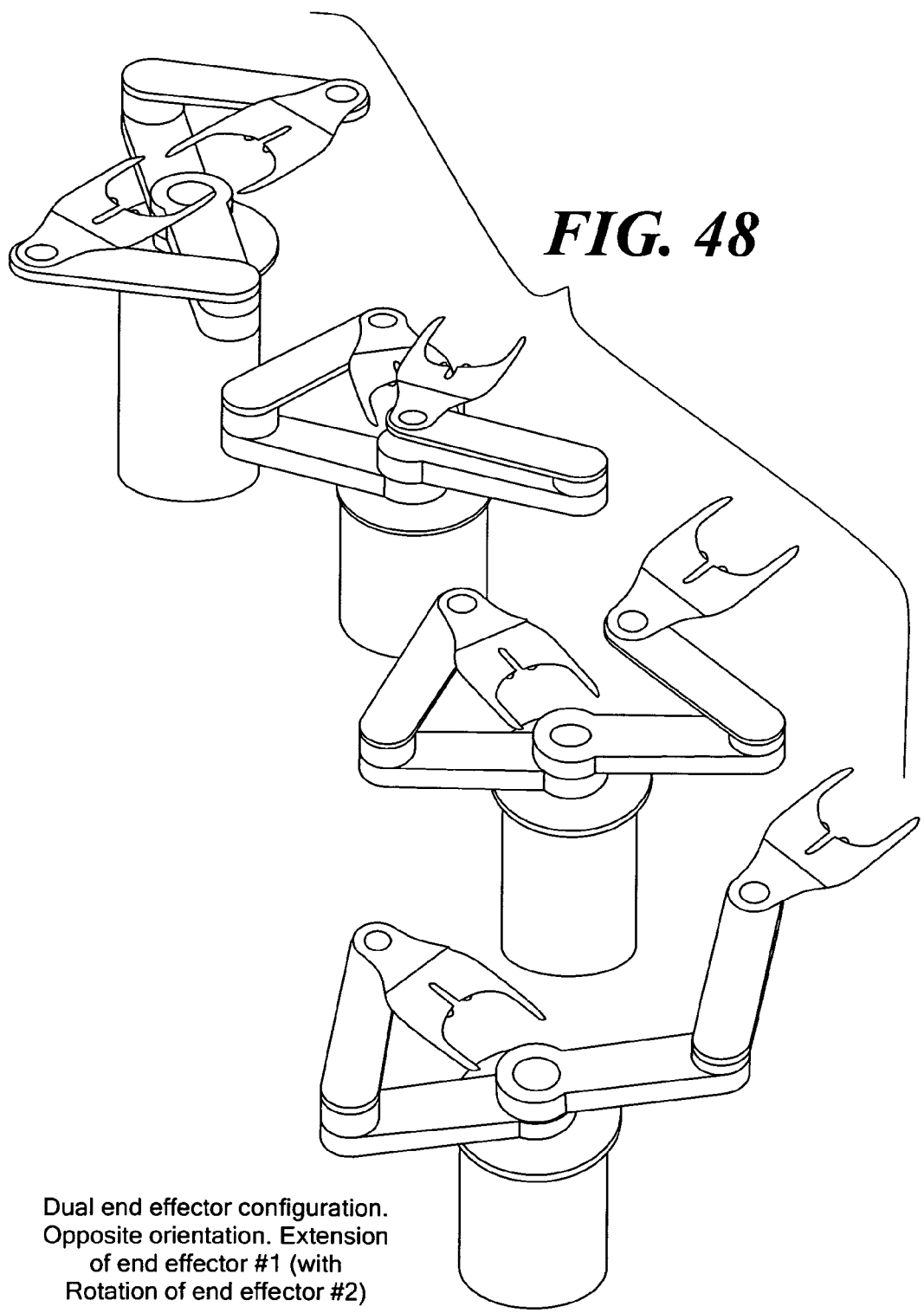
FIG. 48 illustrates an extension sequence of one end effector of the robot of FIG. 46A.
Figure 49:
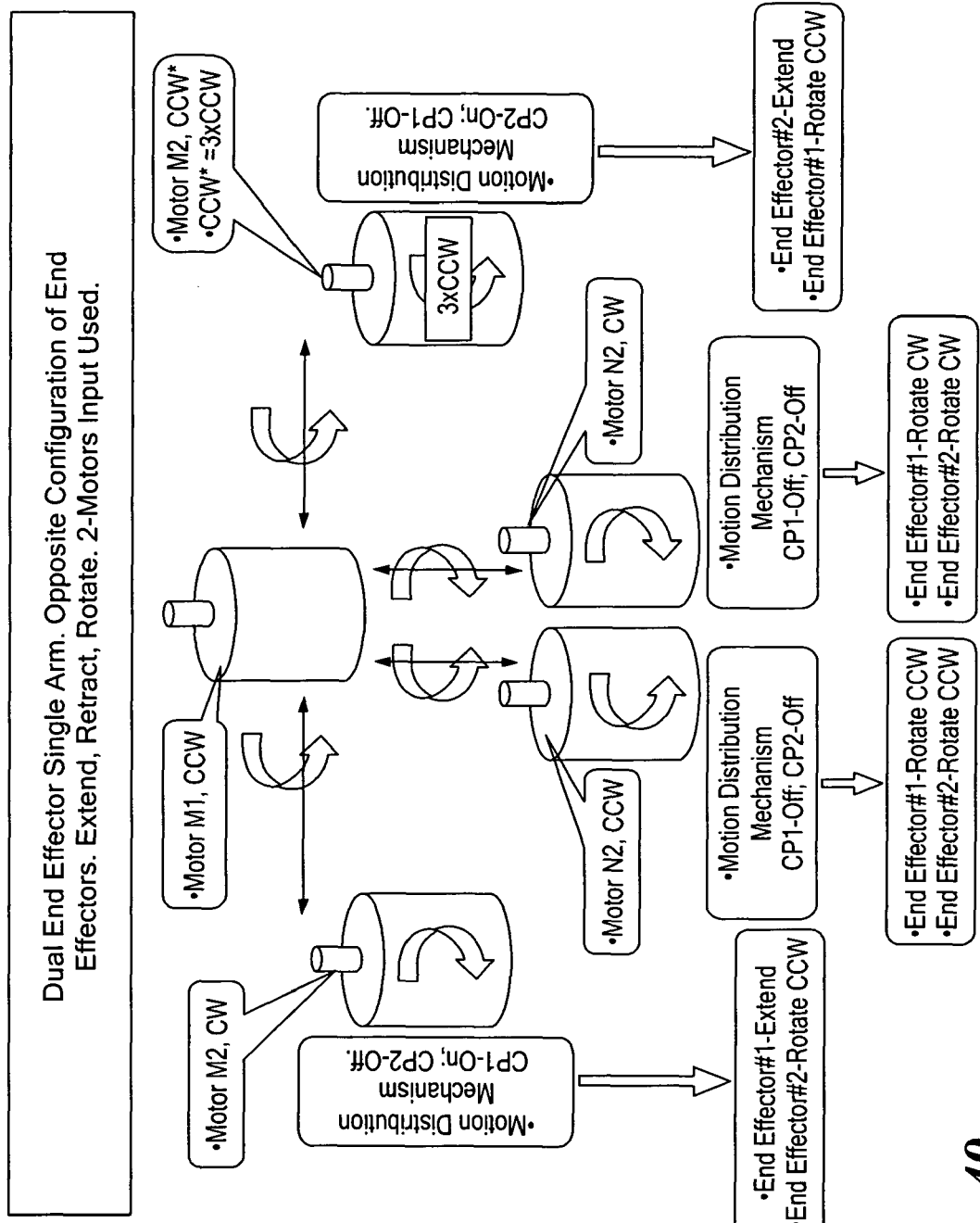
FIG. 49 is a diagram illustrating operation of two motors to effect translation and rotation of the end effectors of the robot of FIG. 46A.
Figure 50A:
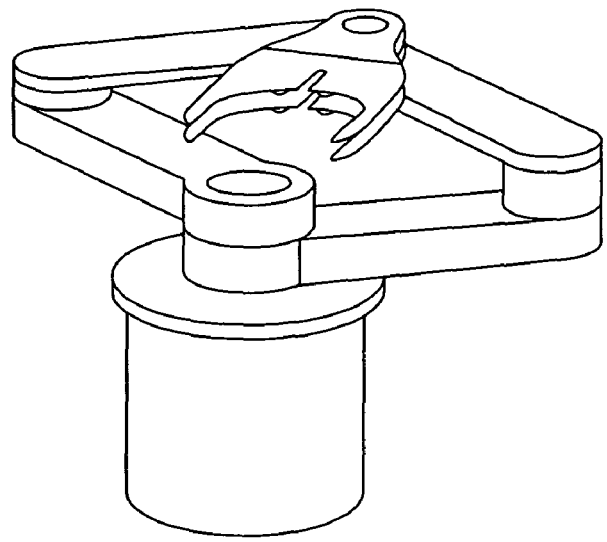
FIG. 50A is an isometric view of a dual arm robot with two co-directional end effectors and employing two actuators in which the inner links are in a fixed angular relationship.
Figure 50B:
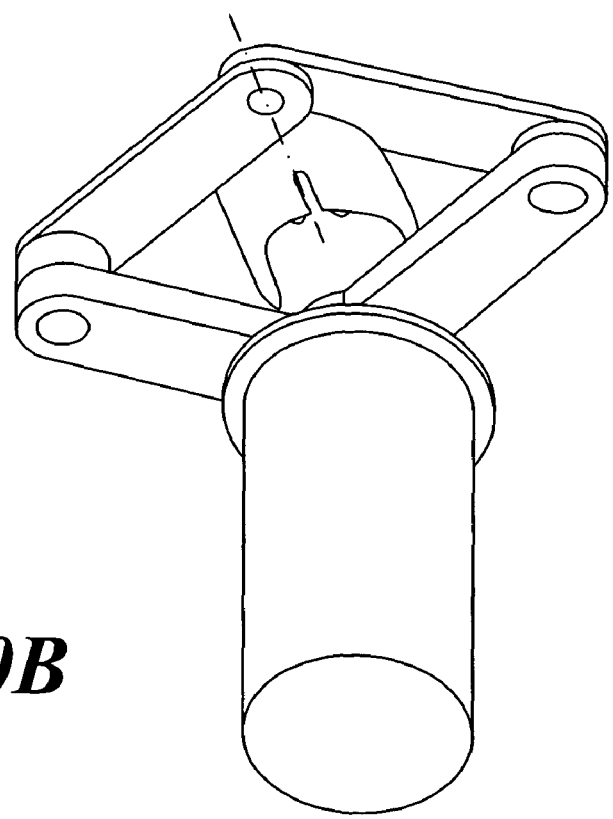
FIG. 50B is a further isometric view of the robot of FIG. 50A.
Figure 51A:
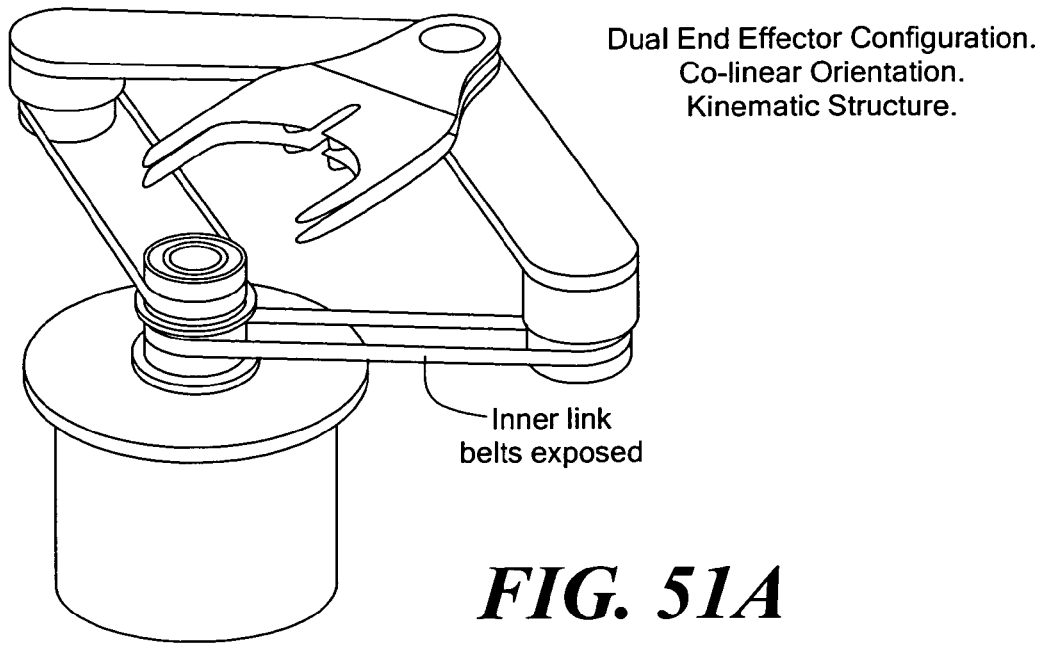
FIG. 51A is a partial view of the robot of FIG. 50A.
Figure 51B:
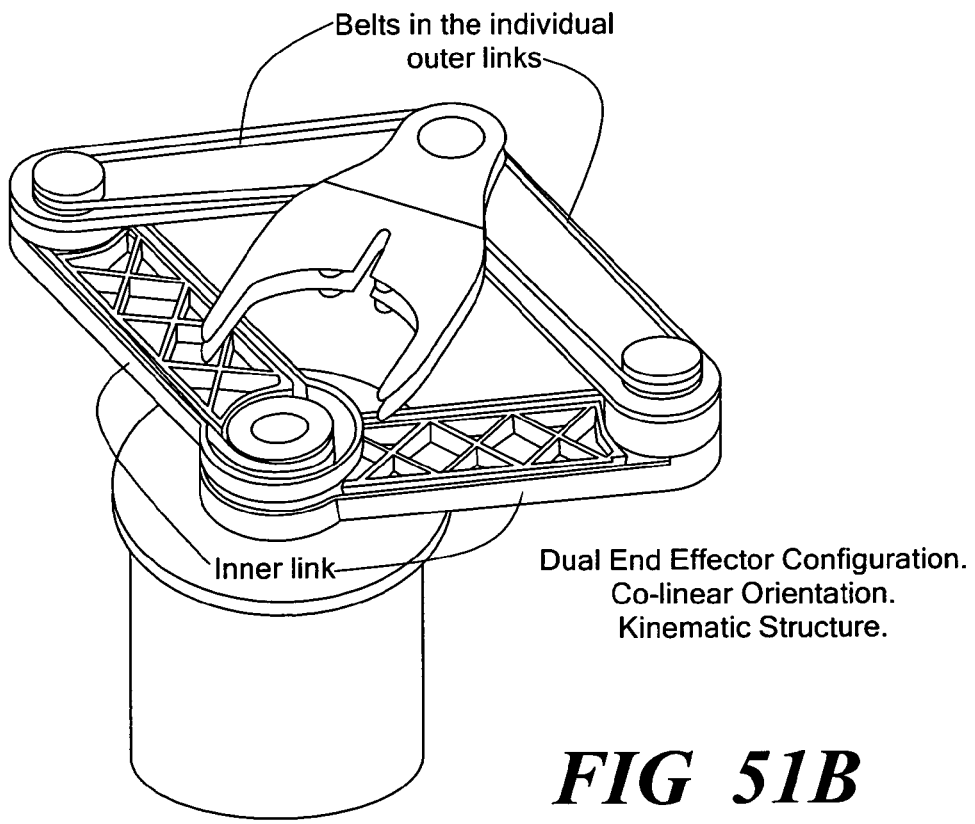
FIG. 51B is a further partial view of the robot of FIG. 50A.
Figure 51C:
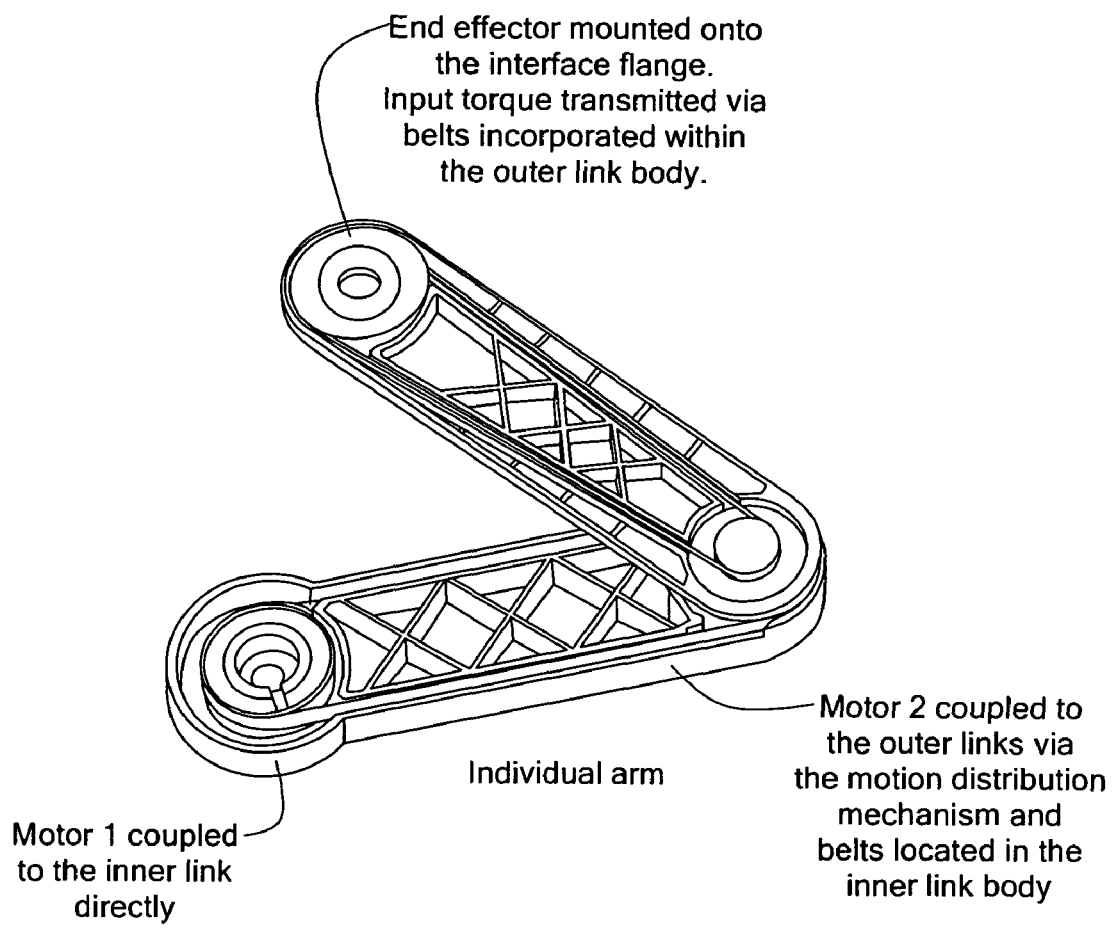
FIG. 51C is a partial view of a limb of the robot of FIG. 50A.

The robot according to this aspect can be assembled in a number of configurations. FIGS. 46A-49 illustrate a configuration in which the inner links are aligned linearly and the end effectors are oriented in opposite directions. Motion of one end effector is illustrated in FIG. 48, in which it can be seen that the inner links remain aligned during extension of the first end effector. Only one of the outer links is rotating around its "elbow" joint, resulting in the extension of the end effector that is attached to it. The other outer link is fixed temporarily to its elbow joint, thus resulting in rotation of the other end effector.

Figure 52:
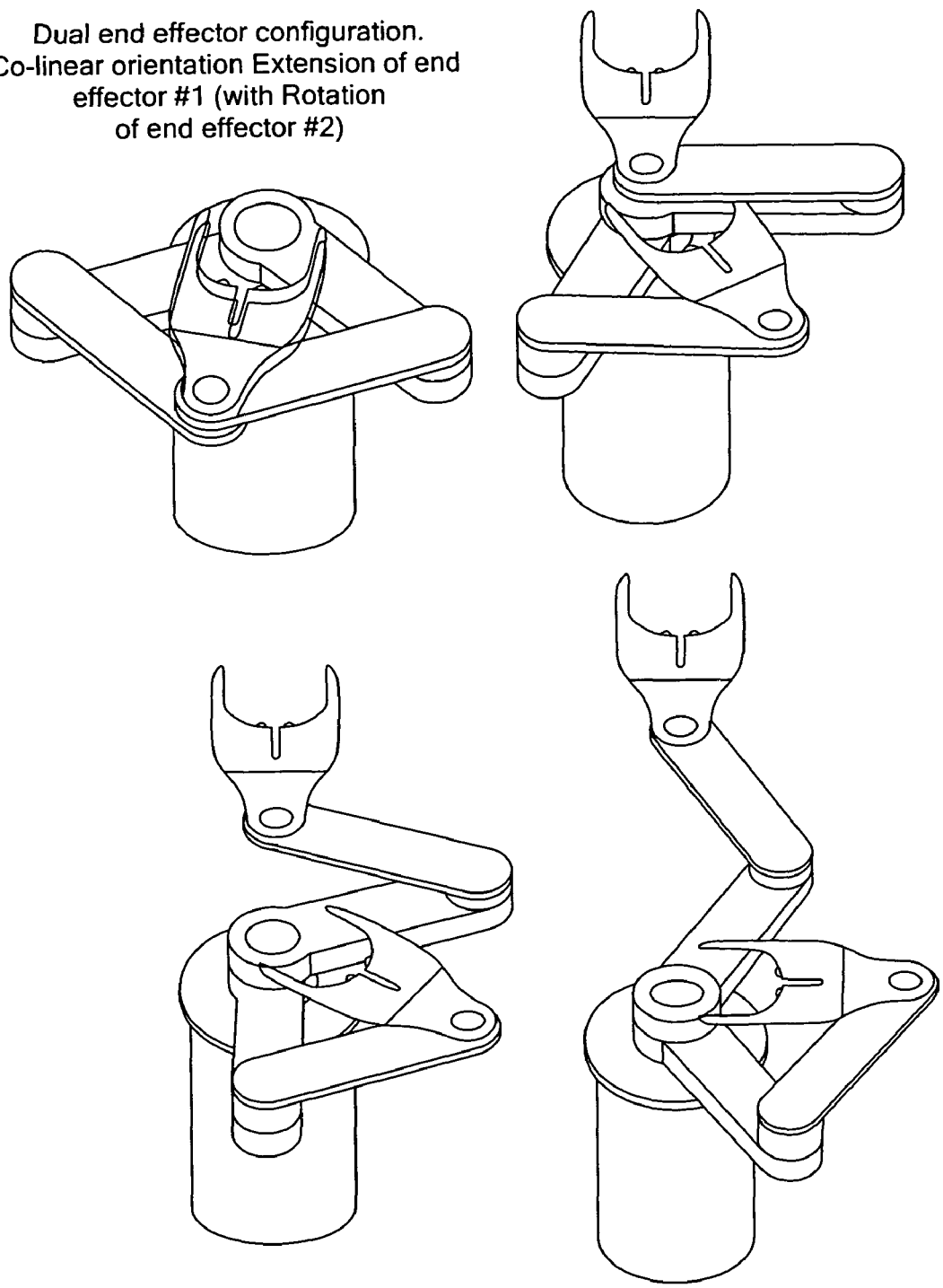
FIG. 52 illustrates an extension sequence of one end effector of the robot of FIG. 50A.
Figure 53:
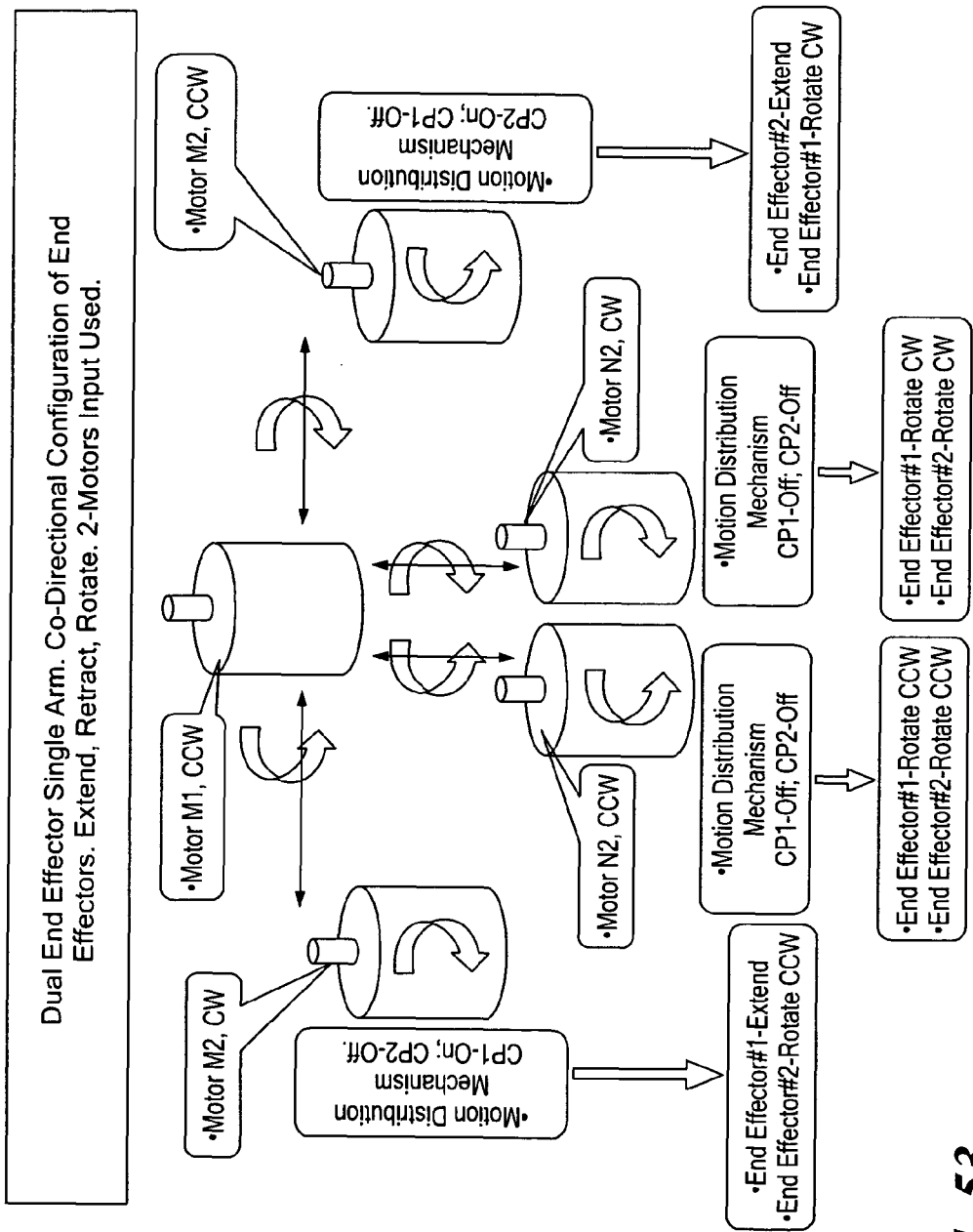
FIG. 53 is a diagram illustrating operation of two motors to effect translation and rotation of the end effectors of the robot of FIG. 50A.

FIGS. 50A-53 illustrate a configuration in which the inner links are oriented at an angle and the end effectors are oriented in the same direction. FIG. 52 illustrates motion of this configuration during extension of one of the end effectors. It is similarly apparent that the inner links remain aligned in the same angular relationship and the second end effector rotates passively during extension of the first end effector.

Figure 54B:
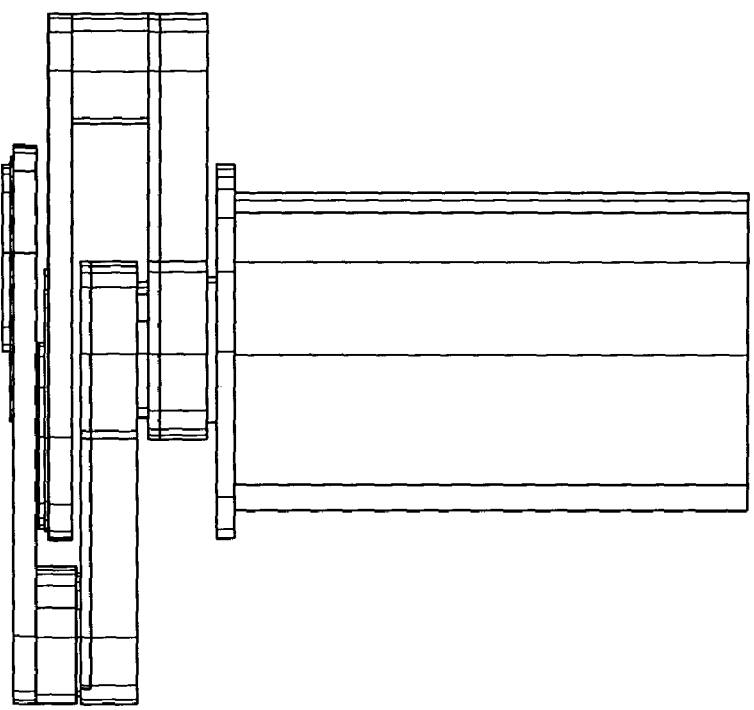
FIG. 54B is a side view of the robot of FIG. 54A.
Figure 54A:
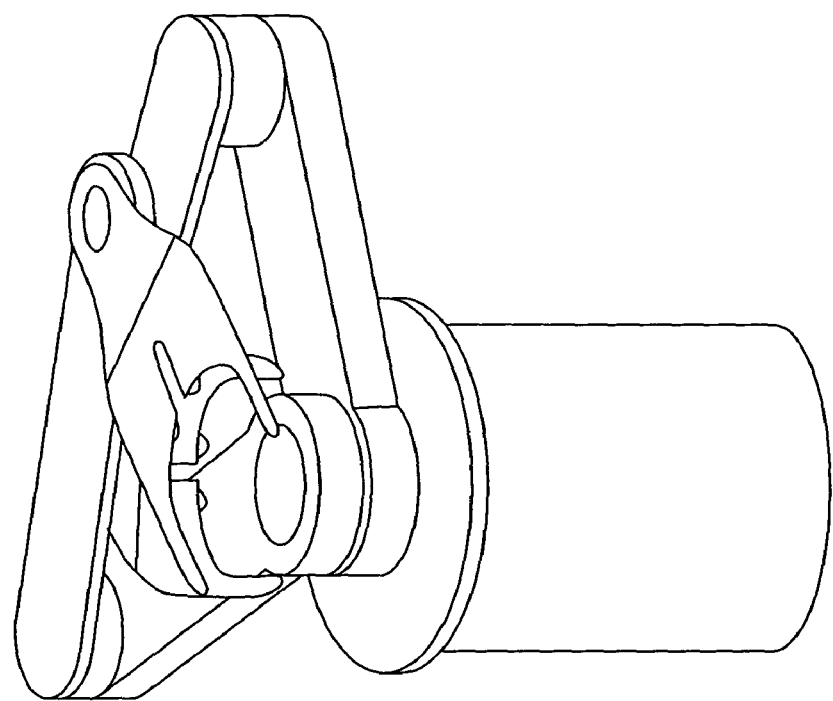
FIG. 54A is an isometric view of a dual arm robot with two acutely angled end effectors and employing two actuators in which the inner links are in a fixed angular relationship.
Figure 55:
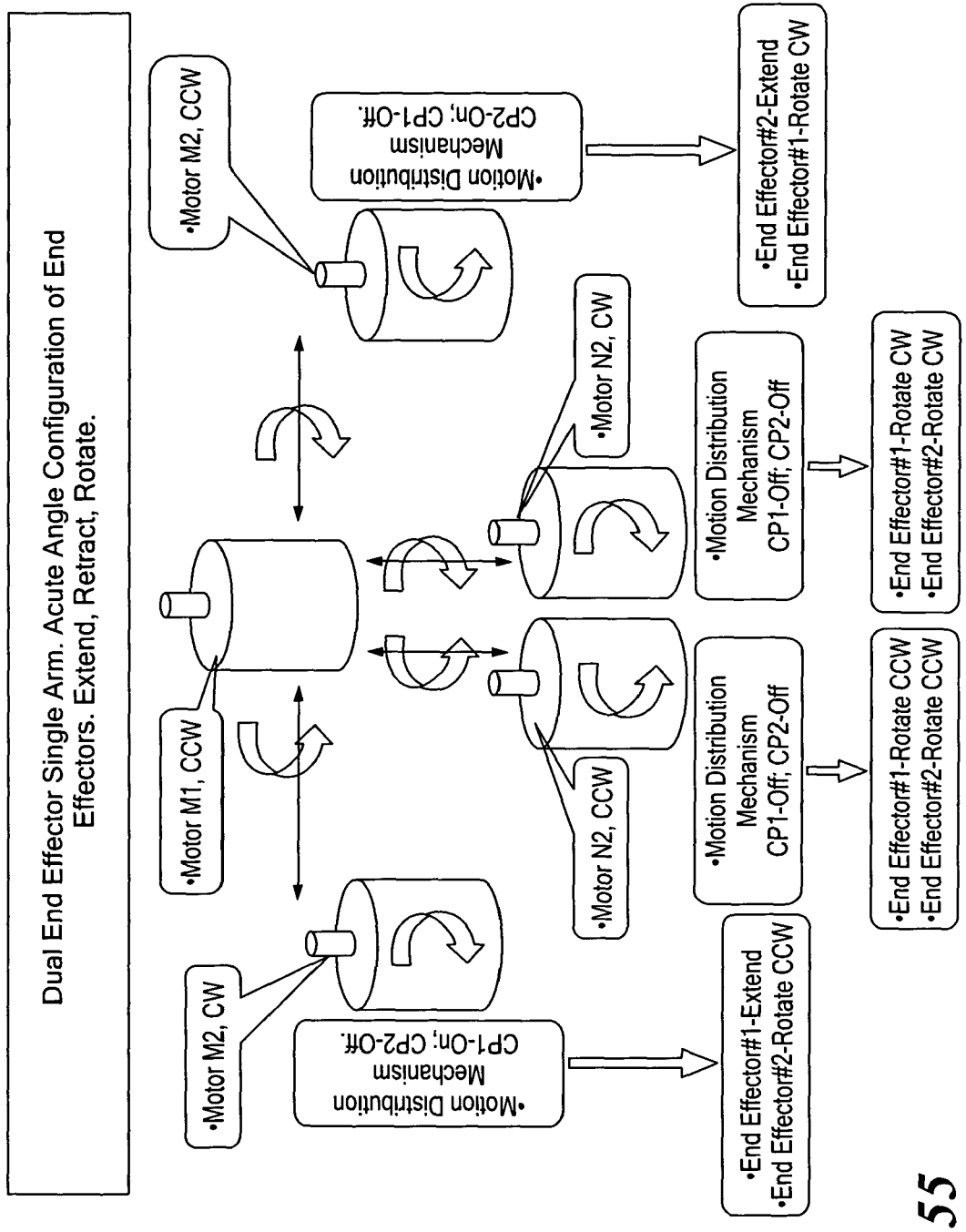
FIG. 55 is a diagram illustrating operation of two motors to effect translation and rotation of the end effectors of the robot of FIG. 54A.

FIGS. 54A-55 illustrate a configuration in which the inner links are oriented at an angle to each other, and the end effectors are oriented at an acute angle to each other.

Figure 61A:
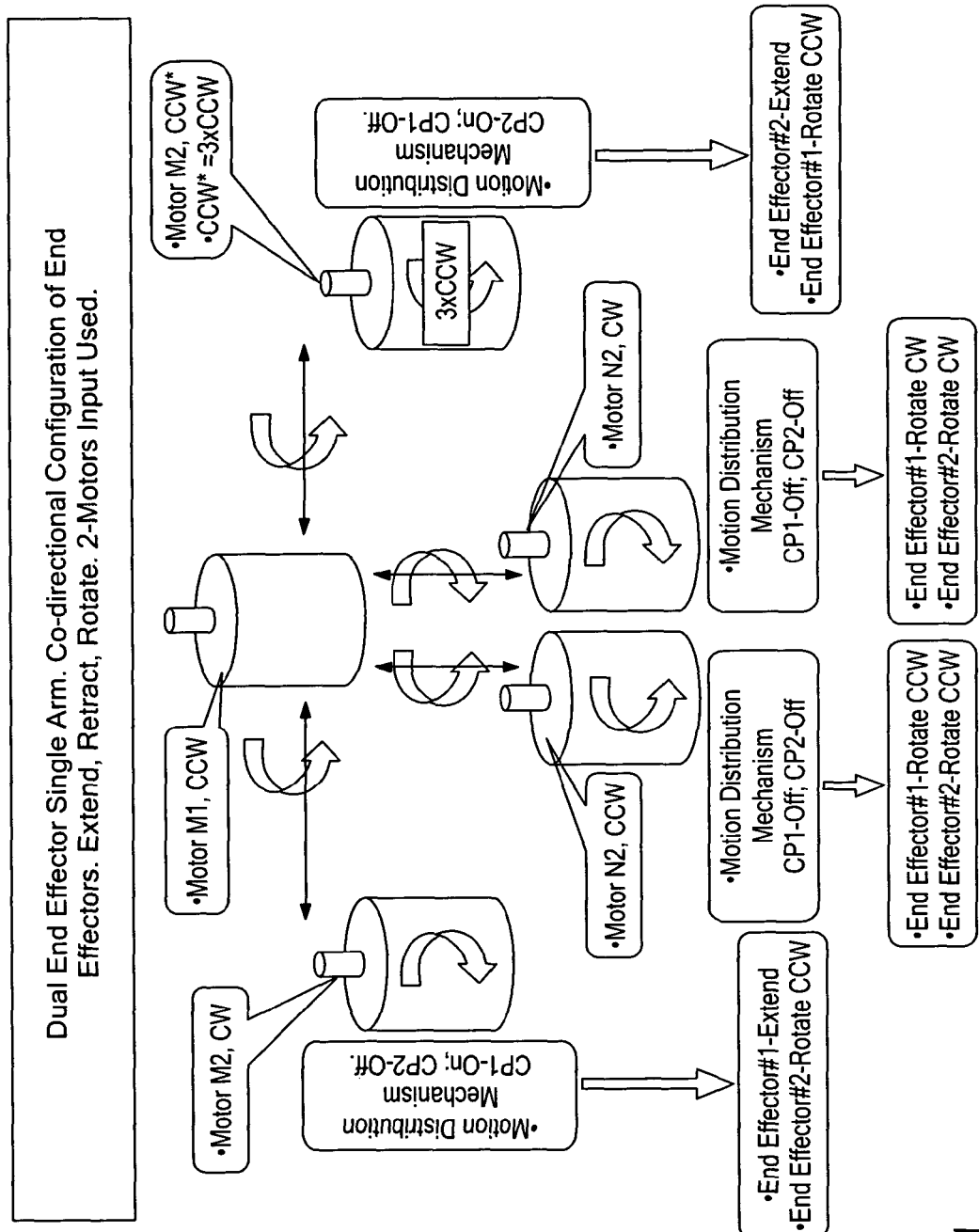
FIG. 61A is a diagram illustrating operation of two motors to effect translation and rotation of the end effectors of the robot of FIG. 58A.
Figure 61B:
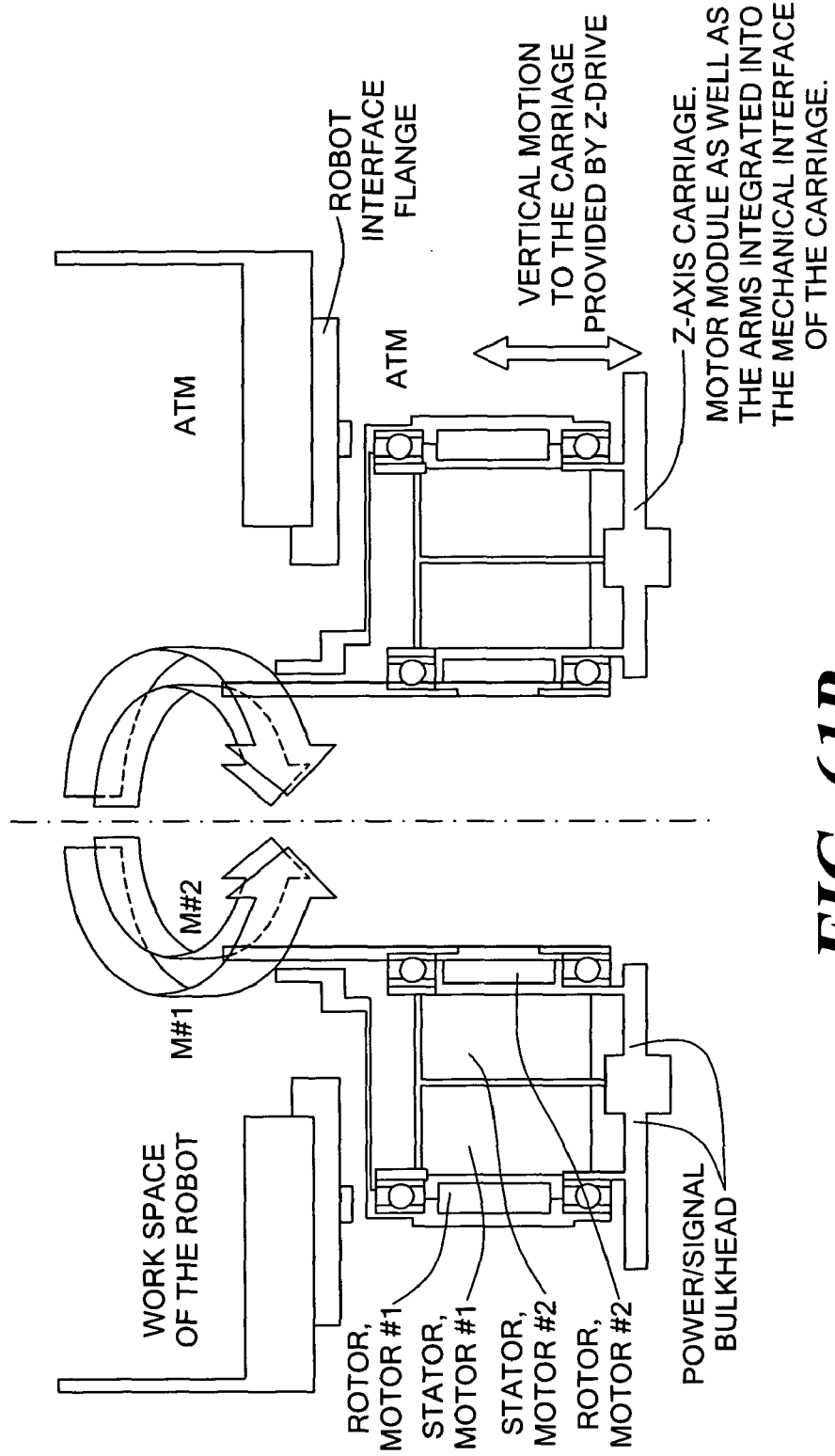
FIG. 61B illustrates a concentric arrangement of two motors for use with the robot of FIG. 58A.
Figure 61C:
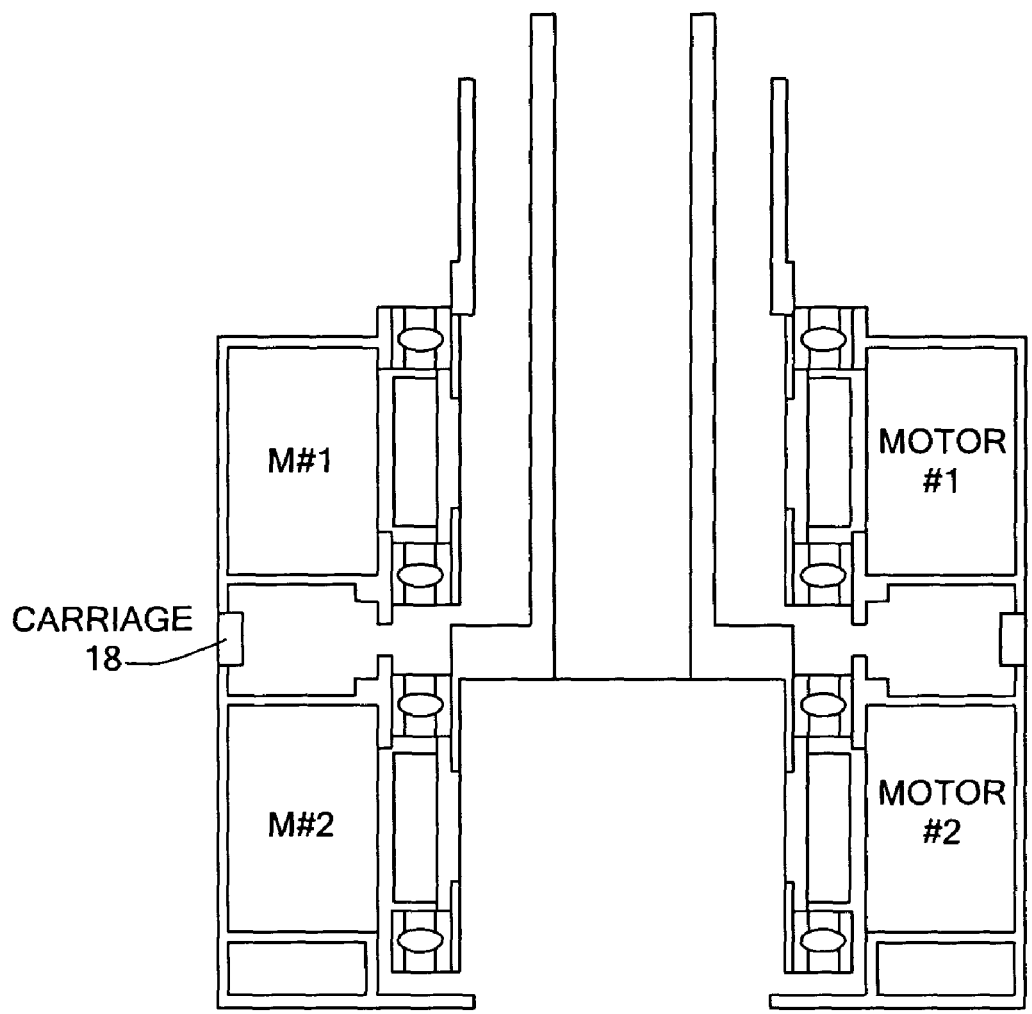
FIG. 61C illustrates an in-line arrangement of two motors for use with the robot of FIG. 58A.

FIGS. 58A-61C illustrate a dual end effector arm having two actuators, which may be actuated in a manner similar to that of the embodiment of FIGS. 46A-49. FIGS. 60A, B, and C illustrate various extension options. In FIGS. 60A and B, when one end effector is extended, the other end effector is rotated passively. In FIG. 60C, both end effectors are extended. FIG. 61A illustrates actuation of two motors to effect extensions or rotations. FIG. 61B illustrates two motors arranged concentrically. FIG. 61C illustrates two motors arranged in line.

A suitable coupling that allows selection of the end effector to be extended or retracted is illustrated in FIGS. 56A-J. This coupling incorporates a Geneva-type mechanism. A Geneva mechanism produces intermittent rotation from continuous rotation.

Figure 56A:
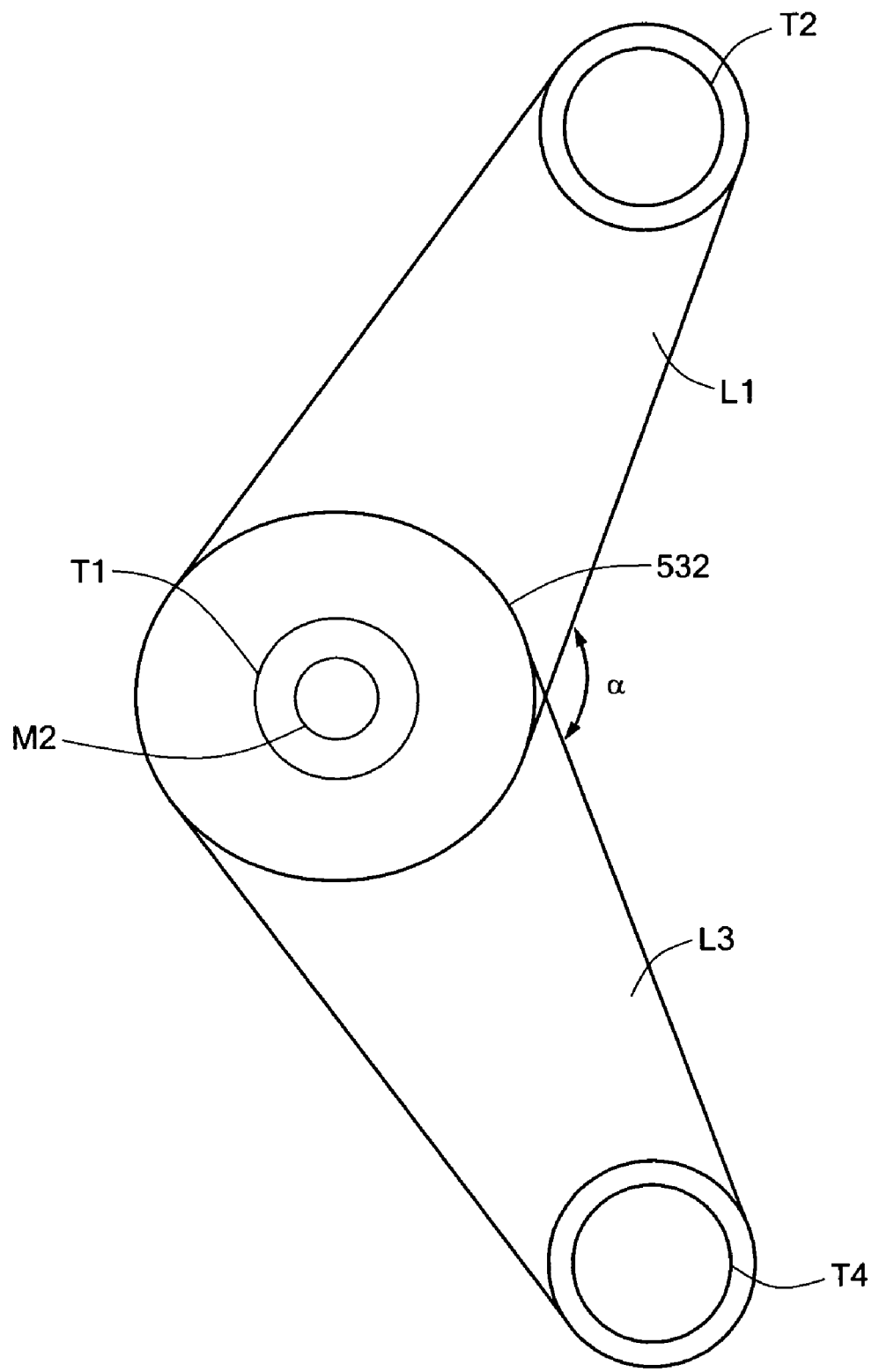
FIGS. 56A-E are partial views of a Geneva-type coupling mechanism that allows selection of the end effector to be extended or retracted, for use in conjunction with robots of the embodiments of FIGS. 46A-55, 57, 58A-61C, and 65A-75.
Figure 56B:
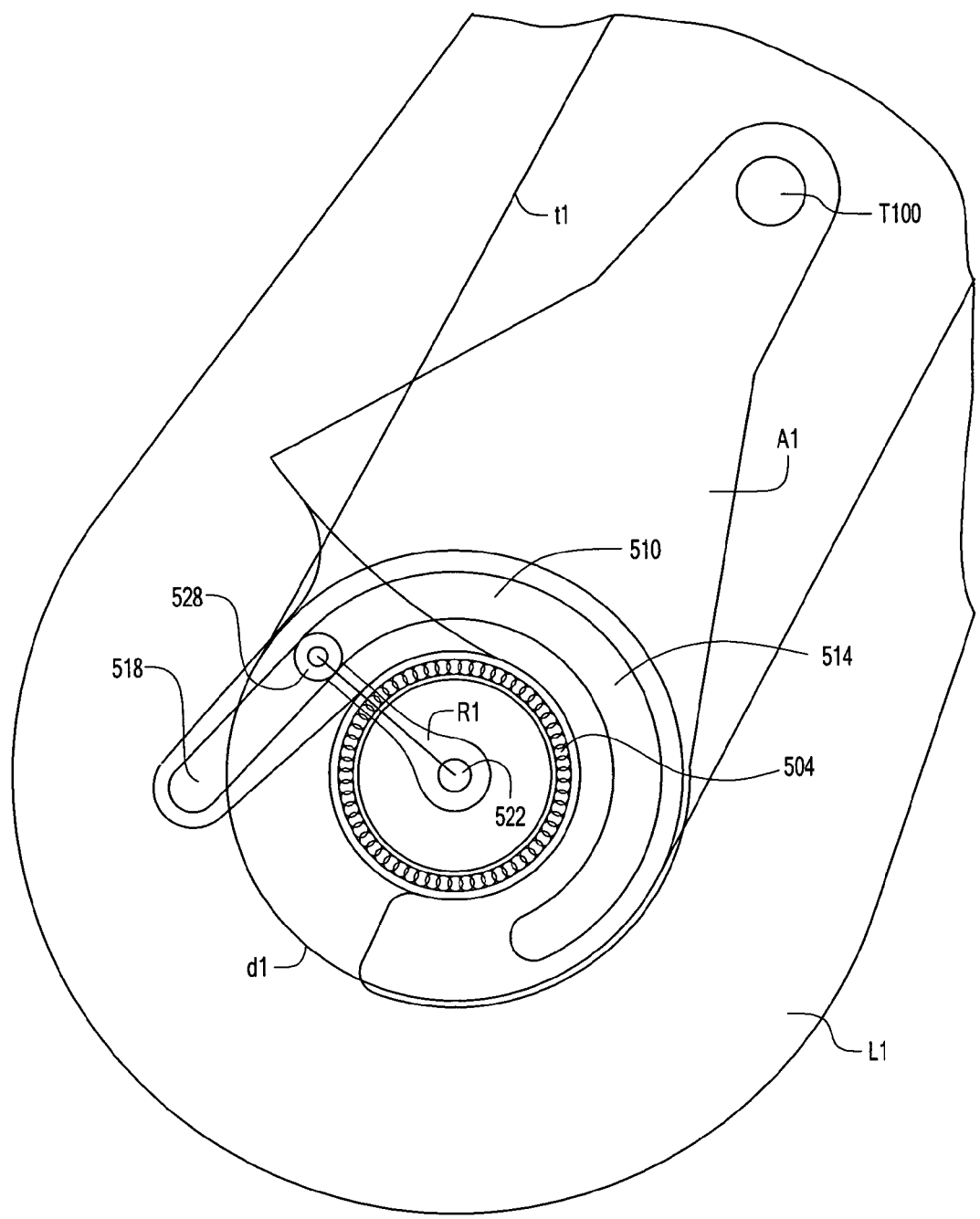
Figure 56C:
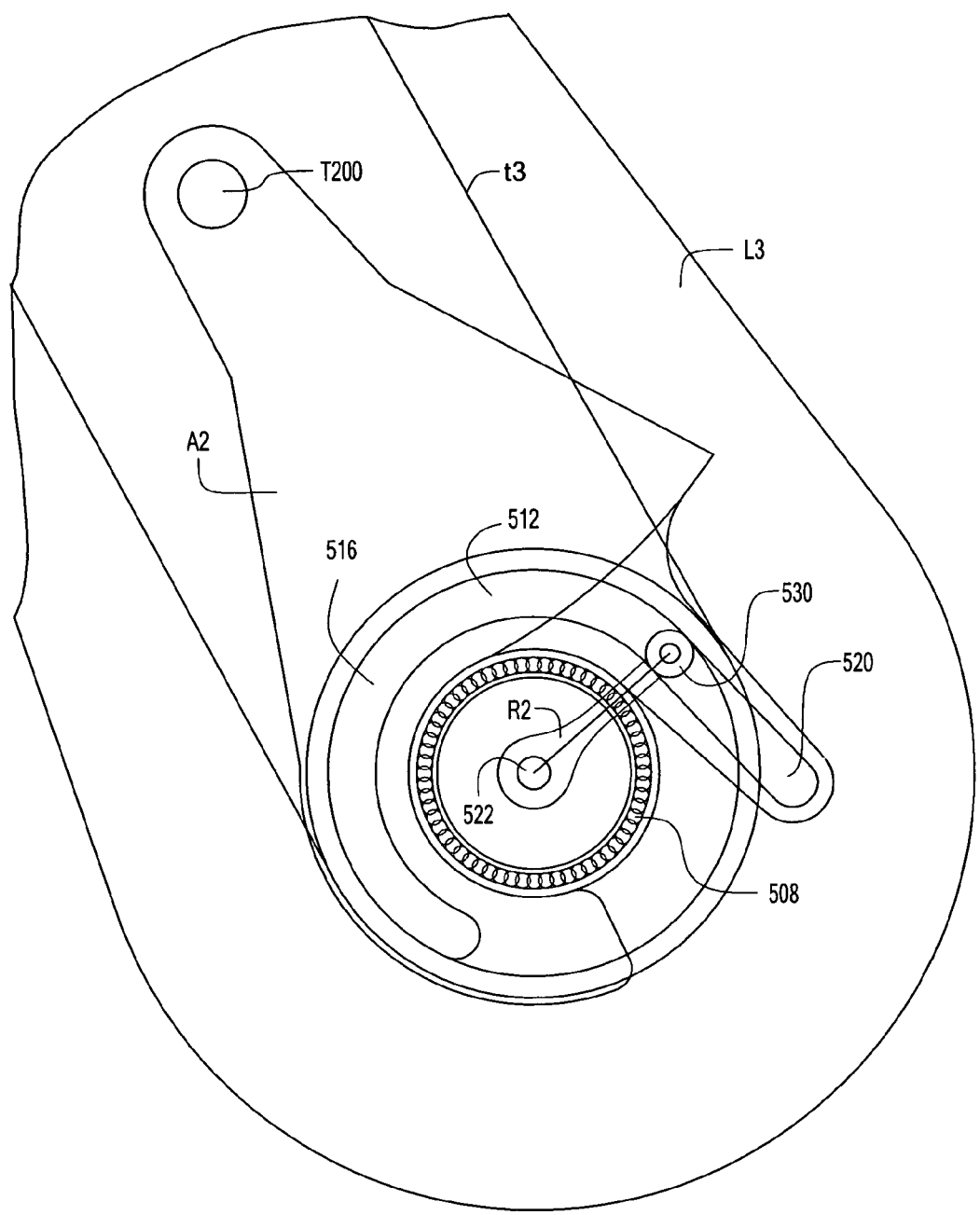

Referring to FIG. 56A, the inner link L1 and inner link L3 are attached together with a fixed angle α. In the embodiment illustrated, the link L3 is above the link L1 and both links are mounted onto the rotary joint T1. The joint T1 is the connecting joint between the links and the carriage 18 (or directly to the base L0 if no vertical motion ability is included). Thus, both links are attached to a shaft 532 that is coupled to the rotor of motor M1, and both links rotate together as one piece.

Referring to FIGS. 56B-E, a lever A1 is attached to the inner link L1 at a rotary joint T100, and a lever A2 is attached to the inner link L3 at a rotary joint T200. The levers also include slots 510, 512 that each has a circular portion 514, 516 and a linear portion 518, 520. The axis of rotation of the pulleys d1, d5 is co-axial with the center of the circular portions of the respective slots in the levers A1, A2.

The rotor of the motor M2 is attached to a shaft 522 that includes two coupling members R1, R2 extending at a fixed angle β at the end of the shaft. The angle between the coupling members is fixed during assembly. The coupling members have rollers 528, 530 on their ends that travel within the slots 510, 512 of the levers A1 and A2. Torque from the motor M2 is transmitted via the rollers R1, R2 to the pulleys d1, d5. The linear portions of the slots function as a partial Geneva drive, causing one of the two levers to be shifted with respect to the motor M2 shaft 522 as the coupling members are rotated by the motor M2, as best seen in FIGS. 56G-56J.

Figure 56D:
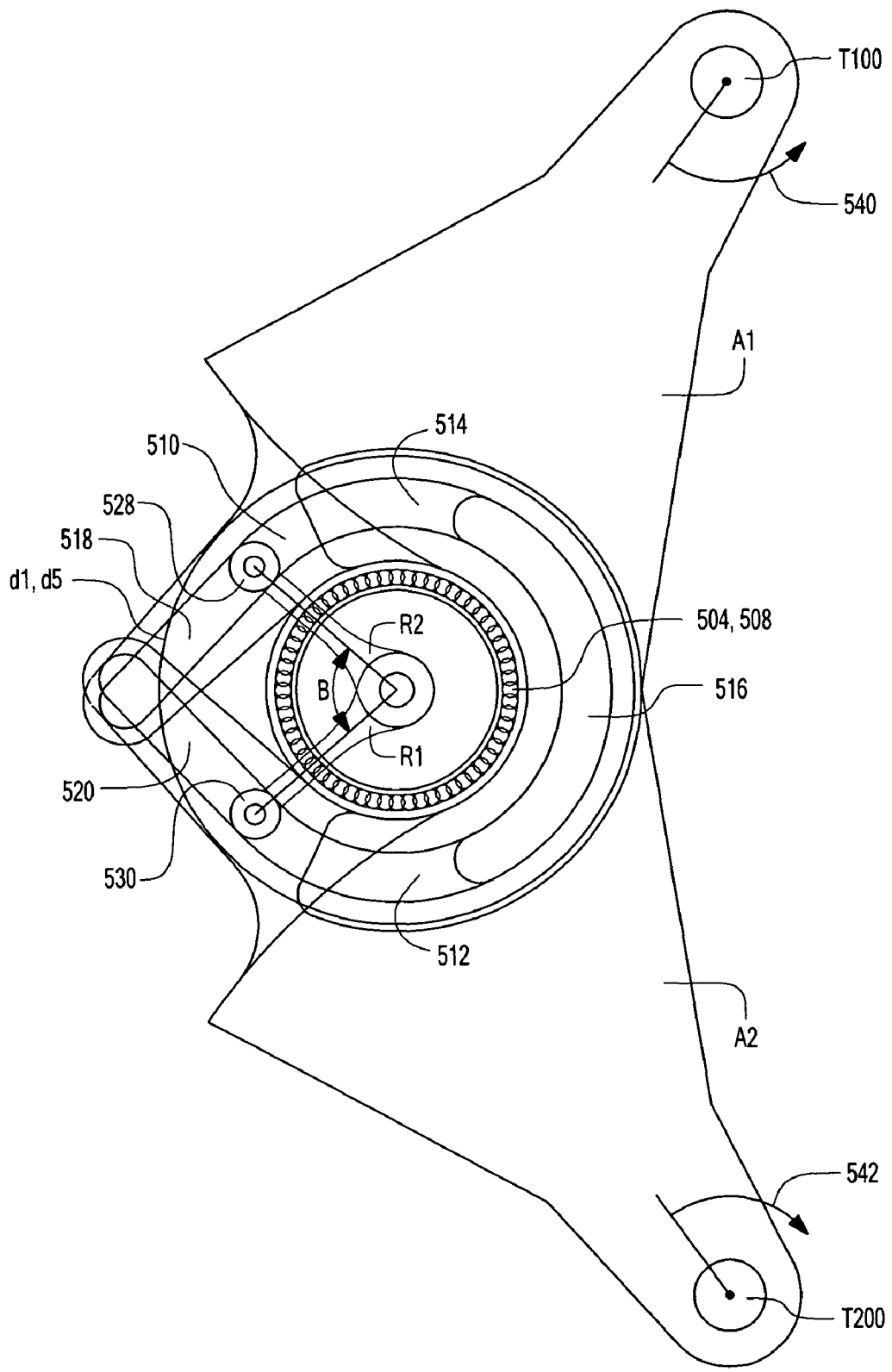
Figure 56E:
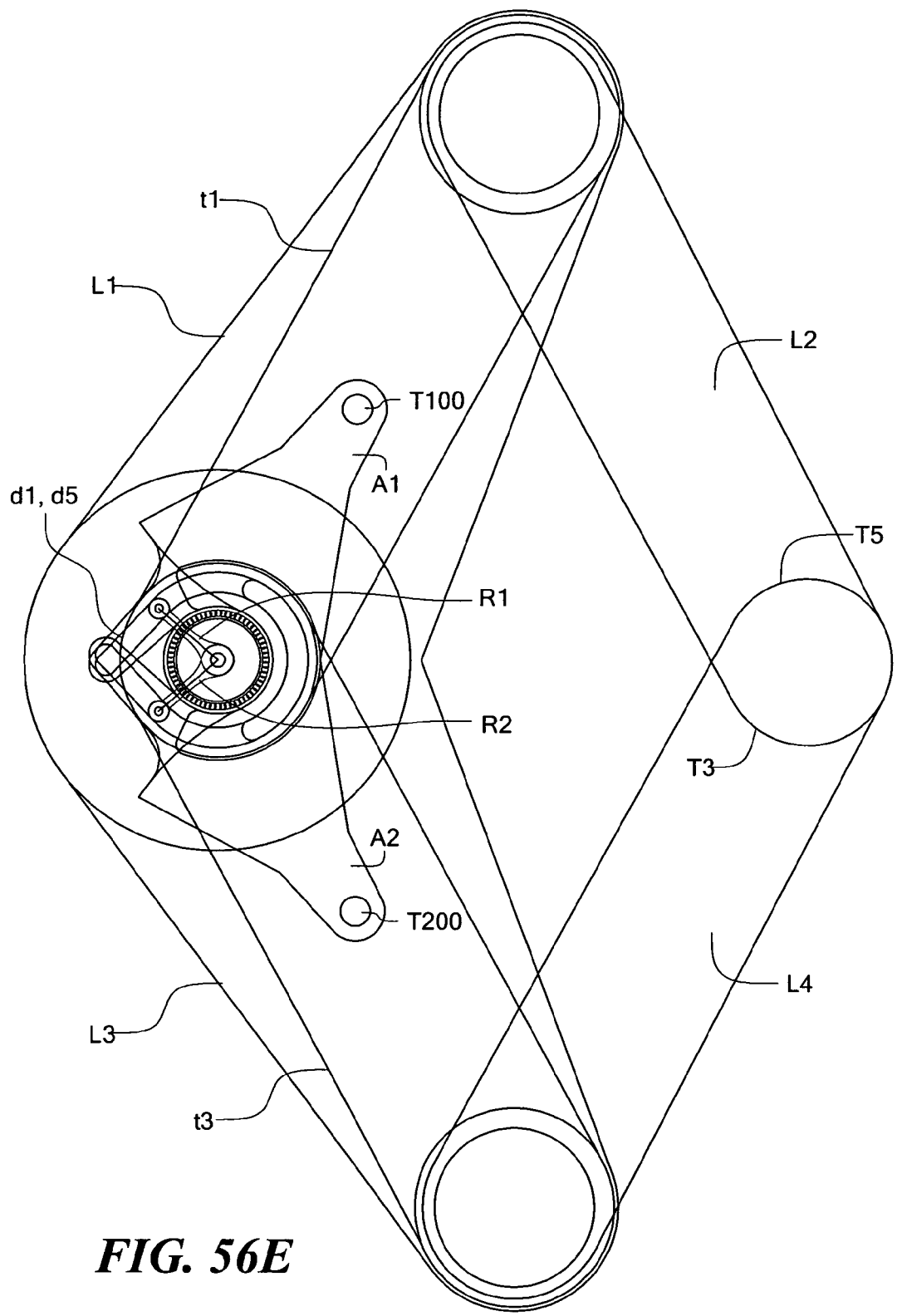
Figure 56F:
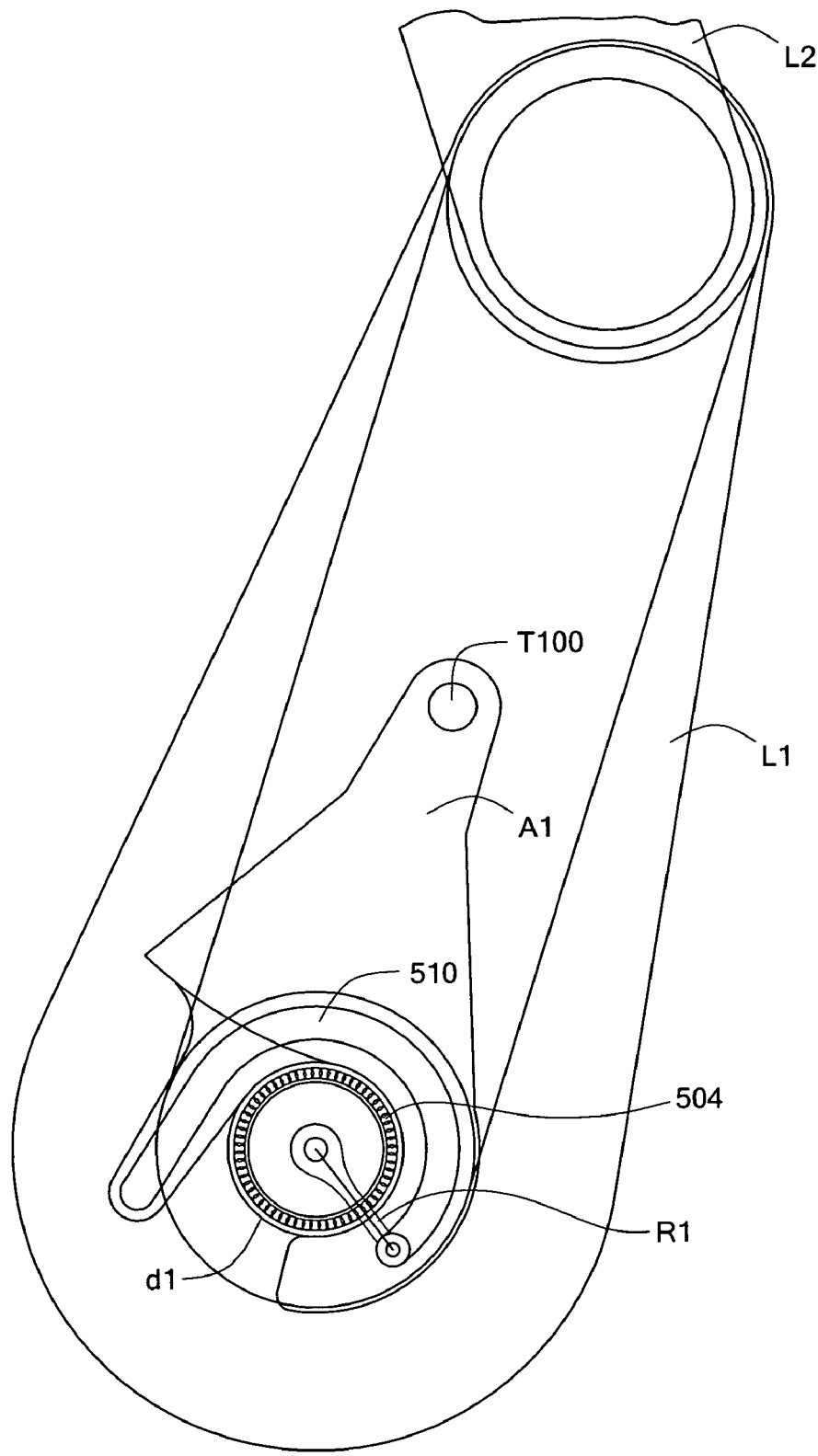
FIGS. 56F-J illustrate motion of the coupling of FIGS. 56A-E when one end effector is extended.
Figure 56G:
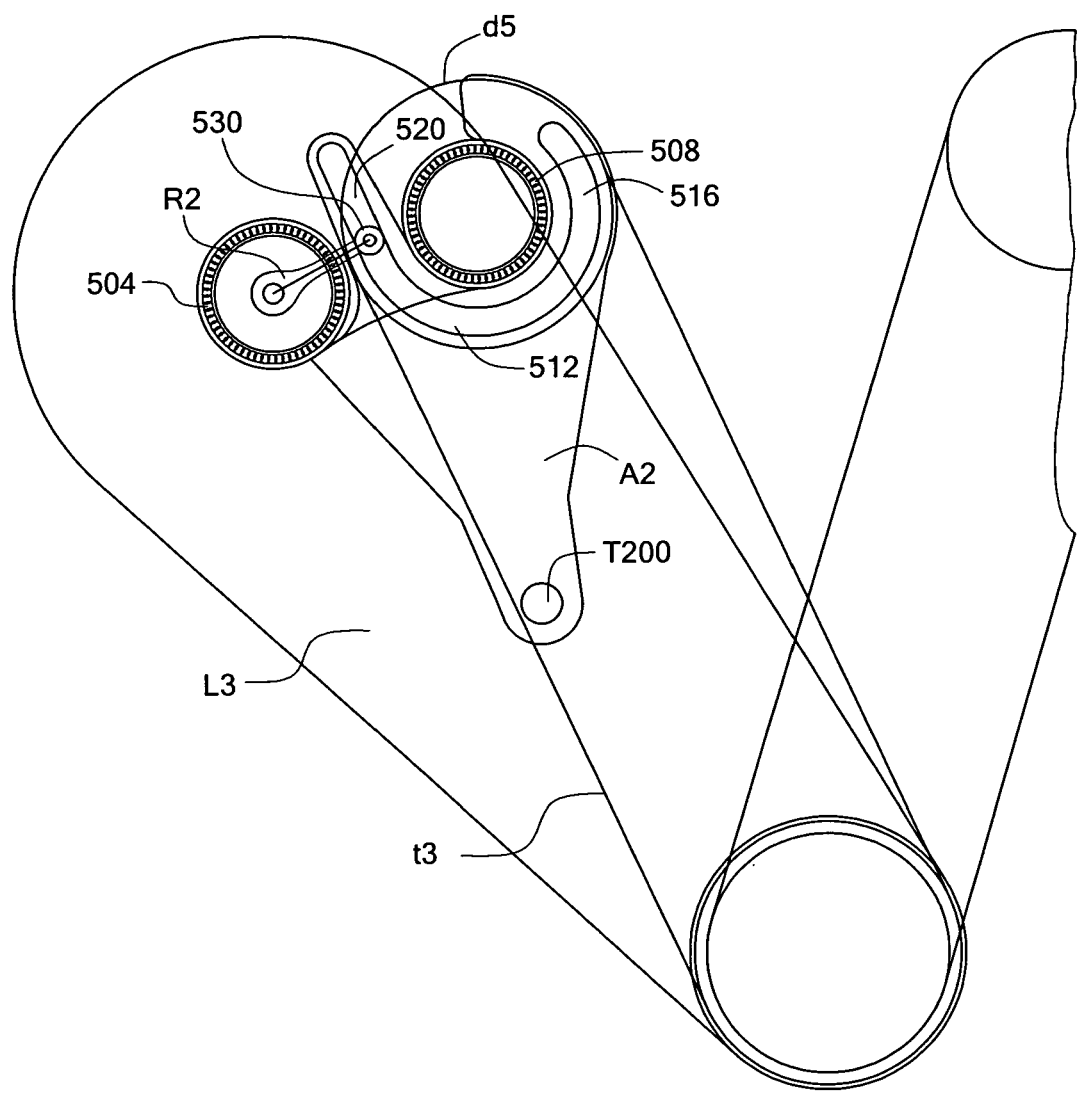
Figure 56H:
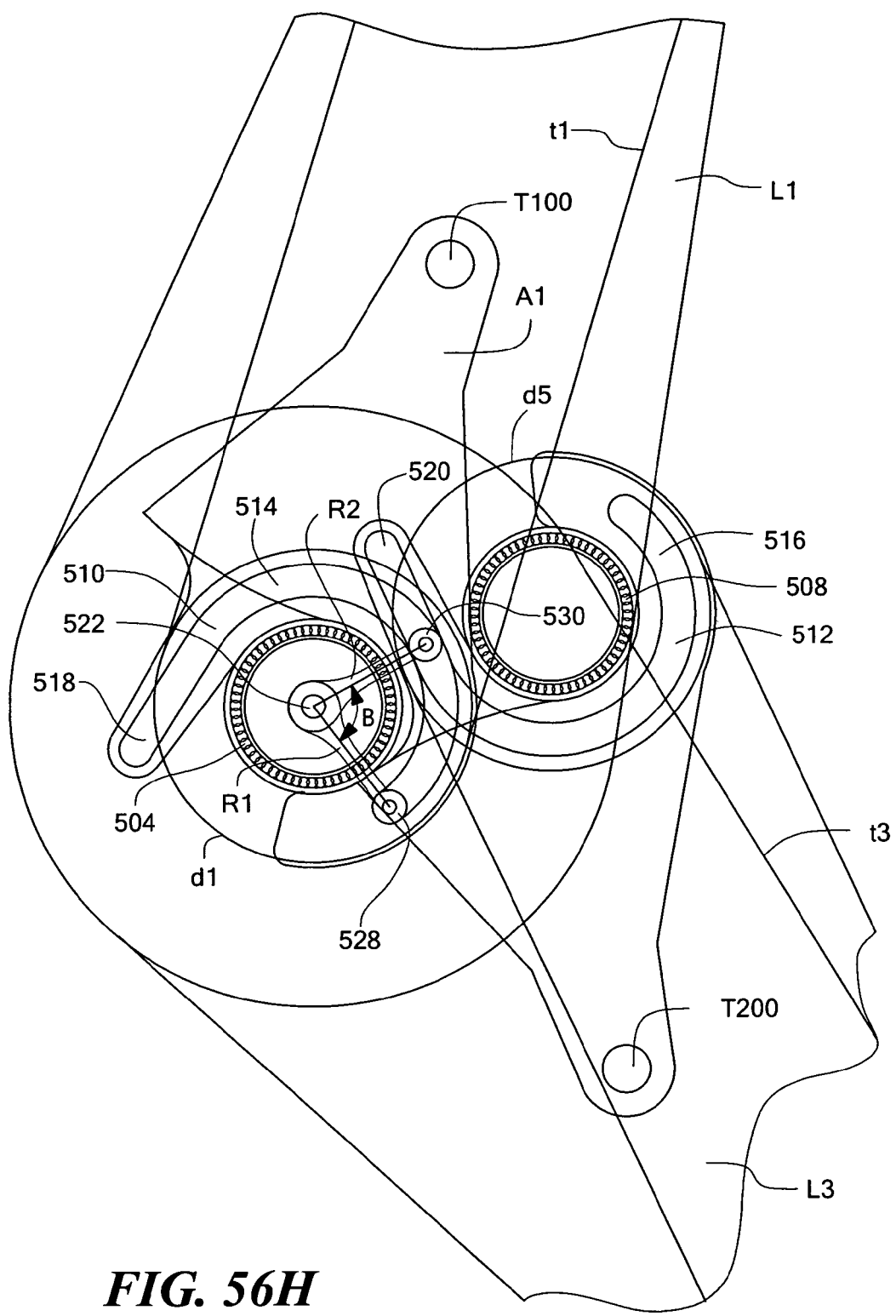
Figure 56I:
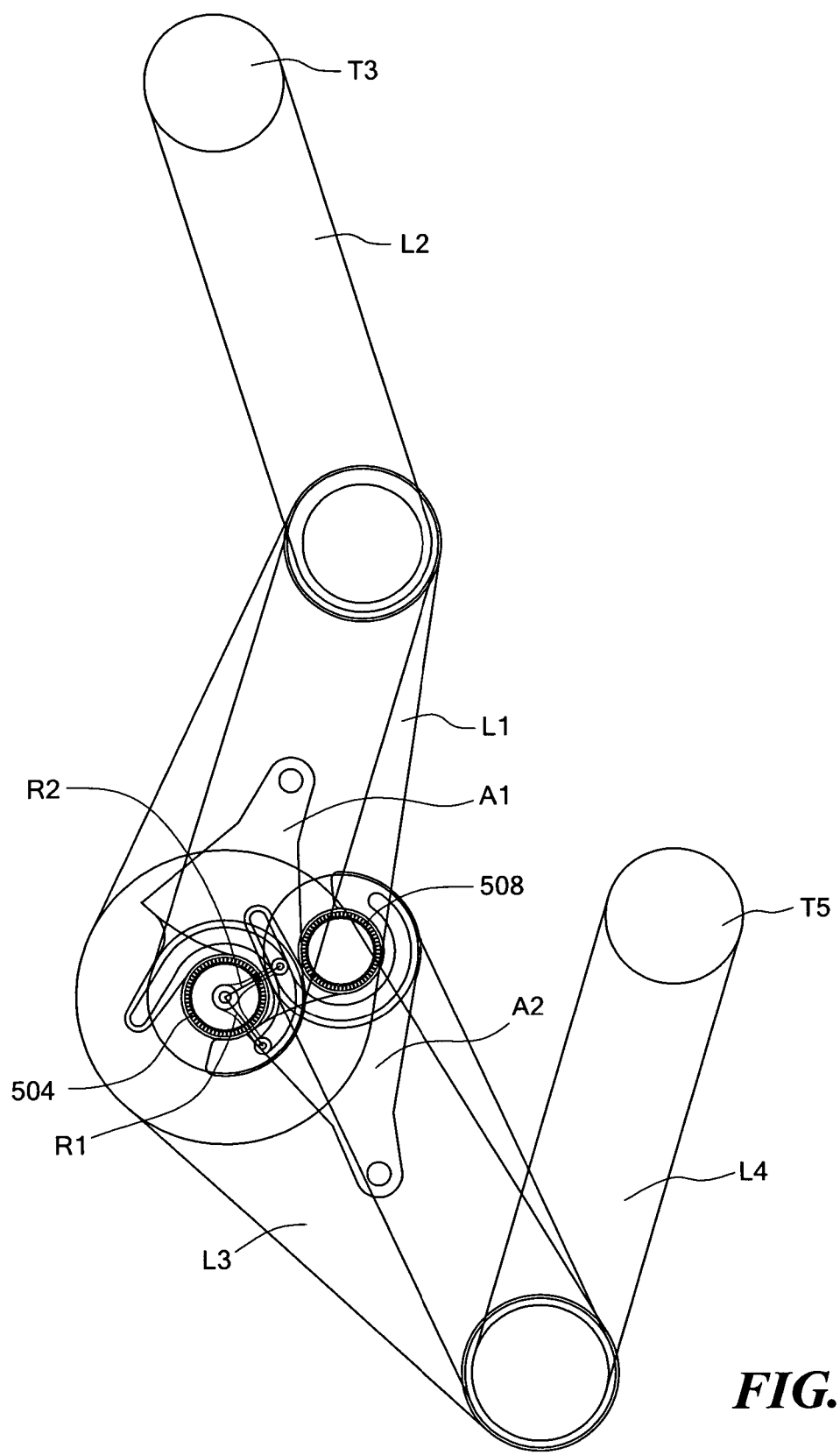
Figure 56J:
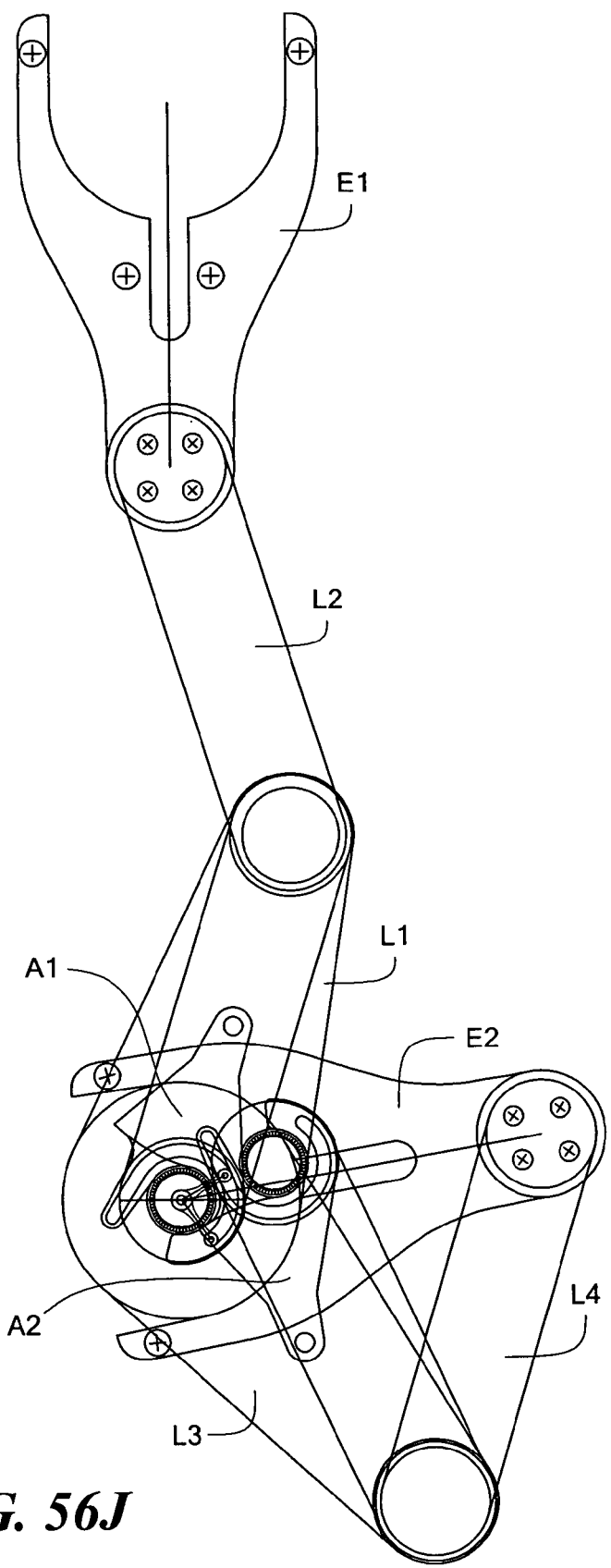

Referring to FIG. 56D, the lever A1 oscillates about the axis of joint T100 only when the coupling R1 rotates counterclockwise with respect to the inner link L1. The rotating roller 528 of the coupling member R1 in this case rides within the linear portion 518 of the slot 510 of the lever A1 and forces the lever A1 to swing in the direction indicated by the arrow 540. Similarly, the lever A2 oscillates about the axis of joint T200 only when the rotating roller 530 of the coupling member R2 rotates clockwise with respect to the inner link L3. The rotating roller of the coupling member R2 in this case rides within the linear portion 520 of the slot 512 of the lever A2 and forces the lever A2 to swing in the direction indicated by the arrow 542.

FIGS. 56F-56J illustrate an example using the co-directional configuration of the end effectors E1 and E2. It can be seen that, when the motor M1 is rotated counterclockwise and the motor M2 is rotated clockwise, the end effector E1 is extended and the end effector E2 rotates, with the lever A2 shifted as illustrated. When E1 extends, the inner link L1 rotates counterclockwise. The lever A1 remains in the same position.

Figure 57:
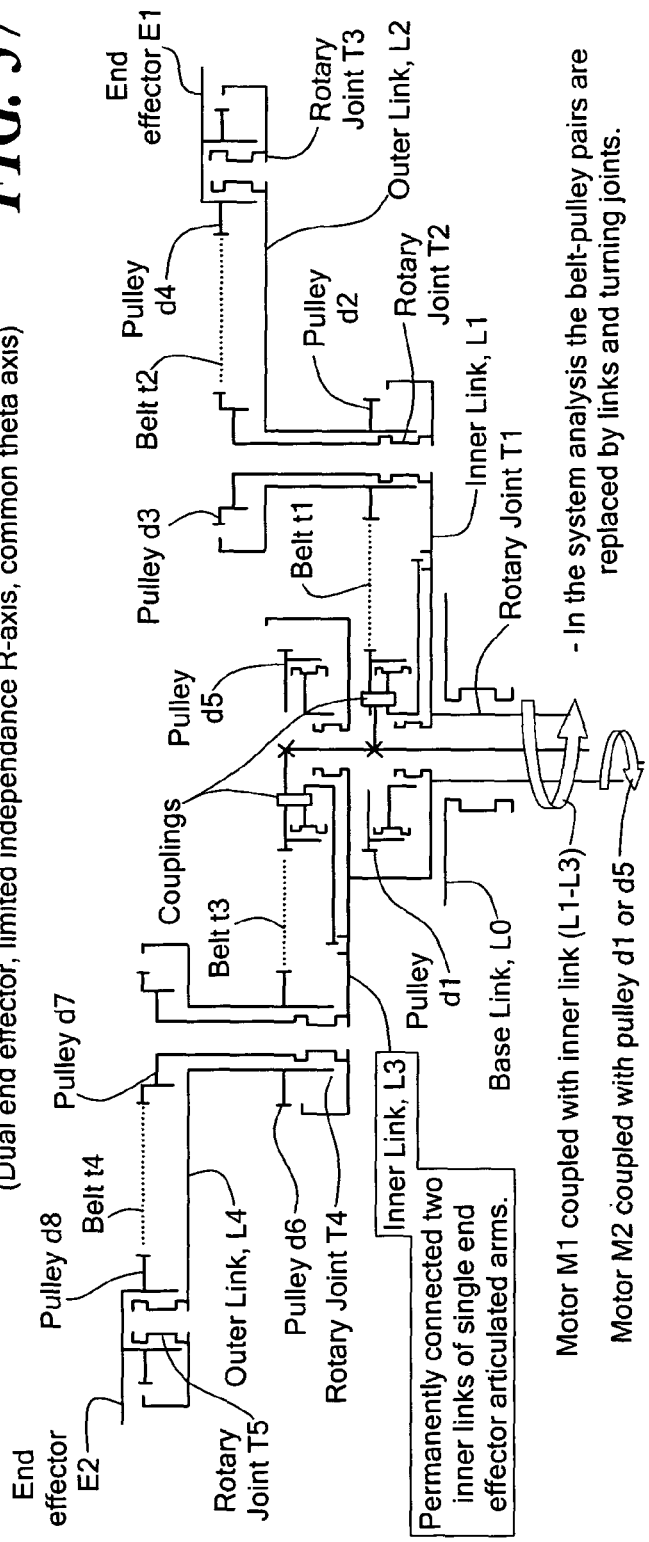
FIG. 57 illustrates conceptually the integration of the coupling of FIGS. 56A-J into a robot assembly.
Figure 58B:
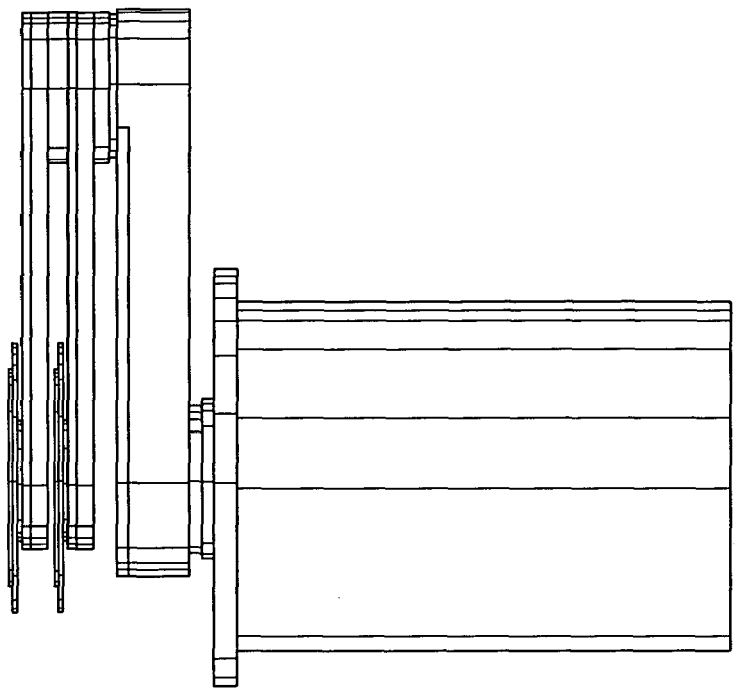
FIG. 58B is a side view of the robot of FIG. 58A.
Figure 58A:
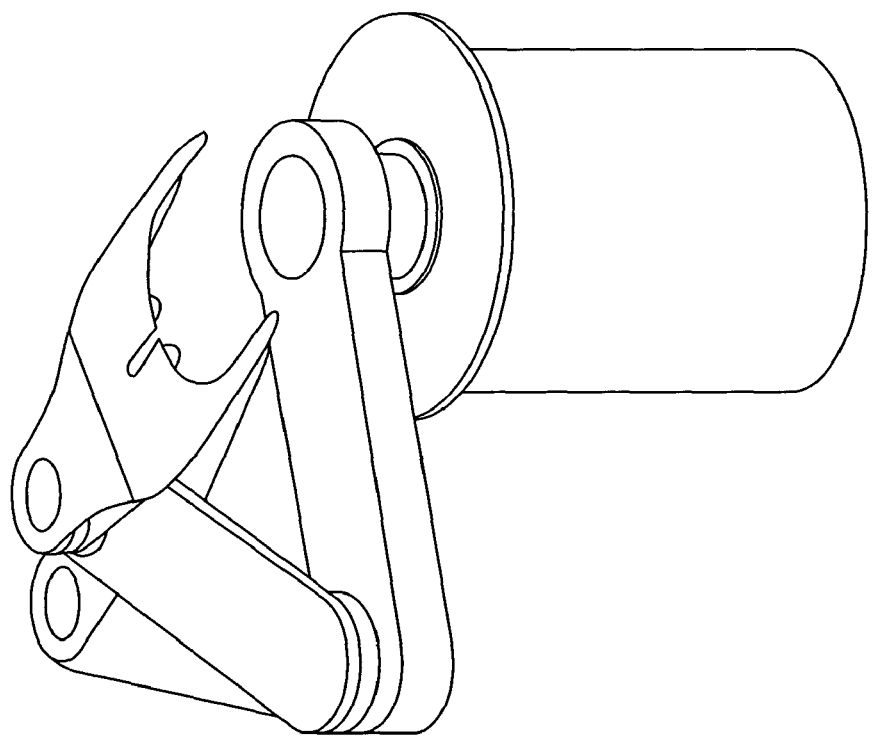
FIG. 58A is an isometric view of a robot assembly having dual end effectors employing two actuators.
Figure 59B:
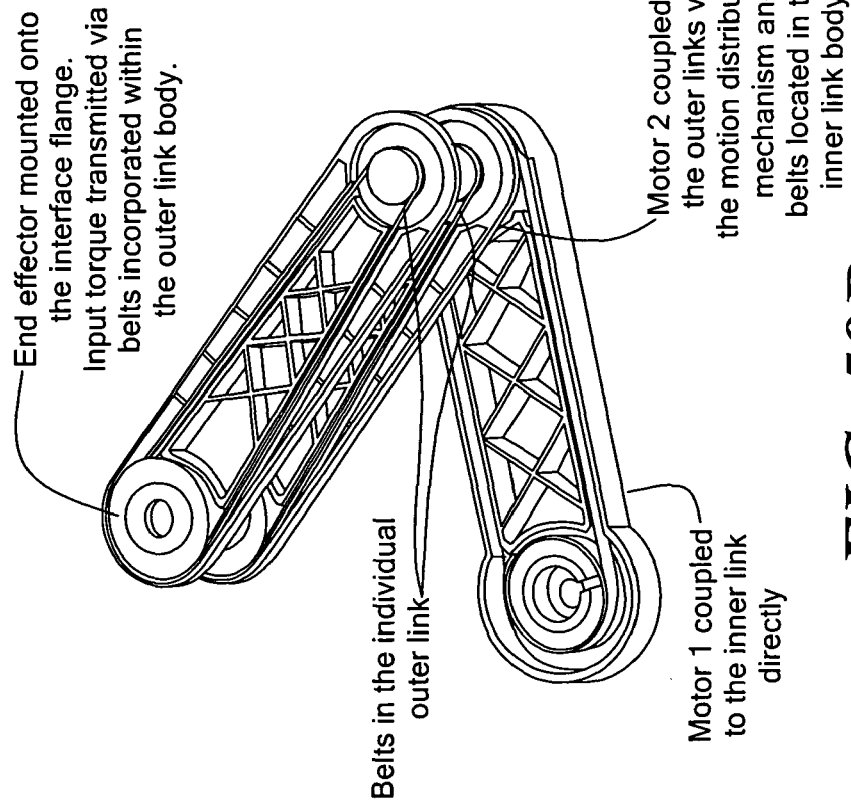
FIG. 59B is a partial view of a limb of the robot of FIG. 59B.
Figure 59A:
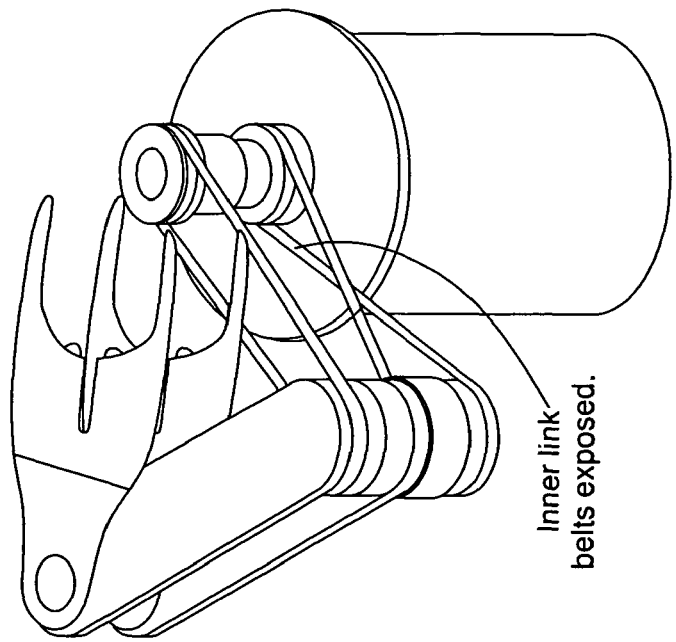
FIG. 59A is a partial view of the robot of FIG. 58A.
Figure 60A:
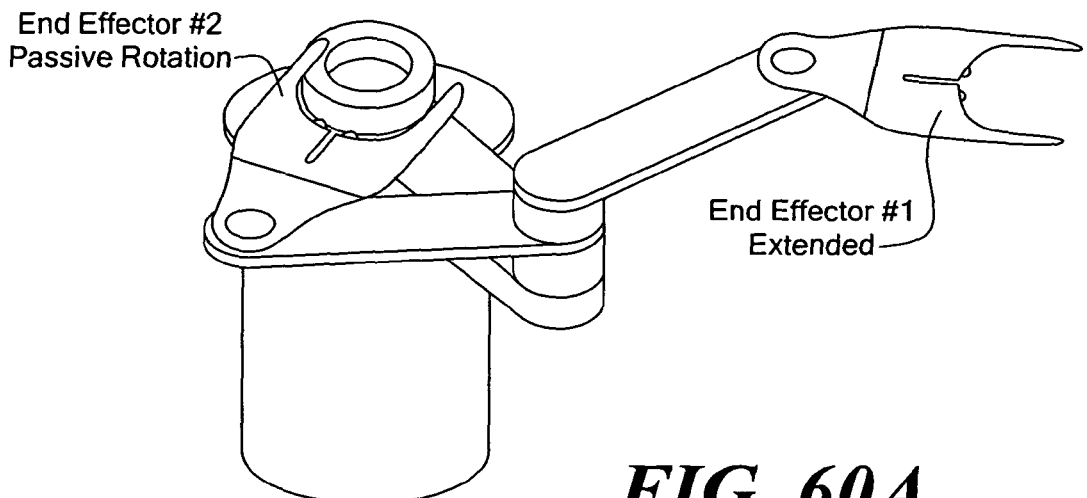
FIGS. 60A and 60B illustrate extensions of one end effector of the robot of FIG. 58A.
Figure 60B:
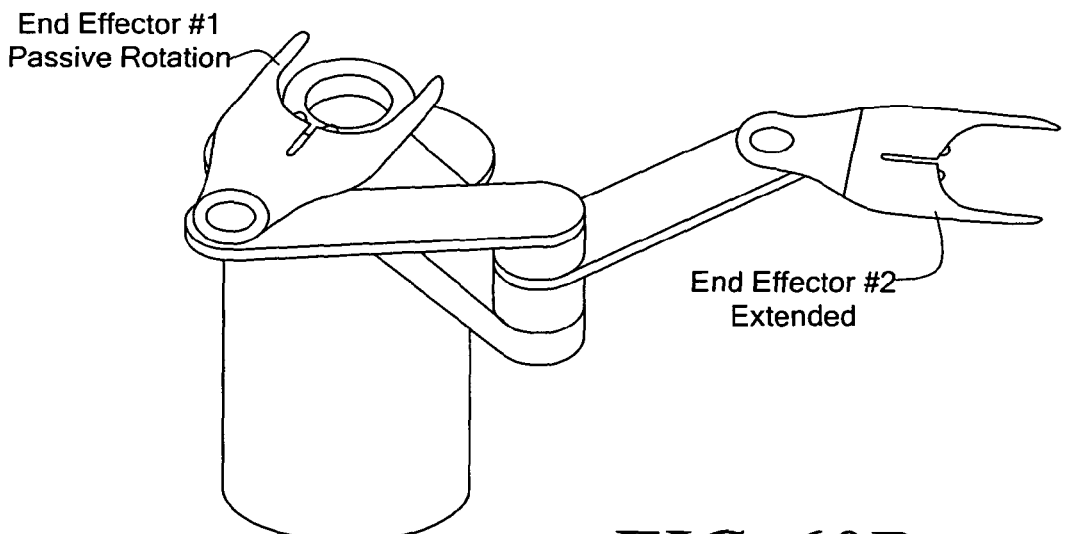

FIG. 57 illustrates conceptually how the couplings are integrated into the robot assembly.

As noted above, the embodiments of this aspect of the invention can function in a modular manner, such that various configurations can be provided by disassembling and reassembling the arms. FIG. 62 illustrates an example in which a dual end effector arm having end effectors in an opposite orientation is transformed into an arm having end effectors in a co-linear orientation.

In a further aspect of the present invention, four end effectors are provided on a dual arm robot. More particularly, two outer links are associated with a single inner link for each limb. The robot according to this aspect can be assembled in a number of embodiments having various degrees of freedom, depending on the number of actuators that are used.

Figure 63D:
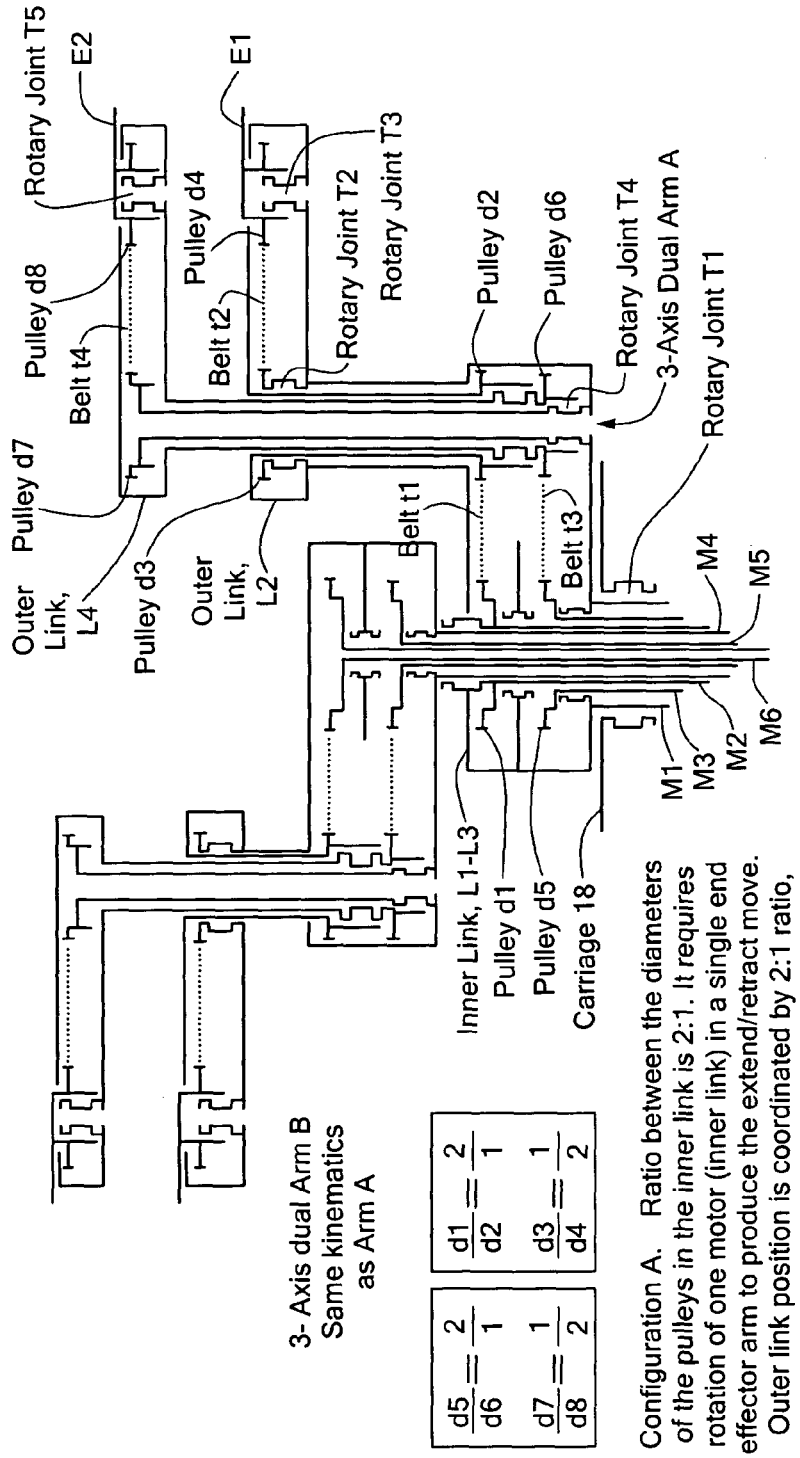
FIG. 63D is a kinematic diagram of the six-axis quadruple end effector robot employing six actuators.
Figure 63E:
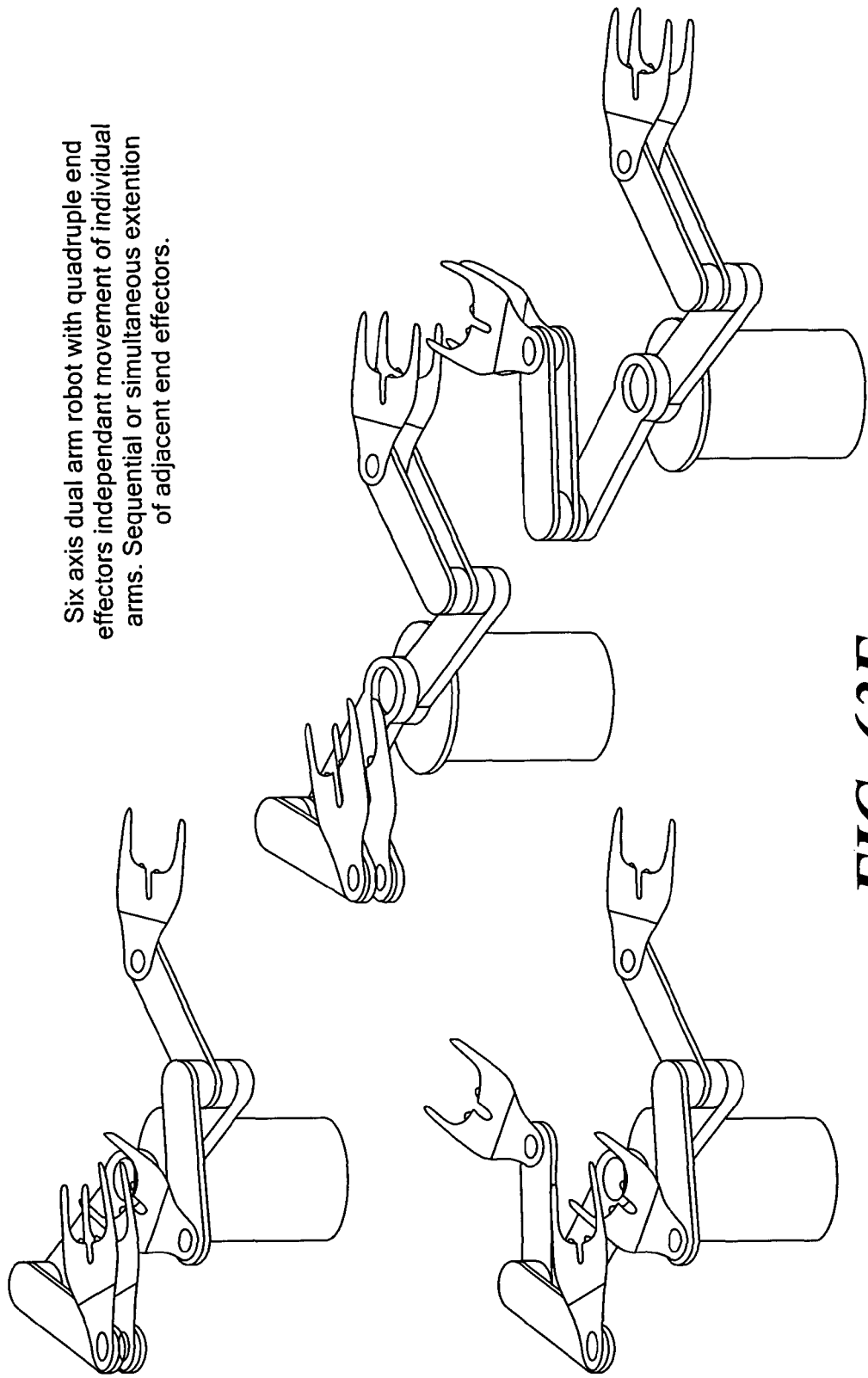
FIG. 63E is a diagram illustrating independent extension of the end effectors of the six-axis robot.
Figure 63F:
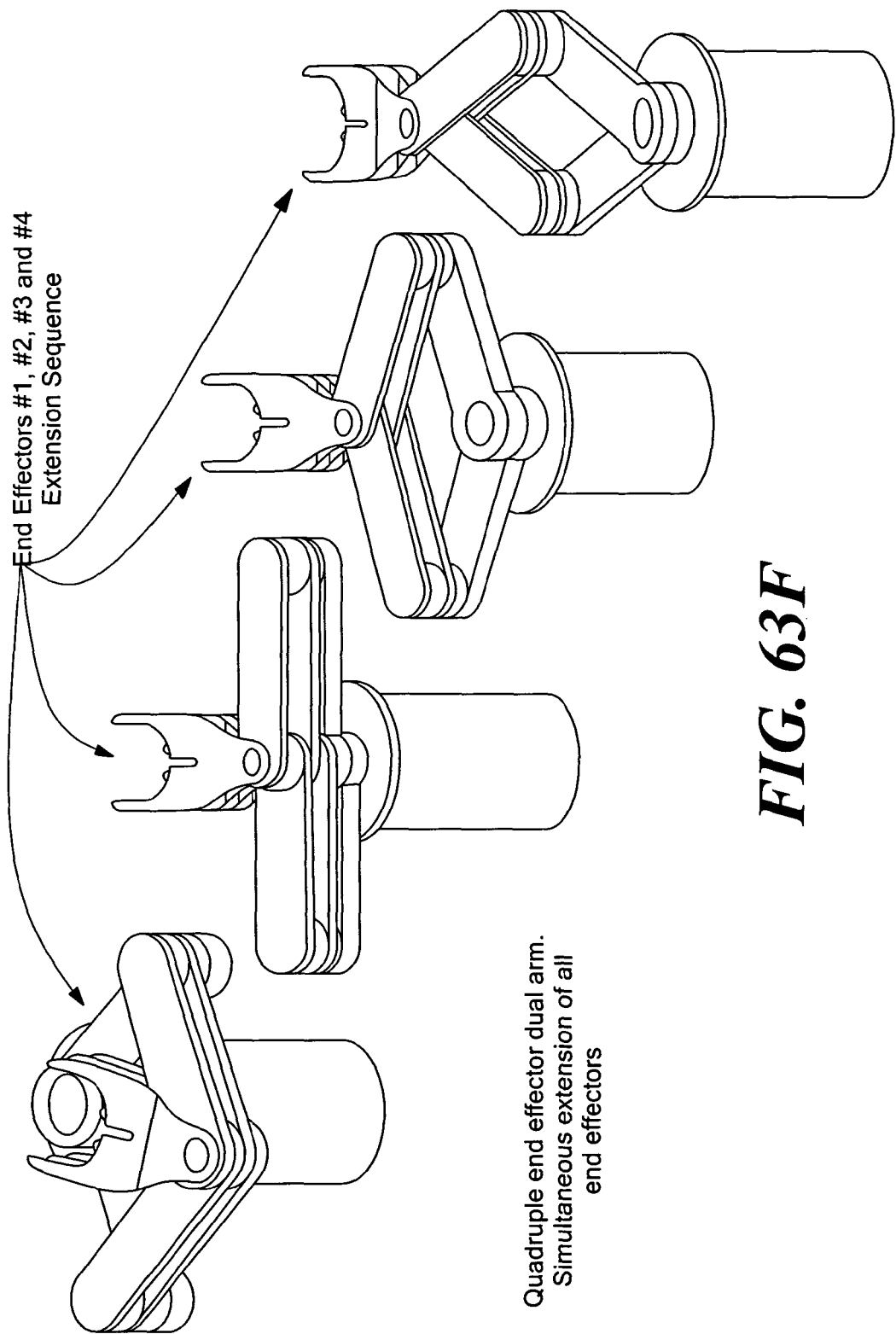
FIG. 63F illustrates a sequence of simultaneous extension of all the end effectors of the six-axis robot.
Figure 64:
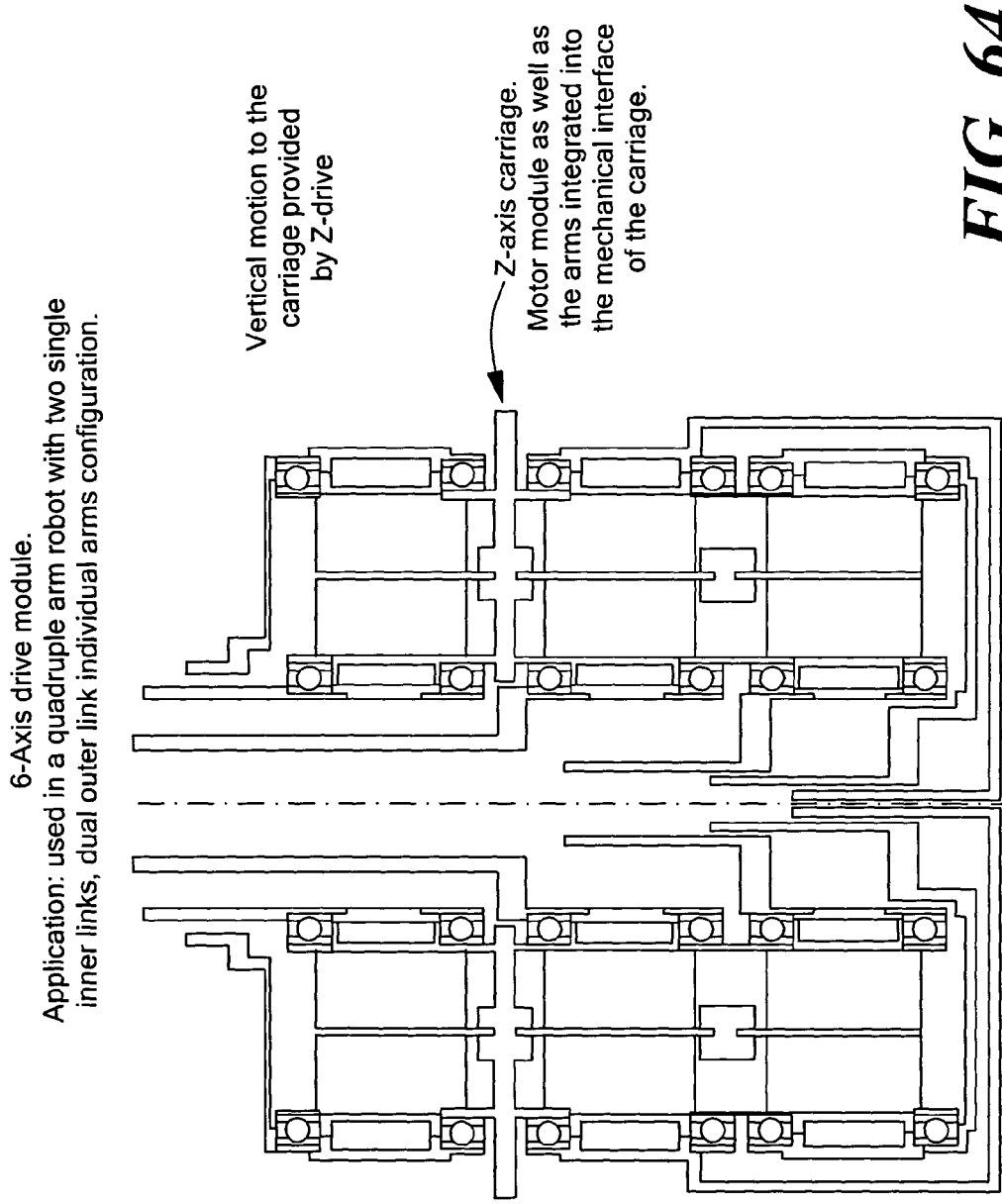
FIG. 64 is a diagram illustrating a six motor drive module for use with the six-axis robot.

FIGS. 63A-64 illustrate an embodiment using six actuators, which may be motors, to provide independent rotation and translation of each end effector. Each arm effectively functions as the three-axis embodiment described above in conjunction with FIGS. 29-33. (As noted above, the vertical or Z-axis is not included in this usage of the term "axis.")

A three-axis embodiment, employing three actuators, is illustrated in FIGS. 65A-75. In this embodiment, the inner links are attached together with a fixed angular relationship. The Geneva-type coupling described above in conjunction with FIGS. 56 and 57 is provided to select the arm to be moved. Thus, extension of one or two end effectors results in passive rotation of the other end effector.

Figure 65A:
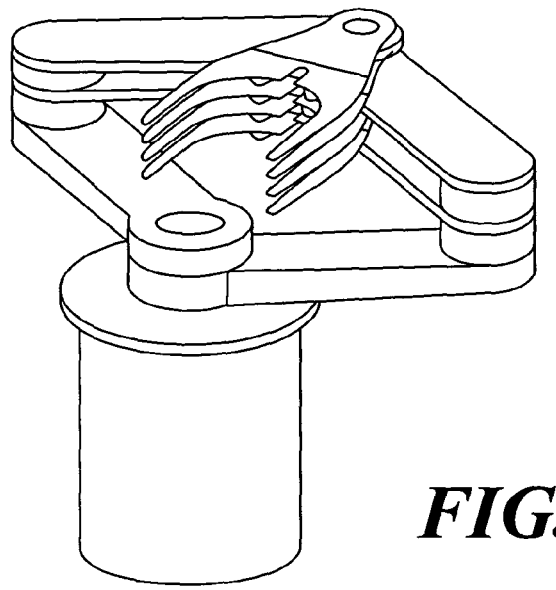
FIG. 65A is an isometric view of a three-axis, quadruple end effector robot assembly with co-linear end effectors.
Figure 65B:
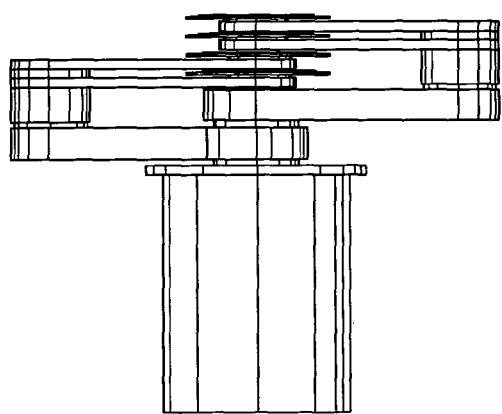
FIG. 65B is a first configuration of the three-axis robot of FIG. 65A.
Figure 65C:
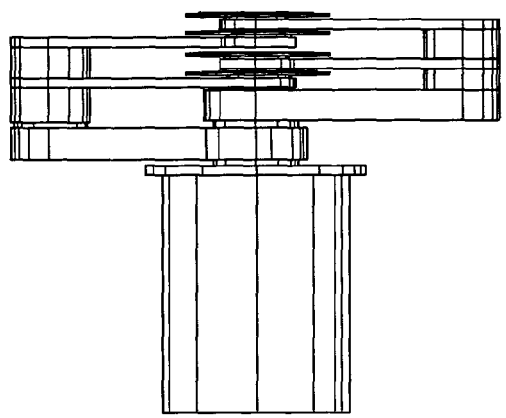
FIG. 65C is a further configuration of the three-axis robot of FIG. 65A.
Figure 65D:
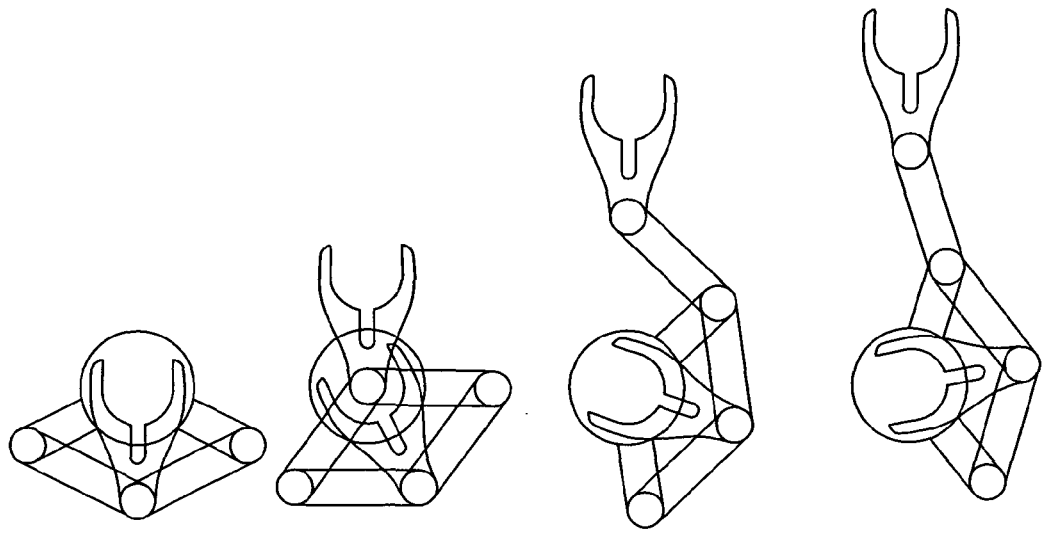
FIG. 65D illustrates an extension sequence of an individual end effector of the three-axis robot of FIG. 65A.
Figure 65E:
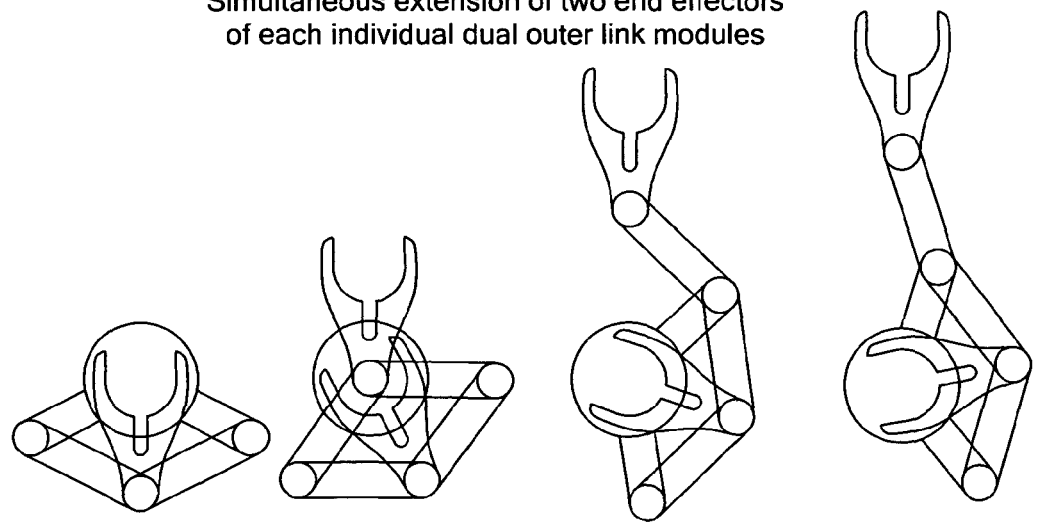
FIG. 65E illustrates a simultaneous extension sequence of two end effectors of each individual dual outer link module.
Figure 66B:
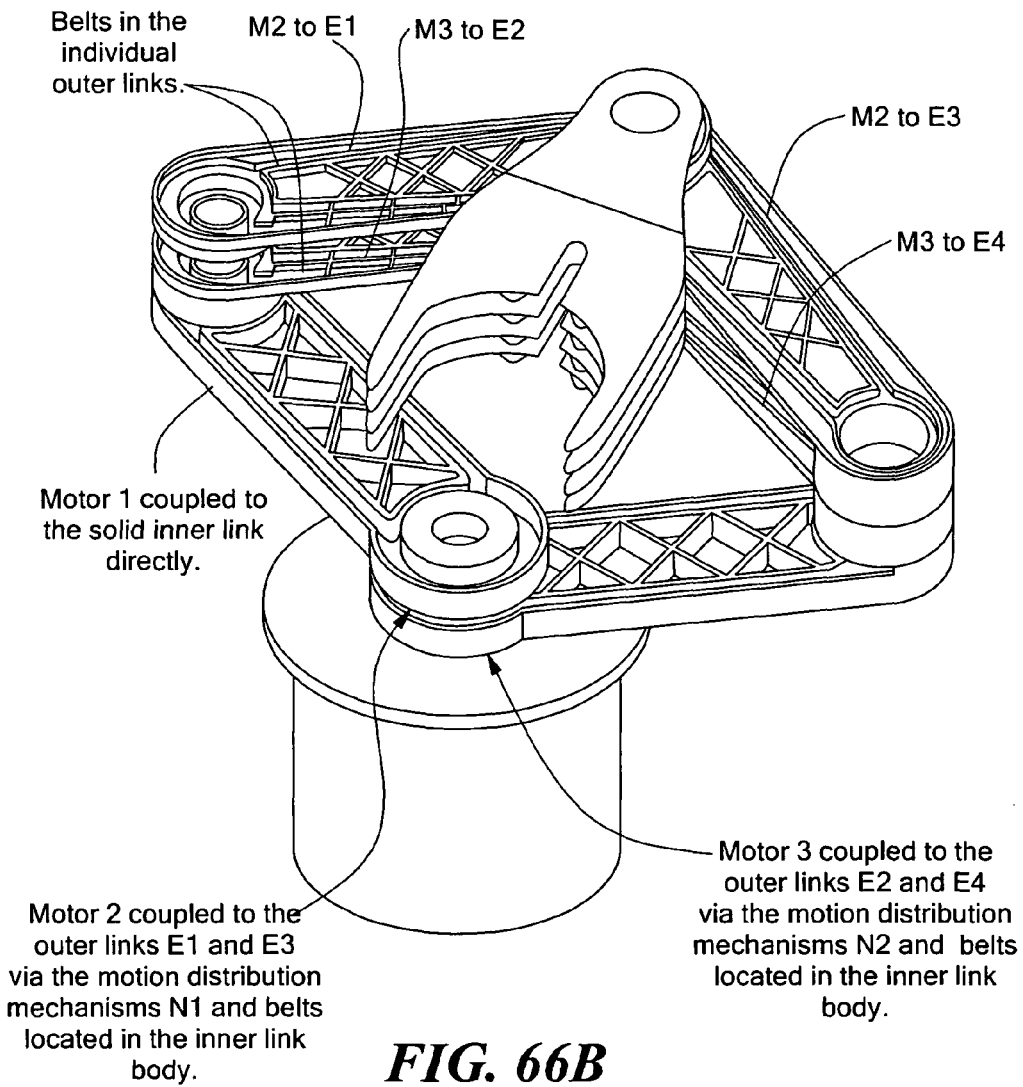
FIG. 66B is a further partial view of the three-axis robot of FIG. 65B.

FIG. 65A illustrates a three-axis embodiment employing quadruple end effectors oriented in the same direction. FIGS. 65B and 65C illustrate two configurations for spacing the end effectors vertically to avoid collisions. FIG. 65D illustrates sequential extension of an individual end effector. FIG. 65E illustrates simultaneous extension of two end effectors associated with the two arms. FIGS. 66A-66B illustrate the control of the various end effectors by three motors, M1, M2, and M3, and FIG. 67 is a table of motions for this configuration.

Figure 68B:
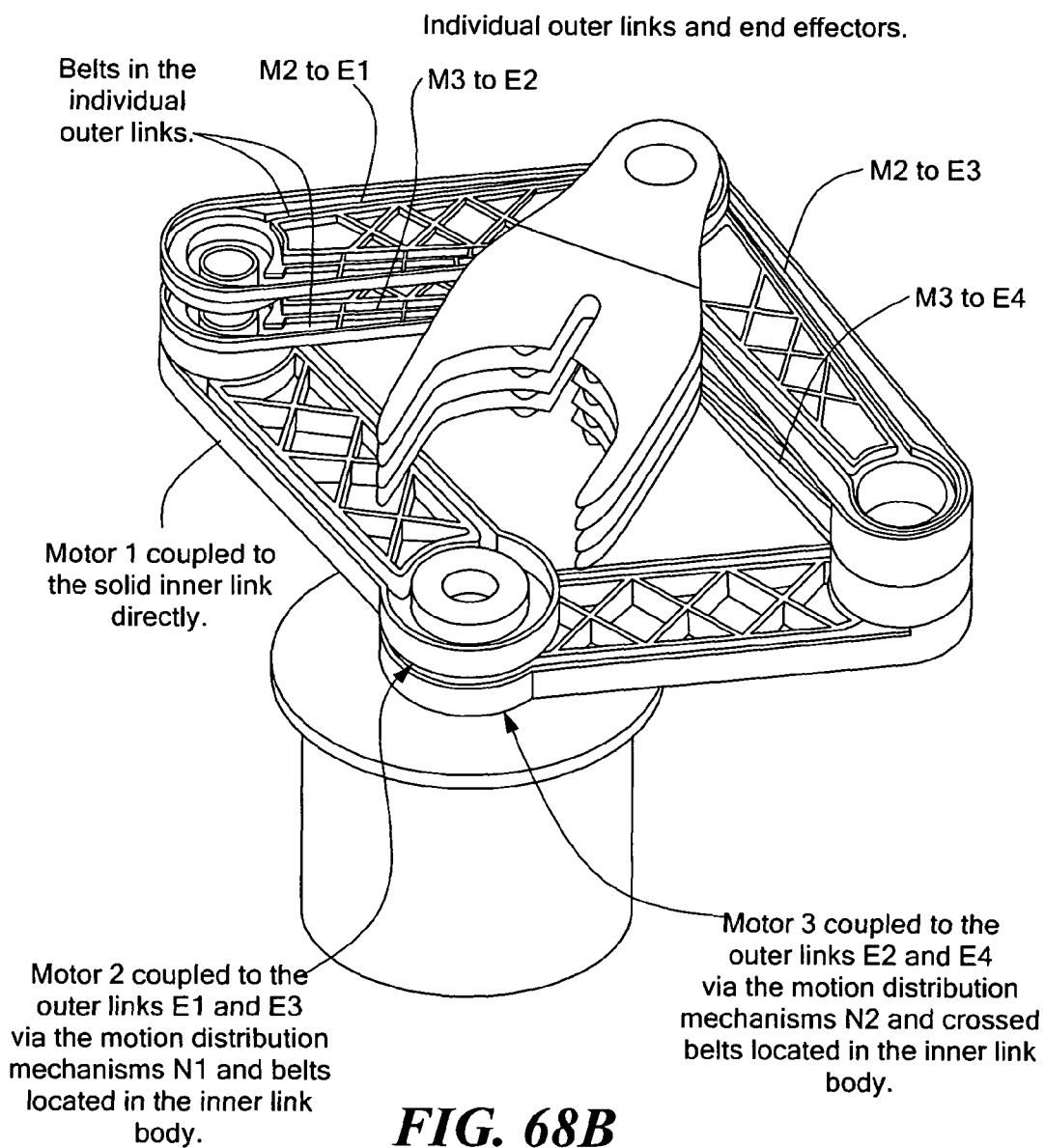
FIG. 68B is a further partial view of the three-axis robot of FIG. 65C.

FIGS. 68A-69 provide similar illustrations for a further three-axis embodiment employing quadruple end effectors oriented in the same direction.

Figure 70:
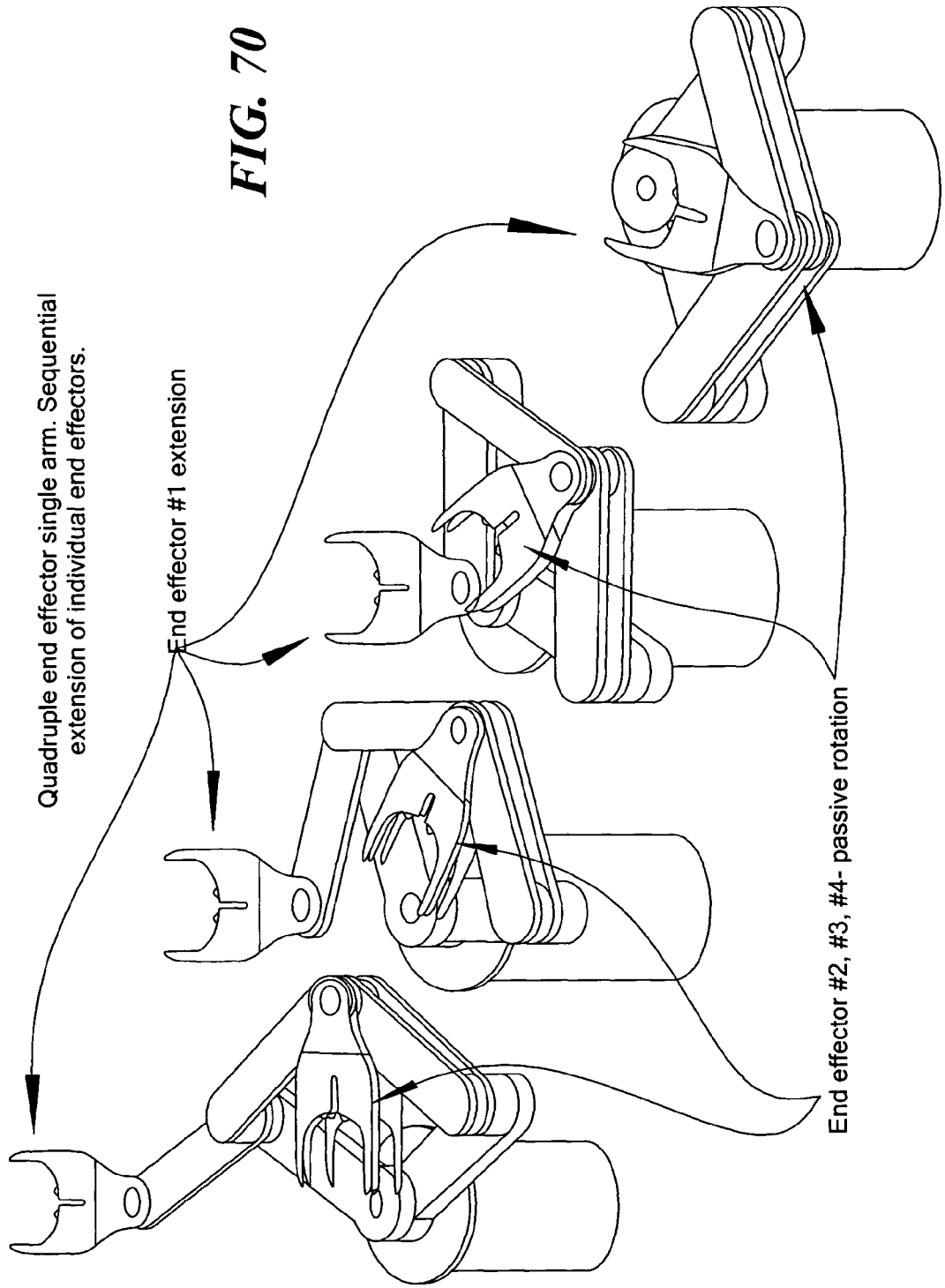
FIG. 70 illustrates an extension sequence of one end effector of the three-axis robot of FIG. 68A.
Figure 71:
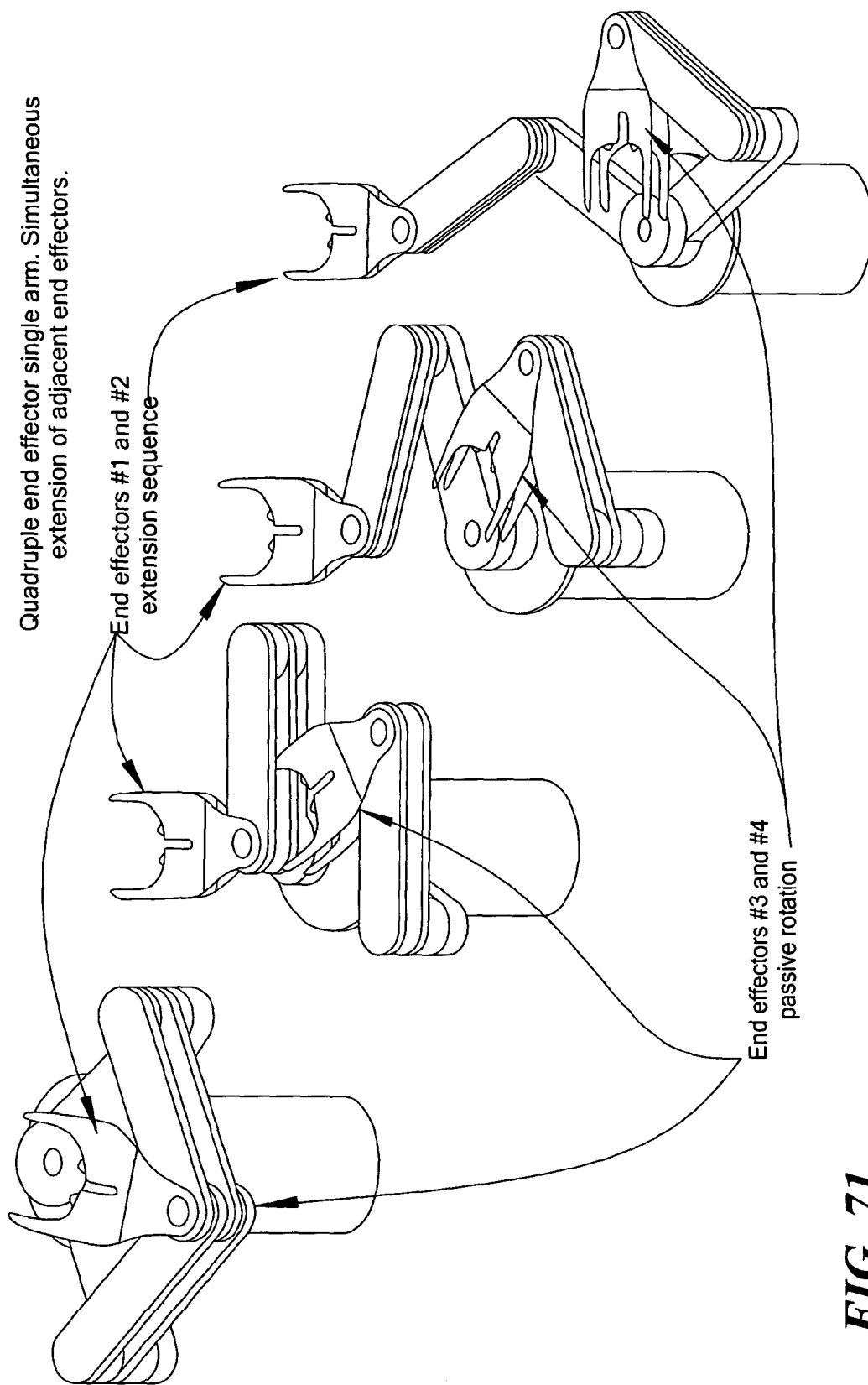
FIG. 71 illustrates an extension sequence for the simultaneous extension of adjacent end effectors for the three-axis robot of FIG. 68A.
Figure 72A:
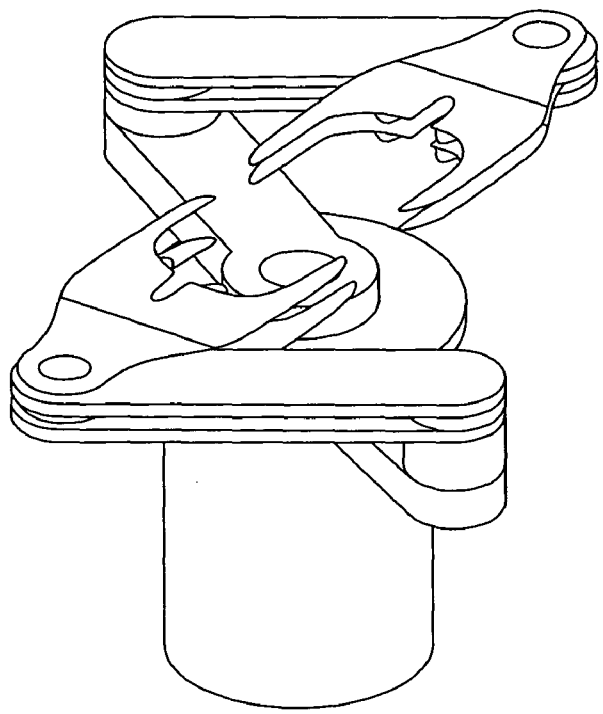
FIG. 72A is an isometric view of a three-axis, quadruple end effector robot assembly with oppositely directed end effectors.
Figure 72B:
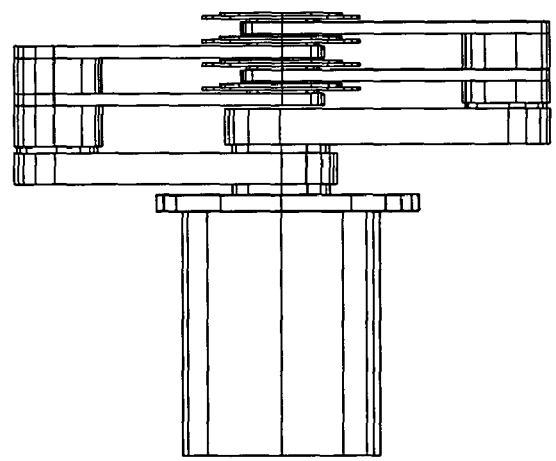
FIG. 72B is a first configuration of the three-axis robot of FIG. 72A.
Figure 72C:
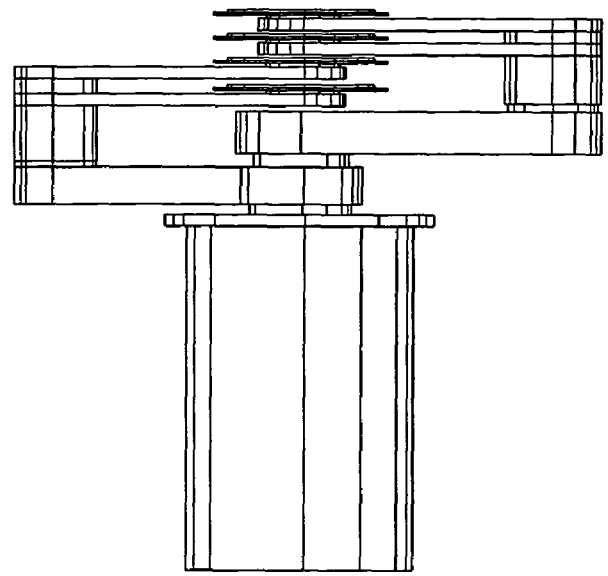
FIG. 72C is a further configuration of the three-axis robot of FIG. 72A.
Figure 72D:
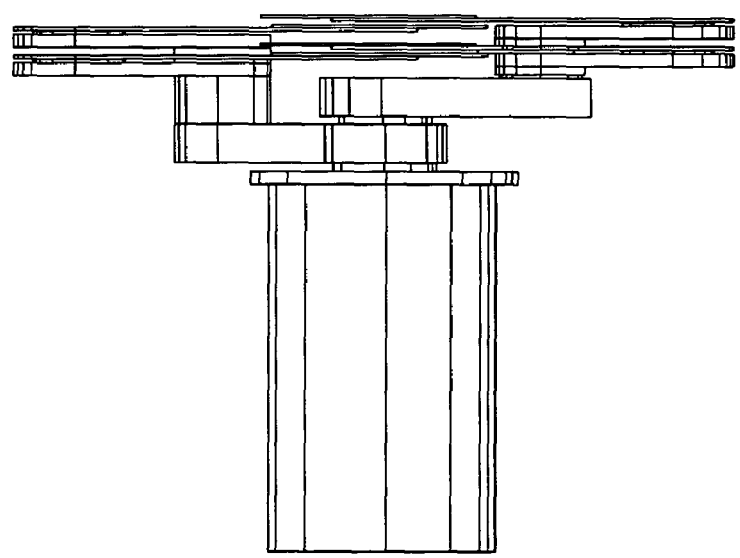
FIG. 72D is a further configuration of the three-axis robot of FIG. 72A.
Figure 73A:
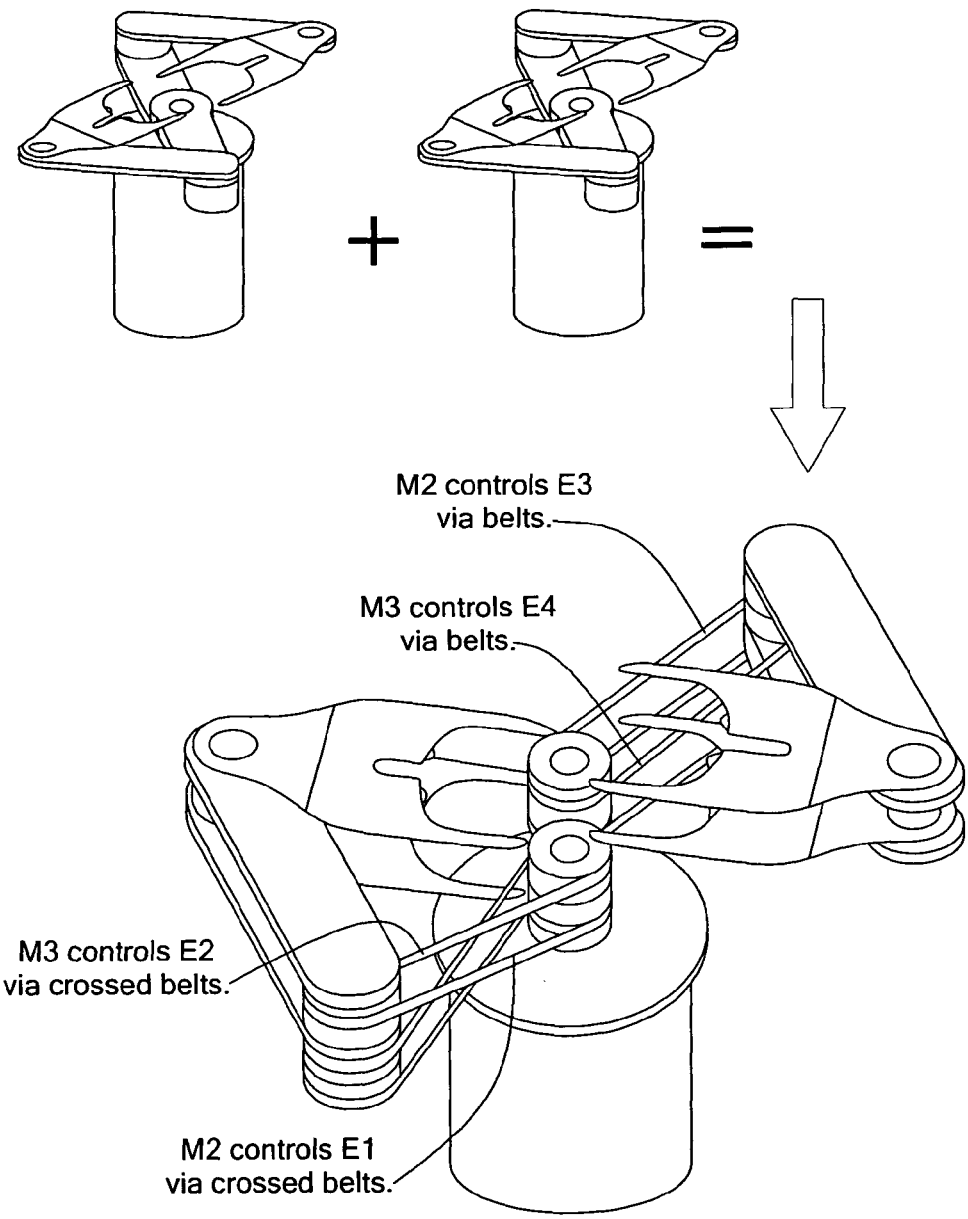
FIG. 73A is a partial view of the three-axis robot of FIG. 72A.
Figure 73B:
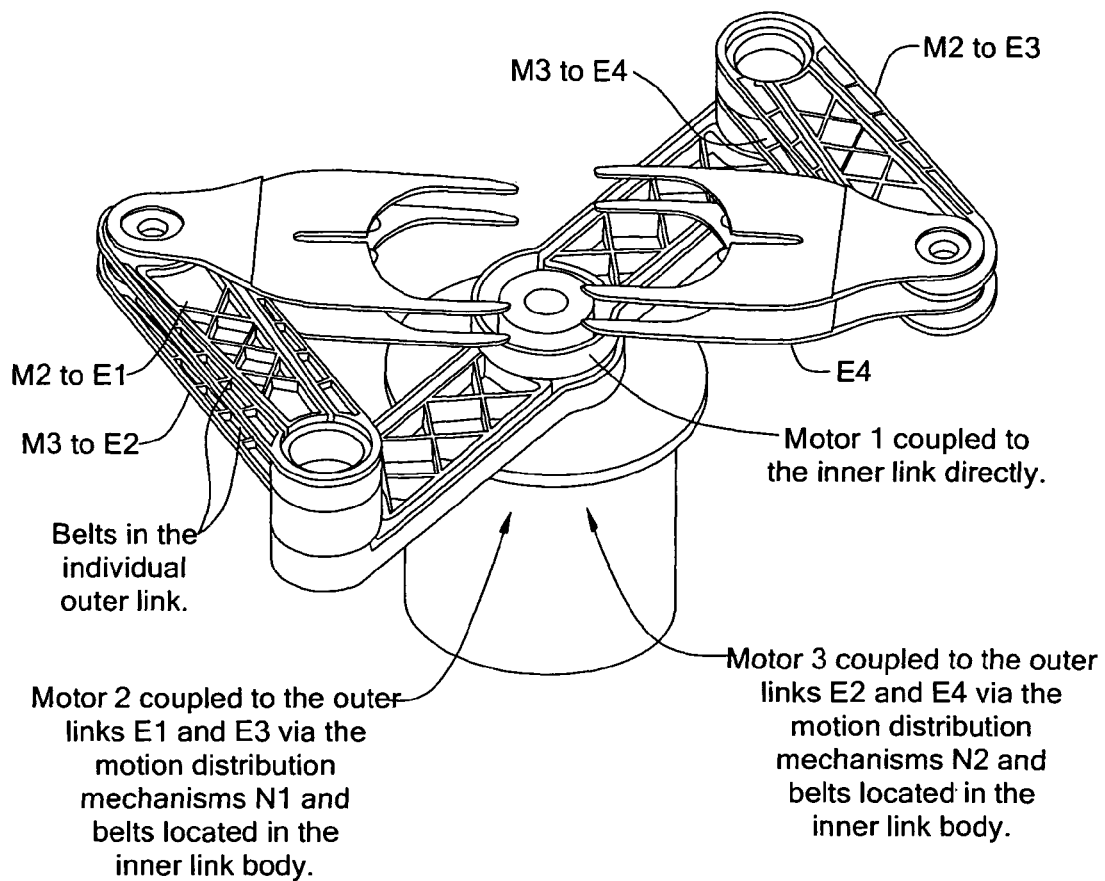
FIG. 73B is a further partial view of the three-axis robot of FIG. 72A.

FIG. 70 illustrates an extension sequence for a single end effector in a three-axis embodiment. FIG. 71 illustrates an extension sequence for the simultaneous extension of adjacent end effectors for a three axis embodiment.

FIGS. 72A-74 illustrate a further three-axis embodiment in which the pairs of end effectors are oriented in opposite directions.

FIG. 75 illustrates more particularly a three-axis drive module.

The robot assembly includes a suitable controller in communication with the motors. The robot controller is a control circuit in the form of a general purpose computer. The computer includes a set of input/output devices, such as a keyboard, mouse, monitor, printer, and the like, to interface with the robot. Control signals to and from the robot are exchanged through the input/output devices. The control signals include vacuum sensor signals from a vacuum sensor, if present, and sensed object signals from an object sensor, if present. These signals are passed to the central processing unit (CPU) over a bus. The bus is also connected to a memory (e.g., RAM, disc memory or the like), allowing the CPU to execute programs stored within the memory. The memory preferably stores a substrate loading sequence controller program, a vacuum signal interpreter program, if necessary, and a motion control unit program. Suitable operation of a computer in connection with input/output devices, a CPU, and a memory can be understood by those of skill in the art.

The dual arm robot of the present invention is particularly suitable for increasing throughput of wafers in a vacuum transport module. In the vacuum transport module, wafers are retained on the robot's end effectors by friction force alone. Thus, the acceleration of the wafer during robot rotation and arm extension is limited by the amount of the coefficient of friction of the end effector's pad material. In low temperature applications, materials such as VITON, KALREZ and red silicone compound are used. In high temperature applications, ceramics and quartz are used. In any event, the friction force limits the wafer's total transfer time, preventing full utilization of a prior art, single arm robot's ability to transfer wafers quickly. The dual arm robot of the present invention does not require rotation of the robot by 180° when wafers are swapped in the process module. Once the wafer is picked up from the stage located in the process module by one of the arms and retracted into the central transfer chamber, the other arm extends and places the next wafer onto the stage of the process module. The sequence can be used when the wafers are transferred from the load locks into the transport chamber. If each revolute joint of the links of the arms is independently controlled by its actuator, two load locks, or one load lock and a process station, or two process stations of a cluster tool can be served simultaneously, while still allowing for slower accelerations and transfer speed.

Many variations of the present invention are possible. For example, the end effectors may be a single paddle end effector or a double paddle end effector. Double paddle end effectors allow for a reduction in time by approaching an object on an opposite side of the polar coordinate system by reversing the direction of movement of the arm assembly. The paddles of a double paddle end effector may be identical or different, depending on the intended application.

The actuator mechanism may be connected directly to the link, such as with a motor driven pulley and belt, or through a mechanical transmission, if one or more output characteristics of the actuator mechanism, such as force, torque, speed, resolution, etc., are to be changed, depending on the performance required. The particular mechanism used is not critical, and those of skill in the art will appreciate that any actuator configuration may be used.

The invention is not to be limited by what has been particularly shown and described, except as indicated by the appended claims.

What is claimed is:

1. A robot assembly for manipulating one or more substrates, comprising:
   a first arm and a second arm supported by a column;
   the first arm comprising a first limb, the first limb comprising a first set of three revolute joint/link pairs serially connected in an open kinematic chain to provide translation and rotation of a distalmost link of the first limb in a horizontal plane;
   the second arm comprising a second limb, the second limb comprising a second set of three revolute joint/link pairs serially connected in an open kinematic chain to provide translation and rotation of a distalmost link of the second limb in a horizontal plane;
   the first limb and the second limb having proximal revolute joints having a common vertical axis of rotation;
   an actuator assembly coupled to the first set of revolute joint/link pairs and to the second set of revolute joint/link pairs to effect rotation and translation of the distalmost links of the first limb and the second limb, the actuator assembly comprising:
      four hollow shafts concentrically disposed about the common vertical axis of rotation,
      first and second motors operatively coupled to a most proximal joint/link pair of the first set of revolute joint/link pairs of the first arm and to an outermost two of the hollow shafts,
      the first and second motors being arranged so that an outer perimeter of a stator of the first motor is concentric with an outer perimeter of a stator of the second motor to form a first motor module where the first and second motors are arranged concentrically to the outermost two of the hollow shafts,
      third and forth motors operatively coupled to a most proximal joint/link pair of the second set of revolute joint/link pairs of the second arm and to an innermost two of the hollow shafts,
      the third and fourth motors being arranged so that an outer perimeter of a stator of the third motor is concentric with an outer perimeter of a stator of the fourth motor to form a second motor module where the third and fourth motors are arranged concentrically to the innermost two of the hollow shafts where the first motor is radially nested with the second motor and the third motor is radially nested with the fourth motor, and
      the second motor module being disposed below the first motor module in a motor package enclosure; and
   the first limb and the second limb defining, in conjunction with the actuator assembly, four degrees of freedom, whereby the distalmost links of the first limb and the second limb are independently horizontally translatable for extension and retraction, the first limb and the second limb are independently rotatable over the common vertical axis of rotation, and the distalmost joints of the first and second limbs are radially translatable along a radial horizontal line extending over the common vertical axis of rotation.

2. The assembly of claim 1, wherein the first arm and the second arm further comprise a shared prismatic joint and link configured to provide vertical displacement.

3. The assembly of claim 2, wherein the prismatic joint and link are supported by the column.

4. The assembly of claim 2, wherein the prismatic joint and link are rotatably mounted on a supporting surface.

5. The assembly of claim 2, wherein the prismatic joint and link are fixedly mounted on a supporting surface.

6. The assembly of claim 1, wherein the distalmost link of the first set of revolute joint/link pairs comprises a first end effector mounting flange and the distalmost link of the second set of revolute joint/link pairs comprises a second end effector mounting flange, the first set of revolute joint/link pairs and the second set of revolute joint/link pairs configured to vertically offset the first end effector mounting flange from the second end effector mounting flange.

7. The assembly of claim 1, wherein the first set of joint/link pairs of the first limb comprises a first shoulder revolute joint and a first inner link, a first elbow revolute joint and a first outer link, and a first wrist revolute joint and a first end effector mounting flange, the first end effector mounting flange comprising the distalmost link of the first limb; and wherein the second set of joint/link pairs of the second limb comprises a second shoulder revolute joint and a second inner link, a second elbow revolute joint and a second outer link, and a second wrist revolute joint and a second end effector mounting flange, the second end effector mounting flange comprising the distalmost link of the second limb.

8. The assembly of claim 7, wherein the first and second motors are coupled to the first shoulder joint and to the first inner link respectively, and the third and forth motors are coupled to the second shoulder joint and to the second inner link respectively.

9. The assembly of claim 7, wherein the first inner link comprises a belt fixed for travel about a first pulley at the shoulder joint and a second pulley at the elbow joint, and the first outer link comprises a belt fixed for travel about a third pulley at the elbow joint and a fourth pulley at the wrist joint.

10. The assembly of claim 9, wherein a ratio of diameters of the first pulley to the second pulley is 2:1.

11. The assembly of claim 9, wherein a ratio of diameters of the first pulley to the second pulley is 1:1.

12. The assembly of claim 9, wherein a ratio of diameters of the third pulley to the fourth pulley is 1:2.

13. The assembly of claim 9, wherein the second inner link comprises a belt fixed for travel about a fifth pulley at the shoulder joint and a sixth pulley at the elbow joint, and the second outer link comprises a belt fixed for travel about a seventh pulley at the elbow joint and an eighth pulley at the wrist joint.

14. The assembly of claim 13, wherein a ratio of diameters of the fifth pulley to the sixth pulley is 2:1.

15. The assembly of claim 13, wherein a ratio of diameters of the fifth pulley to the sixth pulley is 1:1.

16. The assembly of claim 13, wherein a ratio of diameters of the seventh pulley to the eighth pulley is 1:2.

17. The assembly of claim 7, wherein one of the first and second elbow joints has a greater vertical extent than another of the first and second elbow joints sufficient to vertically offset the end effector mounting flanges of the first and second limbs, whereby collisions of the end effector mounting flanges are avoidable.

18. The assembly of claim 7, wherein one of the first limb and the second limb is shorter than another of the first limb and the second limb sufficient to avoid collision of intermediate portions of the first limb and the second limb during rotation about the shared vertical axes of the first and second shoulder joints.

19. The assembly of claim 1, wherein the motor package enclosure is sealed to maintain a vacuum therein.

20. The assembly of claim 1, wherein the distalmost links comprise end effector mounting flanges configured to support end effectors for supporting a substrate.

21. The assembly of claim 1, wherein the distalmost links comprise end effector mounting flanges configured to support semiconductor wafer handling end effectors.

22. The assembly of claim 1, further comprising a housing arranged to sustain a vacuum environment enclosing the actuator assembly.

23. The robot assembly of claim 1, further comprising a controller operatively coupled to the actuator assembly.

* * * * *

UNITED STATES PATENT AND TRADEMARK OFFICE
CERTIFICATE OF CORRECTION

| | | |
|---|---|---|
| PATENT NO. | : 7,891,935 B2 | Page 1 of 1 |
| APPLICATION NO. | : 10/434582 | |
| DATED | : February 22, 2011 | |
| INVENTOR(S) | : Izya Kremerman | |

It is certified that error appears in the above-identified patent and that said Letters Patent is hereby corrected as shown below:

Column 20, line 30, in Claim 1, delete "forth" and insert -- fourth --, therefor.

Column 21, line 20, in Claim 8, delete "forth" and insert -- fourth --, therefor.

Signed and Sealed this
Fifth Day of July, 2011

David J. Kappos
*Director of the United States Patent and Trademark Office*